(12) United States Patent
Inoue et al.

(10) Patent No.: US 8,194,393 B2
(45) Date of Patent: Jun. 5, 2012

(54) CAPACITOR UNIT AND ITS MANUFACTURING METHOD

(75) Inventors: Tatehiko Inoue, Osaka (JP); Shusaku Kawasaki, Osaka (JP); Kimiyasu Kakiuchi, Osaka (JP)

(73) Assignee: Panasonic Corporation, Osaka (JP)

( * ) Notice: Subject to any disclaimer, the term of this patent is extended or adjusted under 35 U.S.C. 154(b) by 387 days.

(21) Appl. No.: 12/526,535

(22) PCT Filed: Feb. 15, 2008

(86) PCT No.: PCT/JP2008/000229
§ 371 (c)(1),
(2), (4) Date: Aug. 10, 2009

(87) PCT Pub. No.: WO2008/099614
PCT Pub. Date: Aug. 21, 2008

(65) Prior Publication Data
US 2010/0053927 A1    Mar. 4, 2010

(30) Foreign Application Priority Data

| Feb. 16, 2007 | (JP) | 2007-036082 |
| Feb. 16, 2007 | (JP) | 2007-036083 |
| Feb. 16, 2007 | (JP) | 2007-036084 |
| Feb. 16, 2007 | (JP) | 2007-036085 |
| Feb. 16, 2007 | (JP) | 2007-036086 |
| Feb. 16, 2007 | (JP) | 2007-036087 |
| Feb. 16, 2007 | (JP) | 2007-036088 |

(51) Int. Cl.
*H01G 4/38* (2006.01)
(52) U.S. Cl. ............... 361/328; 361/541; 361/299.1; 361/522

(58) Field of Classification Search .......... 361/299.1, 361/299.2, 328, 329, 522, 541
See application file for complete search history.

(56) References Cited

U.S. PATENT DOCUMENTS

| 6,310,756 B1 | 10/2001 | Miura et al. |
| 6,343,004 B1 | 1/2002 | Kuranuki et al. |
| 6,922,326 B2* | 7/2005 | Kubota et al. ............. 361/274.1 |
| 7,092,238 B2* | 8/2006 | Saito et al. ................ 361/329 |
| 7,427,851 B2* | 9/2008 | Takemoto et al. ......... 320/166 |
| 7,547,233 B2* | 6/2009 | Inoue et al. ............... 439/627 |

(Continued)

FOREIGN PATENT DOCUMENTS
JP            6-275471        9/1994
(Continued)

OTHER PUBLICATIONS

Machine translation of JP 2006-351982, issued Dec. 2006.

(Continued)

*Primary Examiner* — Dameon Levi
(74) *Attorney, Agent, or Firm* — Wenderoth, Lind & Ponack, L.L.P.

(57) ABSTRACT

There is provided a capacitor unit including plural capacitors, each including end face electrode at one end face and side face electrode having a polarity different from end face electrode at a side face, arranged side by side; bus bar connected to end face electrode of capacitor, and partially connected to side face electrode of adjacent capacitor unit; and a circuit substrate arranged at the one end face sides or the other end face sides of plural capacitors; wherein bus bar and the circuit substrate are electrically connected through conductive portion arranged from bus bar towards the circuit substrate.

12 Claims, 47 Drawing Sheets

U.S. PATENT DOCUMENTS

| | | | |
|---|---|---|---|
| 7,580,245 B2 * | 8/2009 | Inoue et al. | 361/522 |
| 7,974,101 B2 * | 7/2011 | Azuma et al. | 361/760 |
| 8,018,712 B2 * | 9/2011 | Yang et al. | 361/328 |
| 2003/0134187 A1 | 7/2003 | Wheeler et al. | |
| 2007/0109715 A1 * | 5/2007 | Azuma et al. | 361/299.3 |

FOREIGN PATENT DOCUMENTS

| | | |
|---|---|---|
| JP | 7-283068 | 10/1995 |
| JP | 8-508605 | 9/1996 |
| JP | 9-162070 | 6/1997 |
| JP | 2000-138138 | 5/2000 |
| JP | 2000-340471 | 12/2000 |
| JP | 2003-133175 | 5/2003 |
| JP | 2003-217986 | 7/2003 |
| JP | 2003-309935 | 10/2003 |
| JP | 2006-210960 | 8/2006 |
| JP | 2006-351981 | 12/2006 |
| JP | 2006-351982 | 12/2006 |
| WO | 2006-134859 | 12/2006 |

OTHER PUBLICATIONS

International Search Report issued May 13, 2008 in the International (PCT) Application of which the present application is the U.S. National Stage.

* cited by examiner

CAPACITOR UNIT AND ITS MANUFACTURING METHOD

This application is a U.S. National Phase application of PCT International Application PCT/JP2008/000229, filed Feb. 15, 2008.

TECHNICAL FIELD

The present invention relates to a capacitor unit used as an auxiliary power supply and the like for accumulating power by a capacitor, and a manufacturing method of the same.

BACKGROUND ART

In recent years, a vehicle mounted with a hybrid system and an idling stop system has been developed based on concerns of environmental protection. Such systems perform operations such as regenerating a braking energy of a vehicle as an electrical energy and driving a high output motor, and thus a configuration of temporarily accumulating the electrical energy in a power accumulating element is necessary.

FIG. 47 is a perspective view of a conventional battery unit. In FIG. 47, the battery unit includes plural batteries 1 having electrodes at both end faces, and bus bars 3, which are made of plate-shaped metal, for electrically connecting plural batteries 1. Bus bars 3 are alternately arranged at both ends of plural batteries 1, so that plural batteries 1 connected by bus bars 3 are connected in plural stages and laid in a horizontal direction. Insulation sheets 5 are arranged to prevent short-circuit between each stage.

According to such a configuration, the battery unit accumulates the electrical energy in the battery at normal times, and supplies power to an information processing device when a power supply source shows abnormality due to blackout and the like. The battery unit that accumulates the electrical energy in the battery and backs up the information processing device is disclosed in patent document 1.

The conventional battery unit backs up the necessary power to the information processing device and the like in time of black out, and prevents the system down.

However, in the regeneration system of the vehicle, the braking energy that suddenly changes needs to be accumulated in the power accumulating element as the electrical energy, and the electrical energy for rapidly accelerating the vehicle needs to be supplied in assisting the motor drive. Although rapid charging/discharging characteristics are demanded on the power accumulating element, battery 1 used as the power accumulating element of the conventional battery unit has poor rapid charging/discharging characteristics.

For the configuration using a capacitor enabling rapid charging/discharging in place of battery 1, the characteristic degradation may advance when the voltage value between both ends of the capacitor becomes higher than a predetermined value. Therefore, when using the capacitor, a voltage balance circuit for measuring and controlling the voltage value between both ends of each capacitor needs to be arranged. When applied to the conventional battery unit, bus bars 3 will be alternately arranged at both upper and lower end portions 7 of the capacitor, and thus a circuit substrate including the voltage balance circuit also needs to be arranged at both upper and lower end portions 7 of the capacitor, and as a result, the capacitor unit becomes larger and heavier.

[Patent document 1] Unexamined Japanese Patent Publication No. 2003-309935

DISCLOSURE OF THE INVENTION

The present invention provides a miniaturized and lighter capacitor unit.

The capacitor unit according to the present invention includes an end face electrode at one end face and a side face electrode having a polarity different from the end face electrode from the other end face to the side face. A plurality of capacitors arranged side by side, a bus bar connected to the end face electrode of the capacitor and partially connected to the side face electrode of the adjacent capacitor, and a circuit substrate arranged on one end face side or the other end face side of the plurality of capacitors are arranged. A capacitor unit in which the bus bar and the circuit substrate are electrically connected by way of a conductive portion arranged from the bus bar towards the circuit substrate is thereby configured.

According to such a configuration, the voltage value between both ends of each capacitor can be measured and controlled with one circuit substrate, and miniaturization and lighter weight of the capacitor unit can be achieved.

Figure 1:
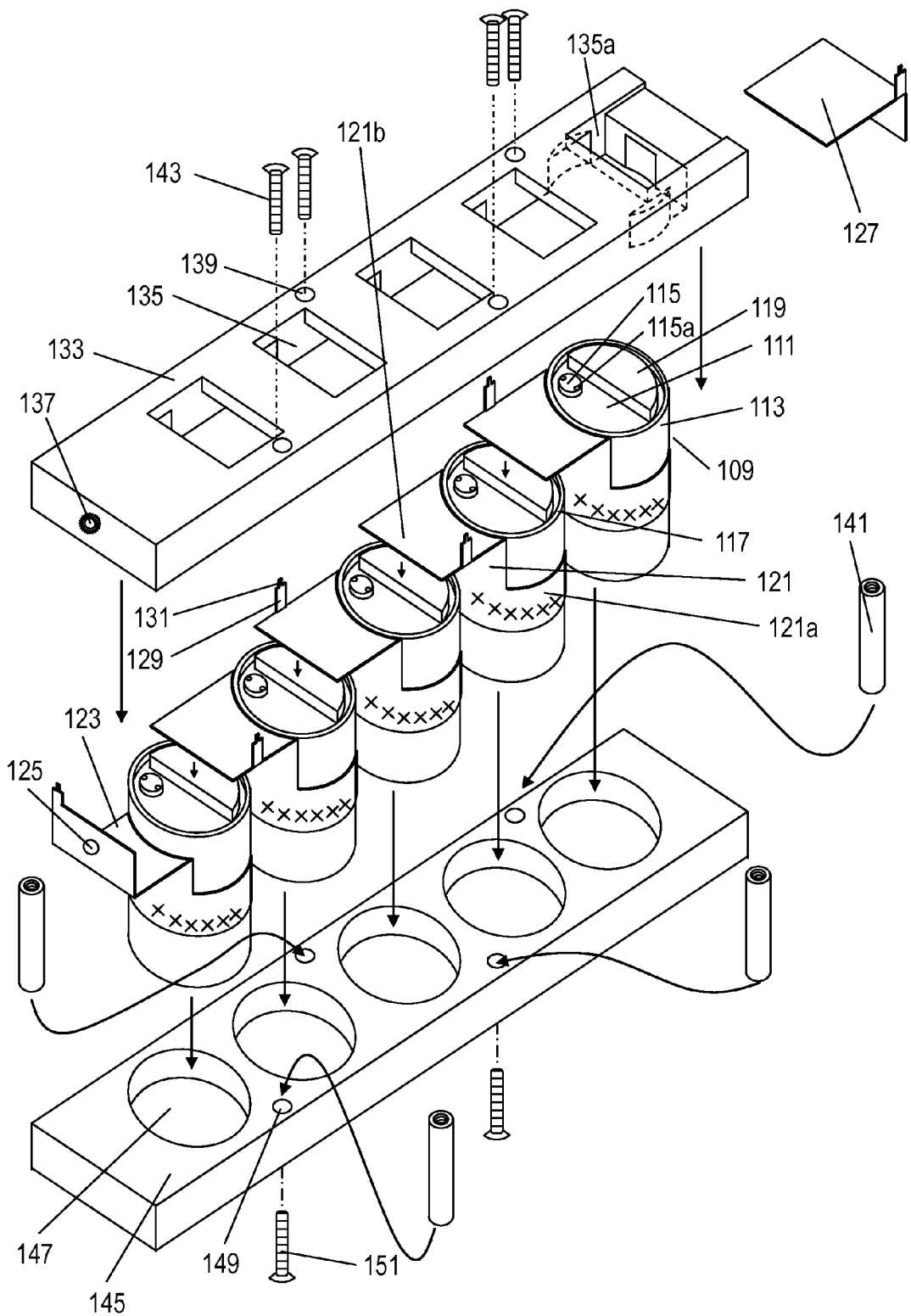
FIG. 1 is an exploded perspective view of a capacitor unit according to a first embodiment of the present invention.

REFERENCE MARKS IN THE DRAWINGS 109, 205, 305, 409, 711 capacitor
111, 517 end face electrode
113, 515 side face electrode
115, 210, 311, 415 pressure adjustment valve
116a, 210a, 311a, 415a discharge hole
117, 208, 310, 417, 513 end face peripheral portion
119, 207, 309, 419 projection
121, 421, 521 bus bar
121a circumferential portion
121b flat portion
121c, 215b, 330b, 421a, 523, 659, 741 bending portion
123 end bus bar
125, 427 screw hole
127, 216, 314 L-shaped bus bar
129, 423 conductive portion
131, 215a, 431 terminal portion
133, 318, 433 first fixing case
133a, 433a cover portion
135, 435 bus bar opening
135a, 435a end opening
137, 221, 322, 437, 729 insert nut
139, 222, 323, 439 upper fixation screw hole
141, 223, 324, 441, 537, 637 fixing rod
143, 224, 325, 443 upper fixation screw
145, 326, 445 second fixing case
147, 226, 327, 447 holding hole
149, 228, 328, 449 lower fixation screw hole
151, 229, 329, 451 lower fixation screw
153, 232, 332, 453 circuit substrate
153a, 453a connection hole
155, 230, 330, 455 external bus bar 157, 230a, 330a, 457 external bus bar screw hole
159, 231, 331, 459, 737 screw
161, 461 washer
163, 230b, 463 external bus bar bending portion
165, 465 void
171 bus bar hole
173 through-hole
206 upper end face
209 lower end face
211, 312 first bus bar
213 first conductive portion
214, 313 second bus bar
215 second conductive portion
216a, 314a L-shaped bus bar screw hole
217 upper case
218, 319 first bus bar opening
219, 320 L-shaped bus bar opening
220 second conductive portion hole
225 lower case
227 cutout portion
233 first conductive portion hole
234 terminal hole
235 welding portion
236 flexible cable
237 substrate connector
238 bus bar connector
239 socket
305a case
305b lid
306, 411 first end face electrode
307, 413 second end face electrode
308 side surface portion
315 bus bar conductive portion
316 side surface conductive portion
317 monitor terminal portion
321 monitor terminal portion hole
333 bus bar connection hole
334 monitor terminal portion connection hole
335 both left and right ends
336 contacting surface
425 crank-shaped end bus bar
429 L-shaped end bus bar
511 power accumulating element
529 bottom part
531, 631, 719 lower case
535, 649 elastic portion
539, 635 fixation screw hole
541, 639 fixation screw
543, 641, 717 upper case
545, 643 upper part
547 contacting portion
611 first power accumulating element
613 upper electrode
615 lower electrode
617 second power accumulating element
619 upper end peripheral portion
621 upper end
625 lower bus bar
627 power accumulating unit
629 lower part
651 rib
655 upper bus bar
713 electrode
715 capacitor block
721 internal bus bar
723 extraction electrode
725, 735 screw hole
727, 733 bump
731 external bus bar
751 projection
753 nut
755 nut accommodating portion

PREFERRED EMBODIMENTS FOR CARRYING
OUT OF THE INVENTION

First Embodiment

The configuration of a capacitor unit according to a first embodiment of the present invention will be described using the drawings.

FIG. 1 is an exploded perspective of the capacitor unit according to the first embodiment of the present invention. In FIG. 1, plural capacitors 109 installed in a parallel and vertically disposed state with respect to each other is an electrical dual-layer capacitor of circular column shape having a diameter of 3 cm, and accumulates electricity. Each capacitor 109 is connected inside such that an upper end face forms end face electrode 111 of positive pole, and a portion from a circular column bottom surface to a side face forms side face electrode 113. Therefore, capacitor 109 is caulked such that an insulation member (not shown) is arranged between end face electrode 111 and side face electrode 113 to insulate end face electrode 111 and side face electrode 113. Pressure adjustment valve 115 and semicircular projection 119 in which one part of end face electrode 111 is projected than end face peripheral portion 117 are arranged on end face electrode 111.

When the electrolyte inside capacitor 109 vaporizes and the inner pressure of capacitor 109 rises to higher than or equal to a predetermined pressure, pressure adjustment valve 115 discharges the vaporized electrolyte from discharge hole 116a formed on an outer surface of pressure adjustment valve 115. The pressure inside capacitor 109 is thus prevented from rising to higher than or equal to the predetermined pressure. Since pressure adjustment valve 115 is arranged at the upper end face of capacitor 109, the possibility that the electrolyte in capacitor 109 leaks to the outside is small. End face electrode 111 and side face electrode 113 of capacitor 109 used in the first embodiment are made of aluminum.

Bus bar 121 is configured by circumferential portion 121a and flat portion 121b. Circumferential portion 121a is connected to side face electrode 113 of capacitor 109, and flat portion 121b and projection 119 in which end face electrode 111 is partially projected are connected to electrically connect end face electrode 111 and side face electrode 113 of capacitor 109.

The welding of bus bar 121 and capacitor 109 will be described. As described above, circumferential portion 121a is an electrical connecting portion of bus bar 121 and side face electrode 113. The connecting portion is formed to a cylindrical shape so that capacitor 109 of the first embodiment has a circular column shape.

Figure 2A:
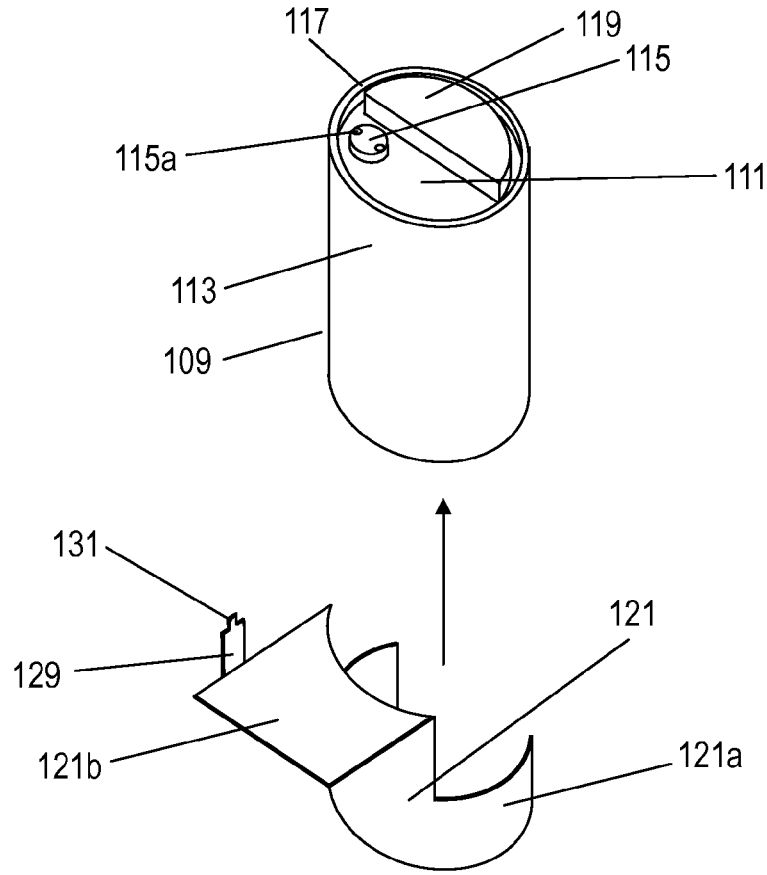
FIG. 2A is a perspective view of before welding a capacitor and a bus bar in the first embodiment of the present invention.

FIG. 2A is a perspective view of before welding the capacitor and the bus bar in the first embodiment of the present invention. In FIG. 2A, circumferential portion 121a is fitted to side face electrode 113 up to a predetermined position from the direction of the arrow. The predetermined position is a position where flat portion 121b of bus bar 121 and projection 119 of adjacent capacitor 109 exactly contact when plural capacitors 109 are arranged in parallel as shown in FIG. 1.

Figure 2B:
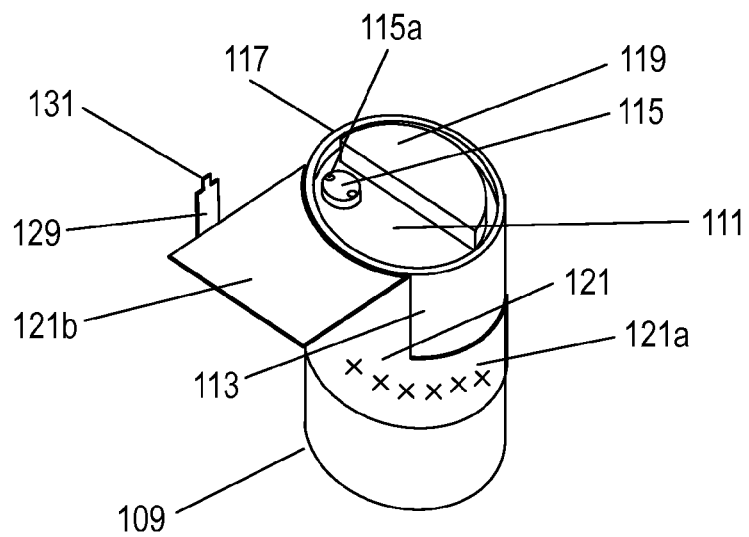
FIG. 2B is a perspective view of after welding the capacitor and the bus bar in the first embodiment of the present invention.

FIG. 2B is a perspective view of after welding the capacitor and the bus bar in the first embodiment of the present invention. In FIG. 2B, portion denoted with mark X is welded in spot-form. In the first embodiment, great number of points are welded in spot-form, but may be linearly welded by sequentially shifting the welding position. The welding becomes stronger when linearly welded compared to when welded in spot-form. In the first embodiment, a laser welding machine is fixed, and laser welding is carried out while sequentially shifting the welding point by rotating a main body of capacitor 109. This is because the laser can be easily focused compared to when welded by rotating the laser welding machine about the center, the center being capacitor 109, and the welding can be accurately carried out.

Figure 3:
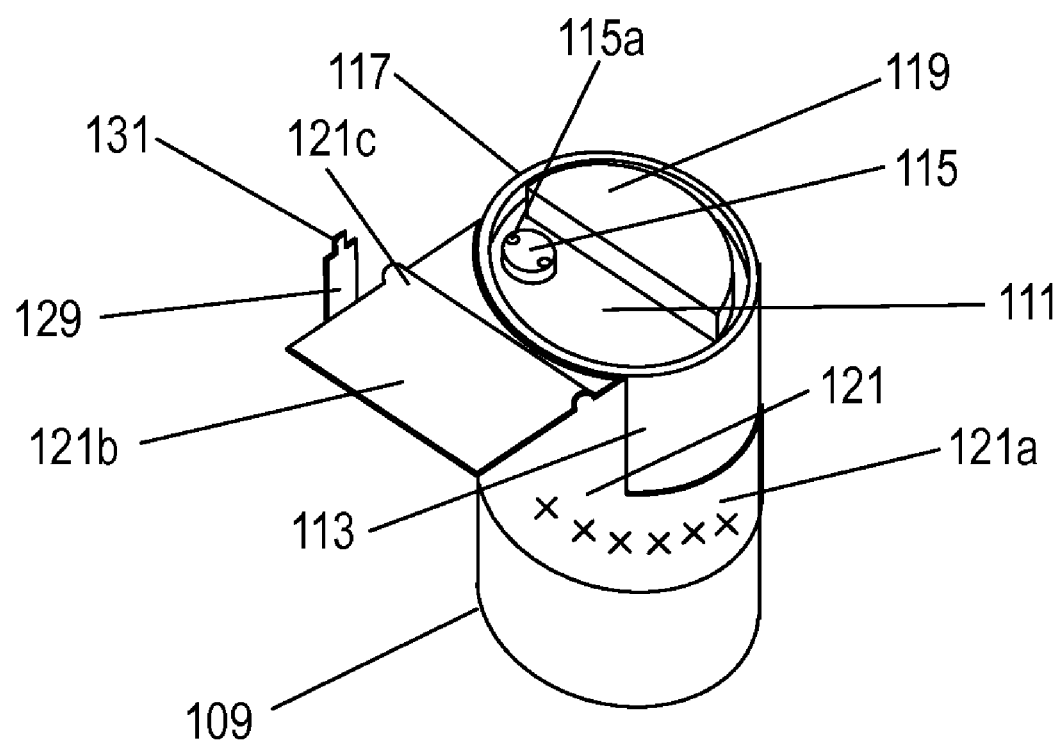
FIG. 3 is a perspective view of a bus bar of another shape of the capacitor according to the first embodiment of the present invention.

FIG. 3 is a perspective view of a bus bar of another shape of the capacitor according to the first embodiment of the present invention. In FIG. 3, bending portion 121c may be arranged in between a contacting portion with side face electrode 113 at the vicinity of a contacting portion with end face electrode 111. Bending portion 121c can be easily processed if arranged on flat portion 121b.

End bus bar 123 shown on the near side of FIG. 1 is connected with side face electrode 113 of capacitor 109 positioned on the most near side, and is formed with screw hole 125 for electrically connecting an external wiring. The welding method of end bus bar 123 and capacitor 109 is similar to bus bar 121. End bus bar 123 is fitted to capacitor 109 up to the position screw hole 125 coincides with insert nut 137 and then welded when capacitor 109 is inserted to first fixing case 133, to be hereinafter described.

L-shaped bus bar 127 positioned on the farthest side of FIG. 1 is connected with projection 119 of capacitor 109. L-shaped bus bar 127 is formed with a screw hole (not shown) for connecting the external wiring, similar to end bus bar 123.

In the first embodiment, bus bar 121, end bus bar 123, and L-shaped bus bar 127 are made of aluminum same as end face electrode 111 and side face electrode 113 to enhance the weld-connection property with end face electrode 111 and side face electrode 113 of capacitor 109. However, they may be made from other than aluminum as long as they are made of the same metal. Bus bar 121, end bus bar 123, and L-shaped bus bar 127 are formed by press molding an aluminum plate.

Conductive portion 129 is integrally formed in a projection form at the upper part of bus bar 121, end bus bar 123, and L-shaped bus bar 127. Furthermore, terminal portion 131 of projection form is integrally formed at the upper part of conductive portion 129. Terminal portion 131 is subjected to tin plating to connect with circuit substrate 153 of FIG. 4, to be hereinafter described, through soldering. Circuit substrate 153 detects the voltage value at bus bar 121, end bus bar 123, and L-shaped bus bar 127 by connecting terminal portion 131 and circuit substrate 153.

First fixing case 133 is made of resin, and inserted and fixed with the upper part of capacitor 109. Conductive portion 129 and one part of bus bar 121 are exposed from bus bar opening 135 formed in first fixing case 133. L-shaped bus bar 127 is arranged at the upper part of first fixing case 133, and connected with projection 119 of FIG. 1 exposed from end opening 135a. Insert nut 137 is buried at a left end of first fixing case 133, where end bus bar 123 and external bus bar 155 of FIG. 4, to be hereinafter described, are electrically and mechanically connected by insert nut 137. Upper fixation screw hole 139 is formed in first fixing case 133. Fixing rod 141 and first fixing case 133 are fixed by arranging fixing rod 141 at a position of upper fixation screw hole 139, and fastening upper fixation screw 143 from above.

Second fixing case 145 is also made of resin, similar to first fixing case 133. Second fixing case 145 is formed with holding hole 147, where the lower part of capacitor 109 is inserted to and fixed in holding hole 147. In this case, bus bar 121 needs to be covered on end face electrode 111 of adjacent capacitor 109, and thus capacitor 109 is sequentially inserted from the near side towards the far side. End face electrode 111 is connected with side face electrode 113 of adjacent capacitor 109 by bus bar 121. Furthermore, lower fixation screw hole 149 is formed in second fixing case 145. Fixing rod 141 and second fixing case 145 are fixed by fastening lower fixation screw 151 to fixing rod 141 arranged at the position of lower fixation screw hole 149.

Figure 4:
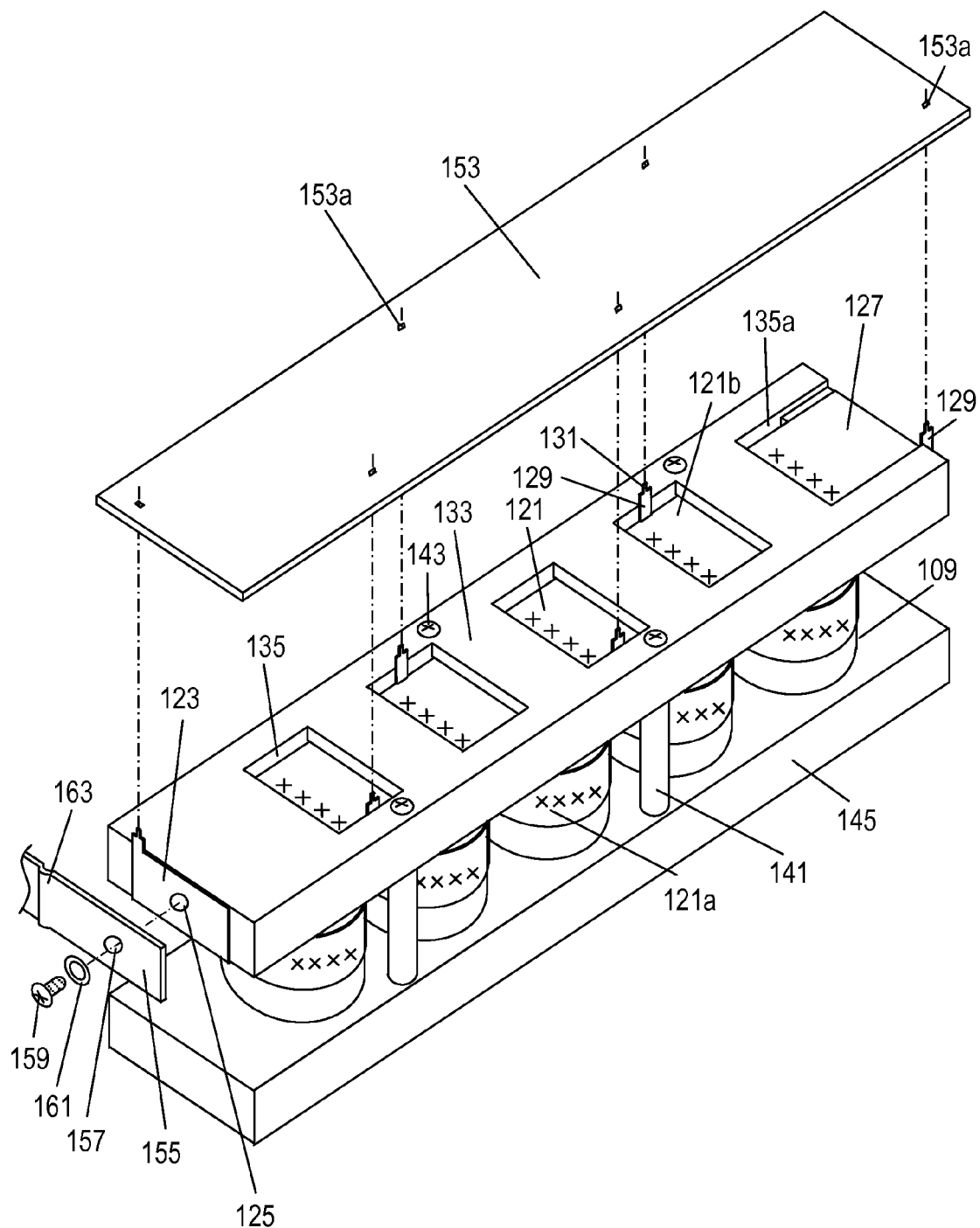
FIG. 4 is a partially assembled perspective view of the capacitor unit according to the first embodiment of the present invention.

FIG. 4 is a partially assembled perspective view of the capacitor unit according to the first embodiment of the present invention. In FIG. 4, first fixing case 133 and second fixing case 145 are connected by fixing rod 141, and capacitor 109 is securely fixed by being sandwiched by first fixing case 133 and second fixing case 145.

Bus bar 121 and L-shaped bus bar 127 are securely connected with projection 119 by laser welding the portion of mark X. Conductive portion 129 arranged on bus bar 121, end bus bar 123, and L-shaped bus bar 127 is connected by inserting terminal portion 131 to connection hole 153a formed in circuit substrate 153, and thus is projected out from bus bar opening 135 and end opening 135a.

Circuit substrate 153 includes a voltage balance circuit (not shown). The voltage balance circuit measures and controls the voltage value of each capacitor 109 by electrically connecting circuit substrate 153 and bus bar 121 and end bus bar 123, as well as L-shaped bus bar 127 and conductive portion 129 through connection hole 153a.

Screw hole 125 formed in end bus bar 123 is fastened and fixed to insert nut 137 of FIG. 1 with screw 159 along with external bus bar screw hole 157 formed in external bus bar 155 for wiring with the outside. In this case, screw 159 is fastened through washer 161. External bus bar 155 is arranged with external bus bar bending portion 163, where external bending portion 163 absorbs stress caused by vibration or heat to reduce the possibility of external bus bar 155 breaking.

Figure 5:
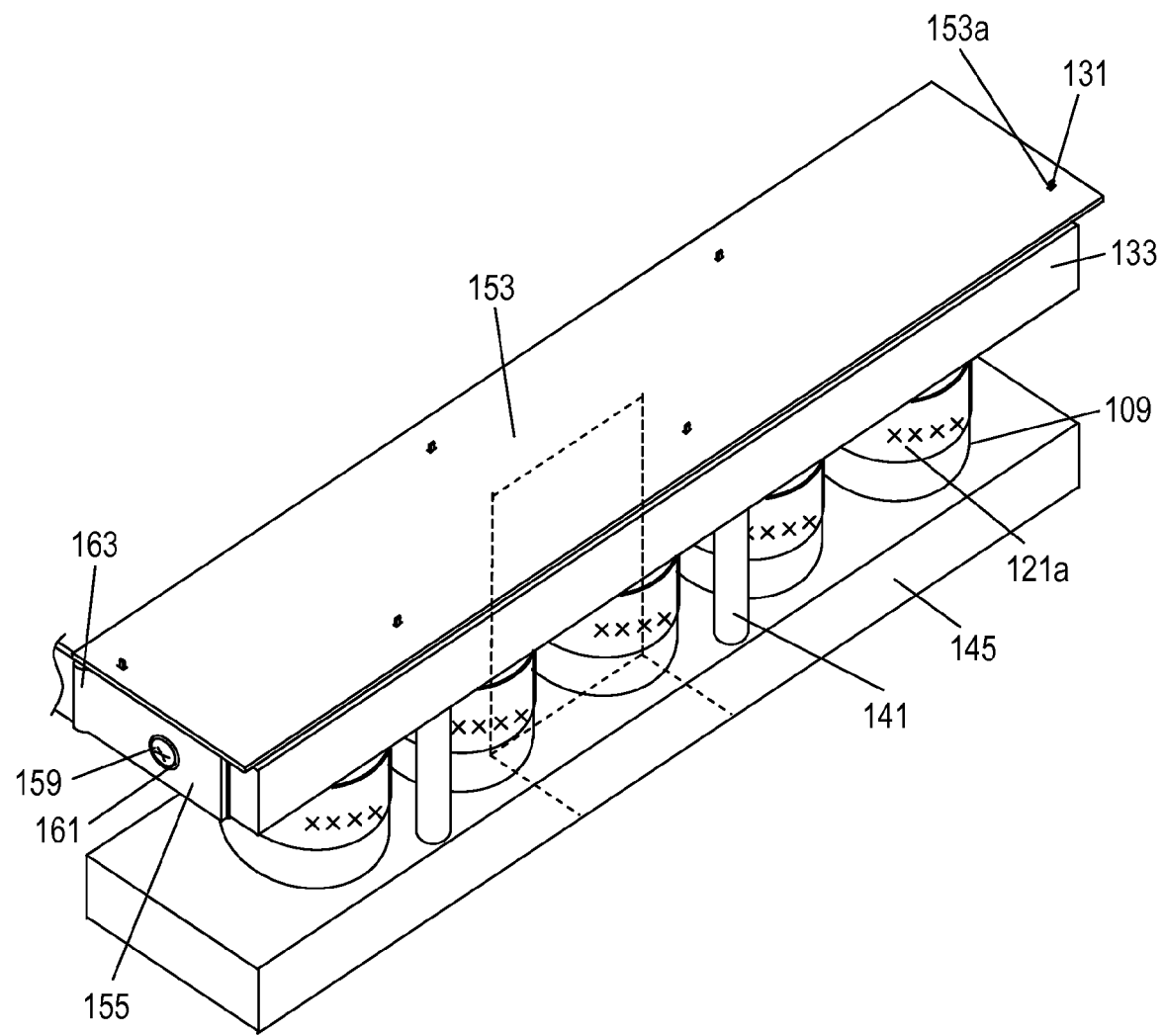
FIG. 5 is a completed perspective view of the capacitor unit according to the first embodiment of the present invention.

FIG. 5 is a completed perspective view of the capacitor unit according to the first embodiment of the present invention. In FIG. 5, circuit substrate 153 is installed at the upper part of first fixing case 133, terminal portion 131 arranged on bus bar 121, end bus bar 123, and L-shaped bus bar 127 is inserted to connection hole 153a and connected by soldering, as described with reference to FIG. 4. Screw 159 is inserted and fixed to external bus bar screw hole 157, and the capacitor unit is electrically connected with the external wiring by way of external bus bar 155.

Figure 6:
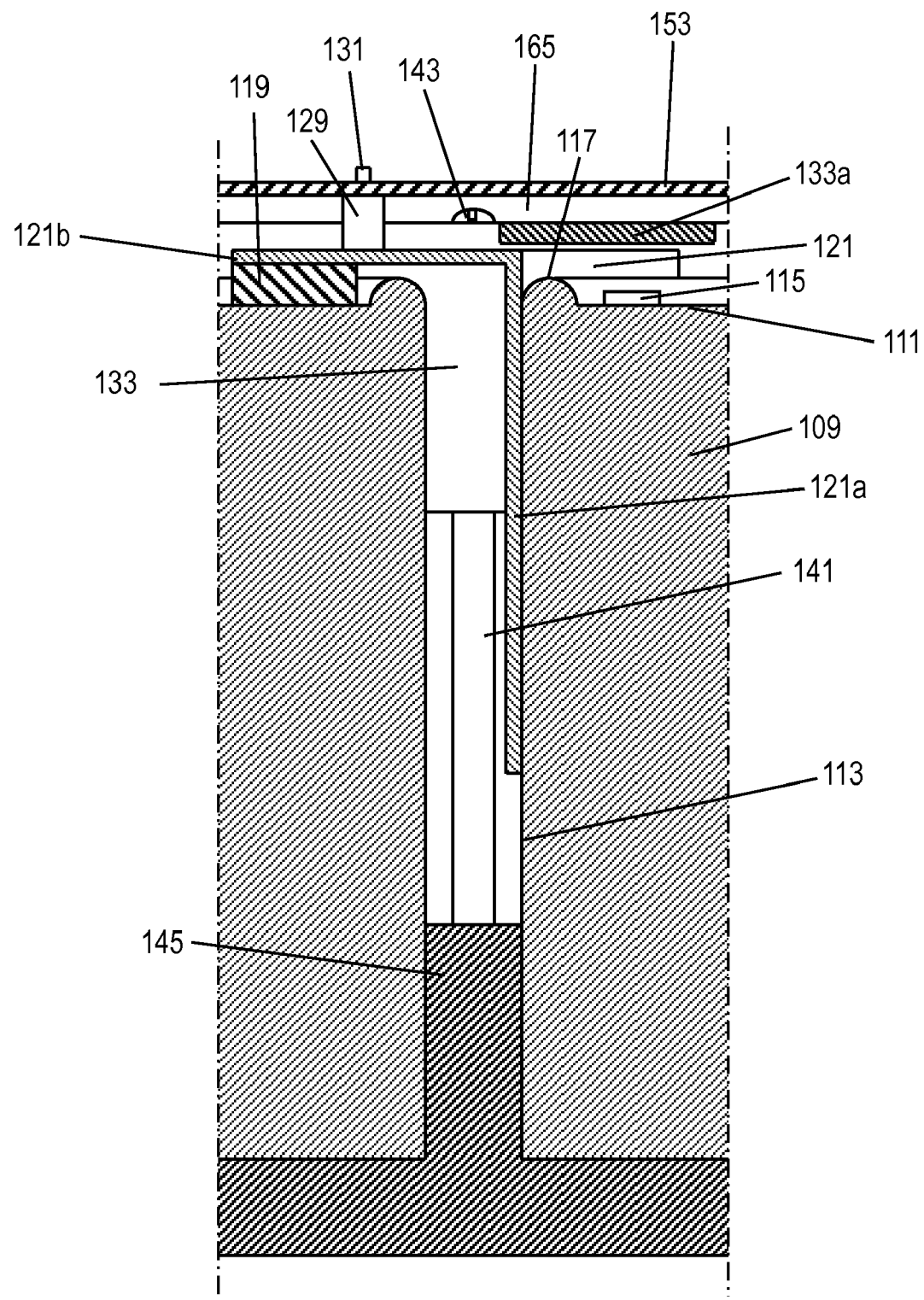
FIG. 6 is a partial cross-sectional view of the capacitor unit according to the first embodiment of the present invention.

FIG. 6 is a partial cross-sectional view of the capacitor unit according to the first embodiment of the present invention. In other words, a cross-sectional view of a square portion shown with the broken line portion of FIG. 5 is shown. In FIG. 6, the height of projection 119 is made higher than end face peripheral portion 117 to prevent bus bar 121 and end face peripheral portion 117 from contacting and short-circuiting. A constant spacing is provided between adjacent capacitors 109, whereby capacitors 109 do not contact and not short-circuit.

Pressure adjustment valve 115 is faced to and covered by cover portion 133a formed in first fixing case 133, and circuit substrate 153 and bus bar 121 are partitioned by cover portion 133a. Furthermore, pressure adjustment valve 115 is configured such that the height is lower than end face peripheral portion 117, where a gap forms between pressure adjustment valve 115 and cover portion 133a arranged at the upper part. Therefore, discharge hole 116a of FIG. 1 will not be blocked, and the vaporized electrolyte is normally discharged from discharge hole 116a.

Terminal portion 131 has a shape projecting out from conductive portion 129, where the diameter of connection hole 153a of FIG. 5 is substantially the same size as terminal portion 131. Therefore, circuit substrate 153 is not inserted at the lower part due to terminal portion 131, and void 165 forms between circuit substrate 153 and first fixing case 133 by the amount conductive portion 129 projects out from first fixing case 133. Therefore, the height of the screw head of upper fixation screw 143 is lower than the height of void 165, and thus the possibility that the screw head of upper fixation screw 143 contacts circuit substrate 153 is small.

The effects of the capacitor unit according to the first embodiment of the present invention will be described below.

First, miniaturization and lighter weight of the capacitor are realized in the first embodiment. This is realized as plural capacitors 109 including end face electrode 111 and side face electrode 113 are arranged in parallel, and end face electrode 111 and side face electrode 113 of adjacent capacitors 109 of plural capacitors 109 arranged in parallel are connected by bus bar 121, as shown in FIG. 1.

According to such configuration, conductive portion 129 can be arranged at flat portion 121b of bus bar 121 connecting each capacitor 109, and each bus bar 121 can be connected to one circuit substrate 153 by way of conductive portion 129. In this case, the voltage value of bus bar 121 detected by the voltage circuit arranged in circuit substrate 153 is substantially equal to the voltage value of end face electrode 111 and side face electrode 113 to which each bus bar 121 is connected. As a result, the voltage value at both ends of each capacitor 109 can be measured and controlled by one circuit substrate 153, and the capacitor unit can be miniaturized and made lighter.

Furthermore, as shown in FIG. 3, bending portion 121c may be arranged at flat portion 121b of bus bar 121. Bending portion 121c thus absorbs the stress generated at bus bar 121 from heat and vibration, thereby reducing the possibility of bus bar 121 breaking. In particular, when the capacitor unit is mounted on the vehicle, vibration resistance property is demanded on the capacitor unit as strong vibration may be transmitted. Therefore, the present configuration is useful for the vehicle capacitor unit.

As shown in FIG. 6, pressure adjustment valve 115 is configured with circuit substrate 153 and bus bar 121 partitioned by facing cover portion 133a. The vaporized electrolyte does not attach to circuit substrate 153 and bus bar 121 even if discharged from discharge hole 116a, whereby the possibility of corrosion can be reduced. Therefore, high reliability of the capacitor unit can be achieved.

Capacitor 109 may be arranged in a parallel and horizontally disposed state with respect to each other, and pressure adjustment valve 115 may be arranged on the upper side than the center of end face electrode 111 of capacitor 109. Even if the capacitor unit is arranged in the horizontal direction, the voltage value of each capacitor 109 can be measured with circuit substrate 153 arranged only on end face electrode 111 side of capacitor 109 by using the configuration of the first embodiment, and the capacitor unit can be miniaturized and made lighter. Moreover, in such configuration, even if circuit substrate 153 is arranged on second fixing case 145 side, circuit substrate 153 is not influenced by the weight of capacitor 109 as the capacitor unit is arranged laid in the horizontal direction, and the possibility of breakage reduces. The possibility the electrolyte leaks from discharge hole 116a can be reduced by arranging pressure adjustment valve 115 on the upper side than the center of end face electrode 111 of capacitor 109. The capacitor unit mounted on the vehicle is often mounted under the floor, and thus lower height is demanded, where the present configuration is suitable for the vehicle capacitor unit if the entire height is lowered with the capacitor unit parallel and horizontally disposed.

In the first embodiment, circumferential portion 121a of bus bar 121 is fitted to side face electrode 113 of capacitor 109 in advance, as shown in FIG. 2A, and circumferential portion 121a and side face electrode 113 are weld-connected, as shown in FIG. 2B. Thereafter, as shown in FIG. 4, capacitor 109 is inserted and held in first fixing case 133 and second fixing case 145, and thereafter, flat portion 121b of bus bar 121 and projection 119 of end face electrode 111 of FIG. 1 are weld-connected through bus bar opening 135.

Miniaturization and lighter weight of the capacitor unit can also be achieved through such manufacturing. However, dimensional error exists in the height direction in capacitor 109 and projection 119 of end face electrode 111. In this case, when weld-connecting flat portion 121b and projection 119 through the above-described manufacturing method, such portions may not necessarily be closely attached due to the dimensional error. Therefore, flat portion 121b needs to be pressed to perform reliable welding. When welded in such manner, tensile stress and compression stress apply on the welded portion and bus bar 121. When using the capacitor unit in this state on the vehicle, the joint portion may strip or bus bar 121 may damage if excessive stress is applied on the welded portion and bus bar 121 by vehicle vibration.

To avoid this, the following manufacturing method is used. First, as shown in FIG. 2A, circumferential portion 121a is fitted to side face electrode 113, and capacitor 109 is inserted to first fixing case 133 and second fixing case 145 without weld-connecting circumferential portion 121a and side face electrode 113 in such state. Flat portion 121b of bus bar 121 and projection 119 of end face electrode 111 are then weld-connected. Even if the dimensional error in the height direction occurs in capacitor 109 and projection 119 of end face electrode 111 at this state, flat portion 121b and projection 119 can be welded while being closely attached since circumferential portion 121a can move along the length direction of side face electrode 113. When bus bar 121 and projection 119 of end face electrode 111 are weld-connected, stress caused by the dimension error does not apply on the welded portion of flat portion 121b and projection 119, and bus bar 121. Furthermore, since circumferential portion 121a and side face electrode 113 are closely attached without stress being applied on bus bar 121, circumferential portion 121a and side face electrode 113 are weld-connected in such state. Thus, the stress caused by the dimensional error is ultimately not applied on all welded portions and bus bar 121.

Through such manufacturing method of the capacitor unit, excessive stress does not apply on the welded portion and bus bar 121 even when vehicle vibration is applied, and high reliability can be obtained.

Second Embodiment

The configuration of a capacitor unit according to a second embodiment of the present invention will be described below. The second embodiment will be described with same reference numerals denoted for the same components as in the first embodiment.

Figure 7:
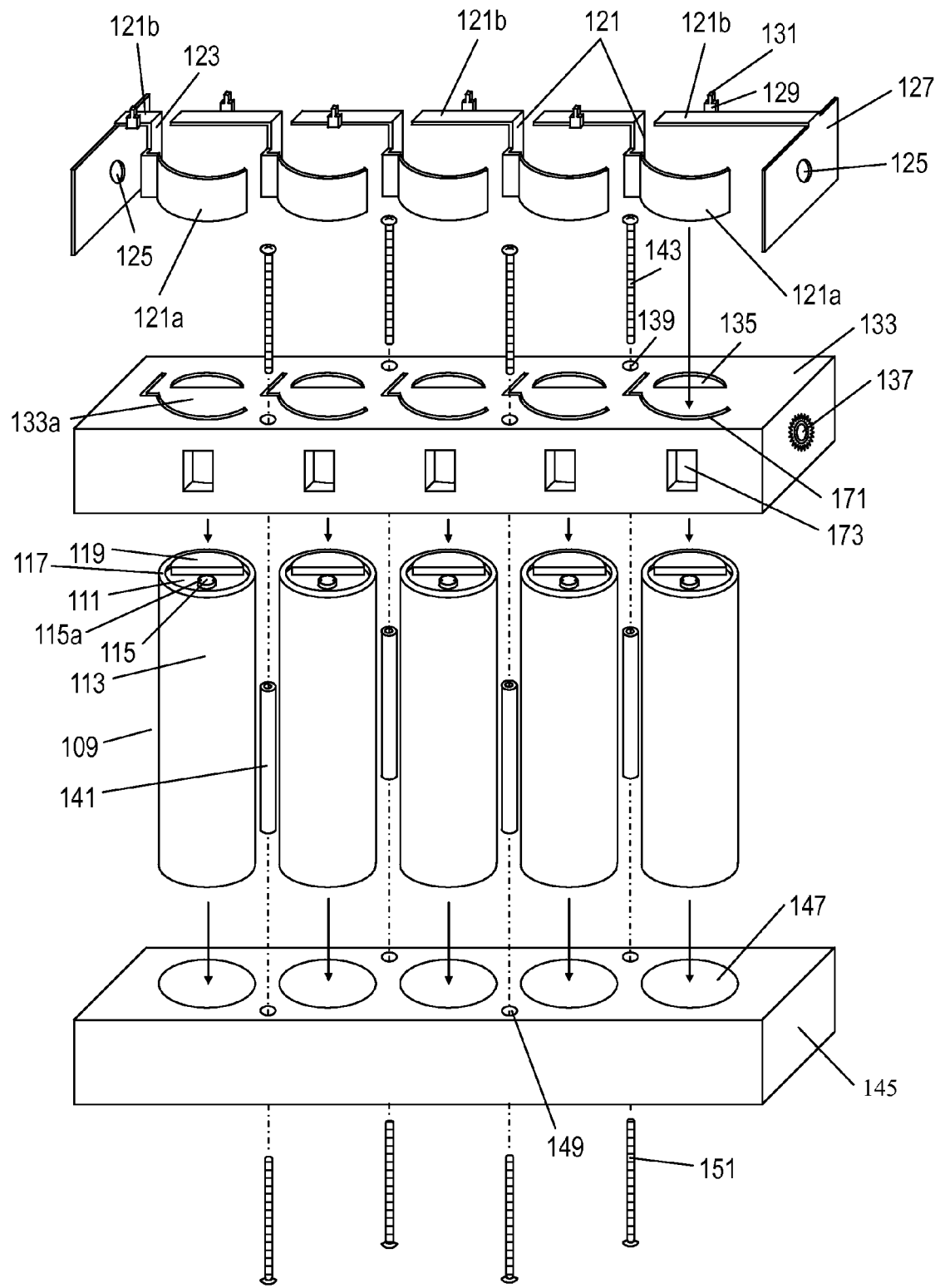
FIG. 7 is an exploded perspective view of a capacitor unit according to a second embodiment of the present invention.

FIG. 7 is an exploded perspective view of a capacitor unit according to the second embodiment of the present invention. In FIG. 7, the configuration of the capacitor unit according to the second embodiment differs from the configuration of the first embodiment in the following points, as shown in FIG. 7.

1) Bus bar hole 171 for inserting connecting portion (in the second embodiment as well, such connecting portion is referred to as "circumferential portion 121a") with side face electrode 113 of bus bar 121 is formed on the upper surface of first fixing case 133.

2) Circumferential portion 121a of bus bar 121 is inserted to bus bar hole 171 from the upper surface of first fixing case 133, and thus flat portion 121b of bus bar 121 is arranged on the upper surface of first fixing case 133.

3) According to such configuration, only projection 119 to be welded with flat portion 121b needs to appear on the upper surface of first fixing case 133, and thus bus bar opening 135 has a shape that enables projection 119 to appear (specifically, shape slightly larger than the shape of projection 119).

4) Through-hole 173 is formed at a position that faces circumferential portion 121a at the side surface of first fixing case 133 when circumferential portion 121a is inserted to bus bar hole 171.

Other configurations are similar to the first embodiment. Therefore, for the same reasons as in the first embodiment, miniaturization and lighter weight of the capacitor unit as well as high reliability are achieved in the configuration of the second embodiment. The shapes of bus bar 121, end bus bar 123, and L-shaped bus bar 127 differ in detail with the first embodiment, but all have configuring sites same as the first embodiment. The position of pressure adjustment valve 115 differs from the first embodiment, but is not particularly limited to the position of FIG. 7, and may be the position same as in the first embodiment.

The manufacturing method of such capacitor unit will be described below.

First, plural (four in the second embodiment) fixing rods 141 are arranged to face lower fixation screw hole 149, and fixed by fastening lower fixation screw 151.

The upper surface including end face electrode 111 of plural (five in the second embodiment) capacitors 109 is inserted to the holding hole (not shown) formed in first fixing case 133 and the bottom surface is inserted to holding hole 147 formed in second fixing case 145, respectively. In this case, insertion is carried out such that projection 119 is fitted to bus bar opening 135. The circumferential position of each capacitor 109 is thereby determined. The upper surface of capacitor 109 is inserted to the holding hole formed in first fixing case 133, so that a gap substantially the same as the thickness of bus bar 121 forms between the holding hole and side face electrode 113. Such gap communicates to bus bar hole 171.

Upper fixation screw 143 is then fastened to fixing rod 141 through upper fixation screw hole 139. In the steps up to this point, capacitor 109 is held by first fixing case 133 and second fixing case 145.

Circumferential portion 121a of bus bar 121 and end bus bar 123 is then inserted to bus bar hole 171. Circumferential portion 121a then passes through bus bar hole 171 and is inserted to the gap between holding hole and side face electrode 113. Therefore, bus bar 121 and end bus bar 123 are accurately positioned by bus bar hole 171 with circumferential portion 121a closely attached to side face electrode 113. At the same time, flat portion 121b and projection 119 are closely attached. At this point, the surface of circumferential portion 121a is exposed at through-hole 173.

Figure 8:
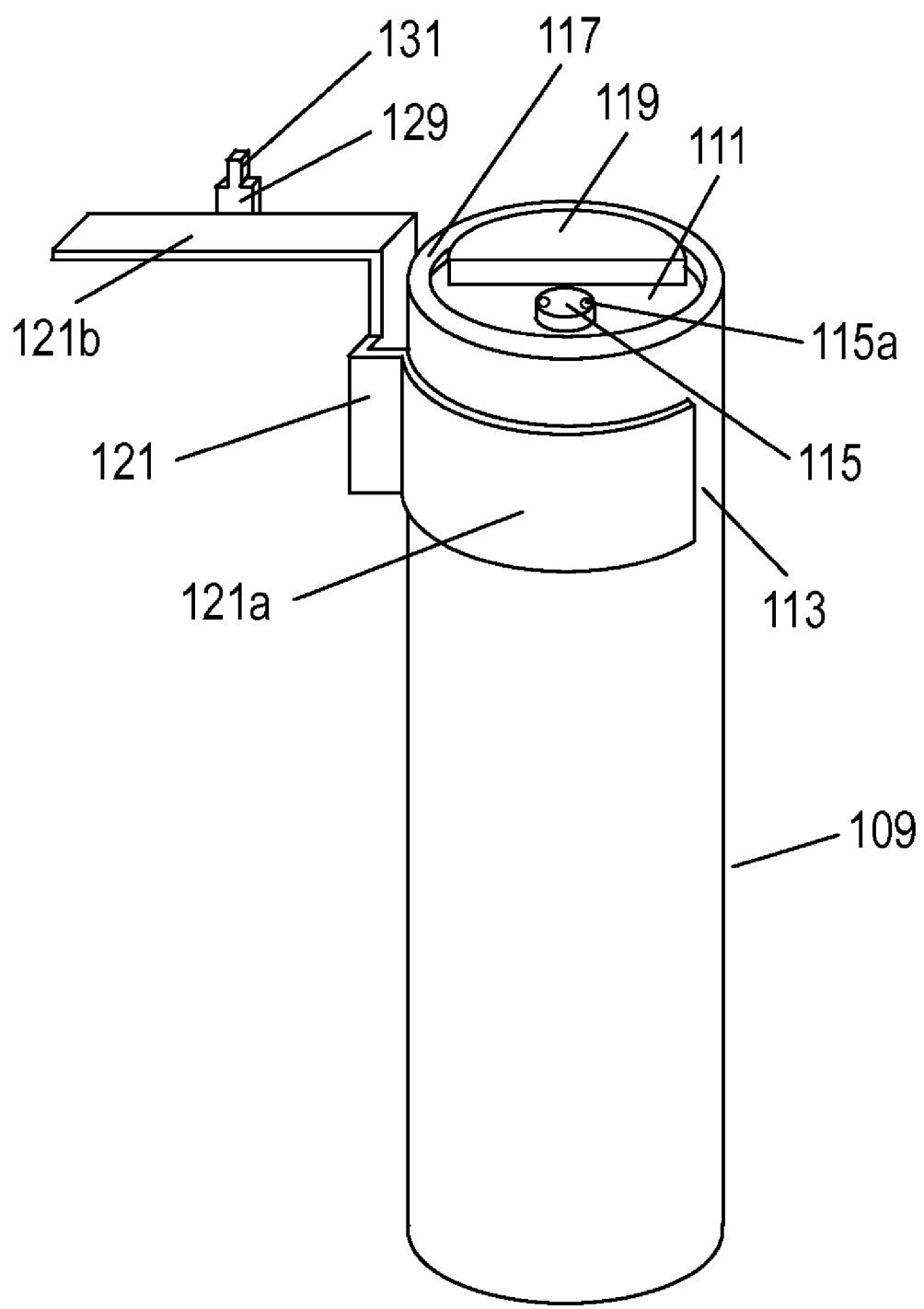
FIG. 8 is a perspective view showing a positional relationship of the capacitor and the bus bar of the capacitor unit according to the second embodiment of the present invention.

FIG. 8 is a perspective view showing a positional relationship of the capacitor and the bus bar of the capacitor unit according to the second embodiment of the present invention. To facilitate the understanding, only one set of capacitor 109 and bus bar 121 is shown, and the drawing of first fixing case 133 is omitted. In FIG. 8, circumferential portion 121a is closely attached to side face electrode 113, as described above. It can be seen that flat portion 121b is arranged to closely attach to the upper surface of the projection (not shown) of the adjacent capacitor.

Therefore, according to the second embodiment, the positioning and the close attachment property of bus bar 121 are obtained in an extremely easy manner, and thus the assembly workability enhances. Since L-shaped bus bar 127 is not inserted to bus bar hole 171, positioning is carried out by fastening temporary fastening screw (not shown) to insert nut 137 through screw hole 125. Flat portion 121b of L-shaped bus bar 127 and projection 119 thereby closely attach.

Figure 9:
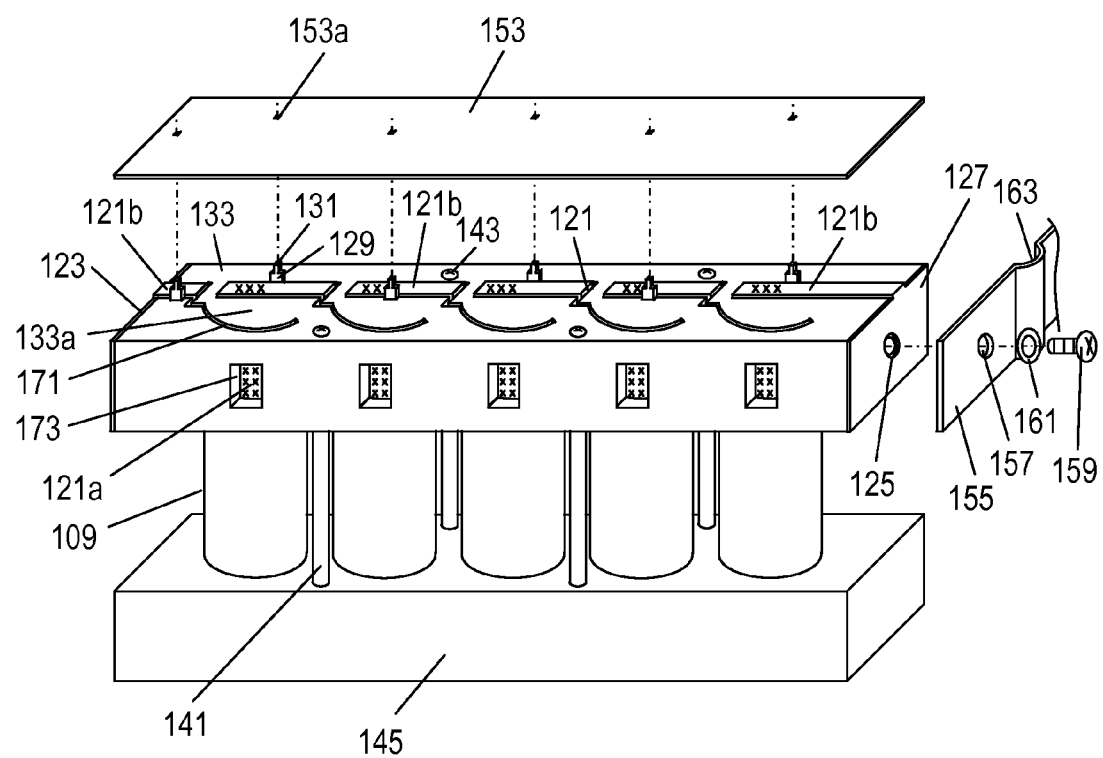
FIG. 9 is a partially assembled perspective view of the capacitor unit according to the second embodiment of the present invention.

FIG. 9 is a partially assembled perspective view of the capacitor unit according to the second embodiment of the present invention. In FIG. 9, each capacitor 109 is held by first fixing case 133 and second fixing case 145, and bus bar 121, end bus bar 123, and L-shaped bus bar 127 are positioned.

Flat portion 121b of bus bar 121 and L-shaped bus bar 127, and projection 119 of end face electrode 111 of FIG. 7 are first weld-connected. In FIG. 9, the welded portion is denoted with mark X. Thus, circumferential portion 121a can move along the length direction of side face electrode 113, similar to the first embodiment, even if a dimensional error in the height direction occurs in capacitor 109 and projection 119 of end face electrode 111 by weld-connecting flat portion 121b and projection 119. Therefore, flat portion 121b and projection 119 can be welded in a closely attached state, and stress caused by the dimension error does not apply on the welded portion of flat portion 121b and projection 119, and bus bar 121.

In this state, circumferential portion 121a and side face electrode 113 are closely attached without stress being applied on bus bar 121, and thus, circumferential portion 121a and side face electrode 113 are weld-connected through through-hole 173 thereafter. Such welded portion is shown with mark X in FIG. 9.

Through such manufacturing method, stress caused by the dimensional error ultimately does not apply on all the welded portions and bus bar 121. Therefore, excessive stress does not apply on the welded portion and bus bar 121 even if vehicle vibration is applied, and high reliability can be obtained. Furthermore, since circumferential portion 121a and side face electrode 113 are welded through through-hole 173, a step of welding while rotating capacitor 109 as in the first embodiment is unnecessary.

Subsequently, similar to the first embodiment, terminal portion 131 is inserted and connected to connection hole 153a of circuit substrate 153, and external bus bar 155 for electrically connecting with the outside is fixed to L-shaped bus bar 127 with screw 159, thereby completing the capacitor unit. Although not illustrated, external bus bar 155 is similarly fixed to end bus bar 123.

With the above configuration and the manufacturing method, a capacitor unit that is small and light weight, and has high reliability and enhanced assembly workability is realized.

In the second embodiment, manufacturing is carried out with a step of weld-connecting circumferential portion 121a and side face electrode 113 through through-hole 173 after weld-connecting flat portion 121b of bus bar 121 and projection 119 of end face electrode 111. However, manufacturing may be carried out with reverse step if the thickness of bus bar 121 is thick. If the thickness of bus bar 121 is thin, thermal stress caused by welding applies on bus bar 121 when flat portion 121b and projection 119 are weld-connected. In this case, if circumferential portion 121a and side face electrode 113 are welded in advance, the thermal stress remains as circumferential portion 121a cannot move, and excessive stress may be applied by vehicle vibration. From such reasons, a step of weld-connecting circumferential portion 121a and side face electrode 113 after weld-connecting flat portion 121b and projection 119 irrespective of the thickness of bus bar 121 is desirable.

Similar to the first embodiment, a configuration in which capacitor 109 is parallel and horizontally disposed with respect to each other, and pressure adjustment valve 115 is arranged on the upper side than the center of end face electrode 111 of capacitor 109 may be adopted. In this case, pressure adjustment valve 115 is arranged on the upper side than the center of end face electrode 111 of capacitor 109 by arranging such that through-hole 173 is on the upper side in FIG. 9 in the second embodiment.

In the second embodiment, circumferential portion 121a has a length of about ⅓ of the circumference of capacitor 109, as shown in FIG. 7, but may be longer. In this case, if circumferential portion 121a has a length of about ⅔ of the circumference of capacitor 109 as in the first embodiment, through-hole 173 may also be formed at the side surface on the back side of first fixing case 133 so that circumferential portion 121a can be weld-connected from both sides, whereby the reliability enhances and the contact resistance of the welding portion reduces.

Moreover, a bending portion, similar to the first embodiment, may be arranged at one part of bus bar 121, end bus bar 123, and L-shaped bus bar 127 such as flat portion 121b. The stress on bus bar 121, end bus bar 123, and L-shaped bus bar 127 due to thermal expansion and the like is thereby reduced.

In the first and second embodiments, a circular column shape capacitor 109 is adopted, but the present invention is not limited thereto, and capacitor of square column shape or other shapes may be adopted. In this case, the shape of circumferential portion 121a is appropriately changed according to the shape of the capacitor.

Third Embodiment

The configuration of a capacitor unit according to a third embodiment of the present invention will be described below using the drawings. In the third embodiment, a configuration of the capacitor unit that makes an electrical connection with the circuit substrate with respect to a capacitor having an electrode at both end faces will be described.

Figure 10:
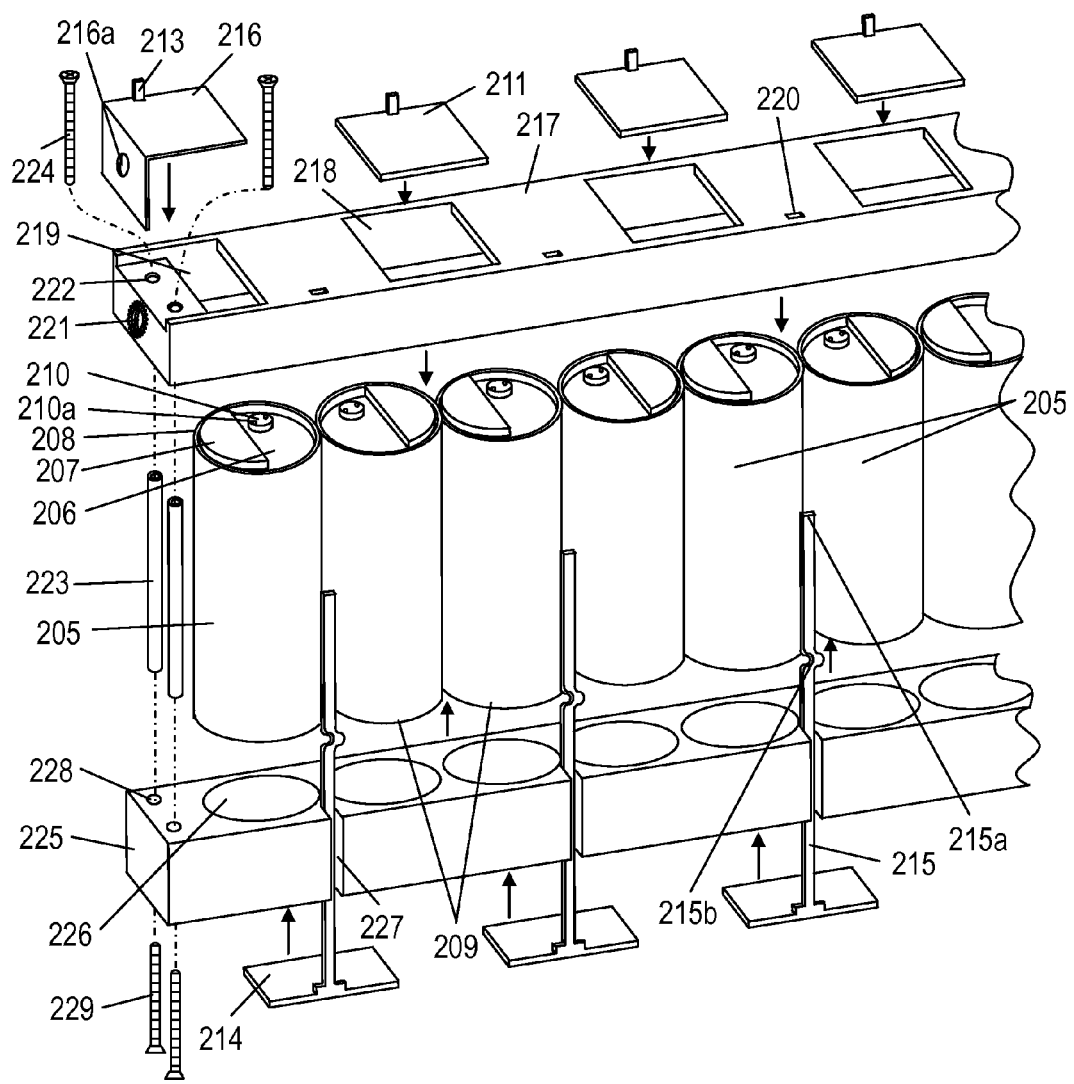
FIG. 10 is an exploded perspective view of a capacitor unit according to a third embodiment of the present invention.

FIG. 10 is an exploded perspective view of the capacitor unit according to the third embodiment of the present invention. In FIG. 10, plural capacitors 205 are electrical dual-layer capacitor of circular column shape having a diameter of 3 cm, and accumulate power. The circular column portion and the end face portion of capacitor 205 are both made of aluminum. Capacitor 205 is formed with electrodes such that one of the end faces is a positive pole, and the other end face is a negative pole. In the third embodiment, capacitors 205 are connected to each other in series, and thus are arranged such that the polarities of the end faces of adjacent capacitors 205 are different from each other. Projection 207 of semicircular shape integrally formed with upper end face 206 of capacitor 205 is formed such that the height is higher than end face peripheral portion 208. The insulation of the positive pole and the negative pole is ensured at end face peripheral portion 208. The projection is not arranged at lower end face 209 of capacitor 205. Pressure adjustment valve 210 is arranged at upper end face of capacitor 205. When the electrolyte in capacitor 205 is vaporized, pressure adjustment valve 210 discharges the vaporized electrolyte from discharge hole 210a formed on the outer surface of pressure adjustment valve 210 thereby preventing the pressure inside capacitor 205 from rising.

First bus bar 211 is arranged at the upper part of capacitor 205, and electrically connects projections 207 of adjacent capacitors 205. First conductive portion 213 of protruding shape is integrally formed on the upper surface of first bus bar 211. First conductive portion 213 is connected with a circuit substrate, to be hereinafter described, by soldering, and thus is performed with tin plating. The voltage value at first bus bar 211 can be detected by connecting first conductive portion 213 to the circuit substrate.

Second bus bar 214 is arranged at the lower part of capacitor 205, and electrically connects lower end faces 209 of adjacent capacitors 205. Second bus bar 214 is integrally formed with second conductive portion 215 of plate shape. Second conductive portion 215 has terminal portion 215a at the distal end performed with tin plating, similar to first conductive portion 213. The voltage value at second bus bar 214 can be detected by connecting terminal portion 215a to the circuit substrate, to be hereinafter described. Bending portion 215b is arranged at second conductive portion 215, which bending portion 215b absorbs the stress caused by vibration and heat, so that the possibility of damage at second conductive portion 215 itself and at the soldered portion of terminal portion 215a and the circuit substrate, to be hereinafter described, can be reduced.

L-shaped bus bar 216 is connected with projection 207 of capacitor 205 positioned at the most end. L-shaped bus bar screw hole 216a is formed to electrically connect with the external wiring. The connection with the external wiring will be described hereinafter.

First bus bar 211, second bus bar 214, and L-shaped bus bar 216 are made of aluminum same as the circular column portion and the end face portion of capacitor 205 to enhance the weld-connection property with the electrode of capacitor 205, and are formed by press molding an aluminum plate. In the third embodiment, first bus bar 211, second bus bar 214, and L-shaped bus bar 216 are made of aluminum, but may be made of metal other than aluminum as long as it is the same as the electrode of capacitor 205.

Upper case 217 is made of resin, and is fixed by inserting the upper part of capacitor 205. Upper case 217 is arranged with first bus bar opening 218 and L-shaped bus bar opening 219 to connect first bus bar 211, and L-shaped bus bar 216 and projection 207. Upper case 217 is also formed with second conductive portion hole 220. Second conductive portion 215 is fixed by being inserted to second conductive portion hole 220. Insert nut 221 is buried at the left end of upper case 217. L-shaped bus bar 216 and the external bus bar (to be hereinafter described) are electrically and mechanically connected by insert nut 221. Upper fixation screw hole 222 is arranged near L-shaped bus bar opening 219. Fixing rod 223 is arranged at the position of upper fixation screw hole 222, where fixing rod 223 and upper case 217 are fixed by fastening upper fixation screw 224 from above. In this case, upper fixation screw 224 is a countersunk screw so that L-shaped bus bar 216 and upper fixation screw 224 do not contact. Although not shown, upper fixation screw hole for attaching fixing rod 223 is also formed at the right end of upper case 217.

Lower case 225 is also made of resin, similar to upper case 217. Circular holding hole 226 is formed at the upper surface of lower case 225. The lower part of capacitor 205 is inserted and fixed in holding hole 226. Cutout portion 227 is formed at the side surface of lower case 225, where second conductive portion 215 is integrally formed with second bus bar 214 and is inserted to cutout portion 227. Similar to upper case 217, lower fixation screw hole 228 is arranged at the left end of lower case 225. Fixing rod 223 and lower case 225 are fixed by fastening lower fixation screw 229 including a countersunk screw to fixing rod 223 arranged at the position of lower fixation screw hole 228. Although not shown, a lower fixation screw hole for attaching fixing rod 223 is also formed at the right end of lower case 225.

Figure 11:
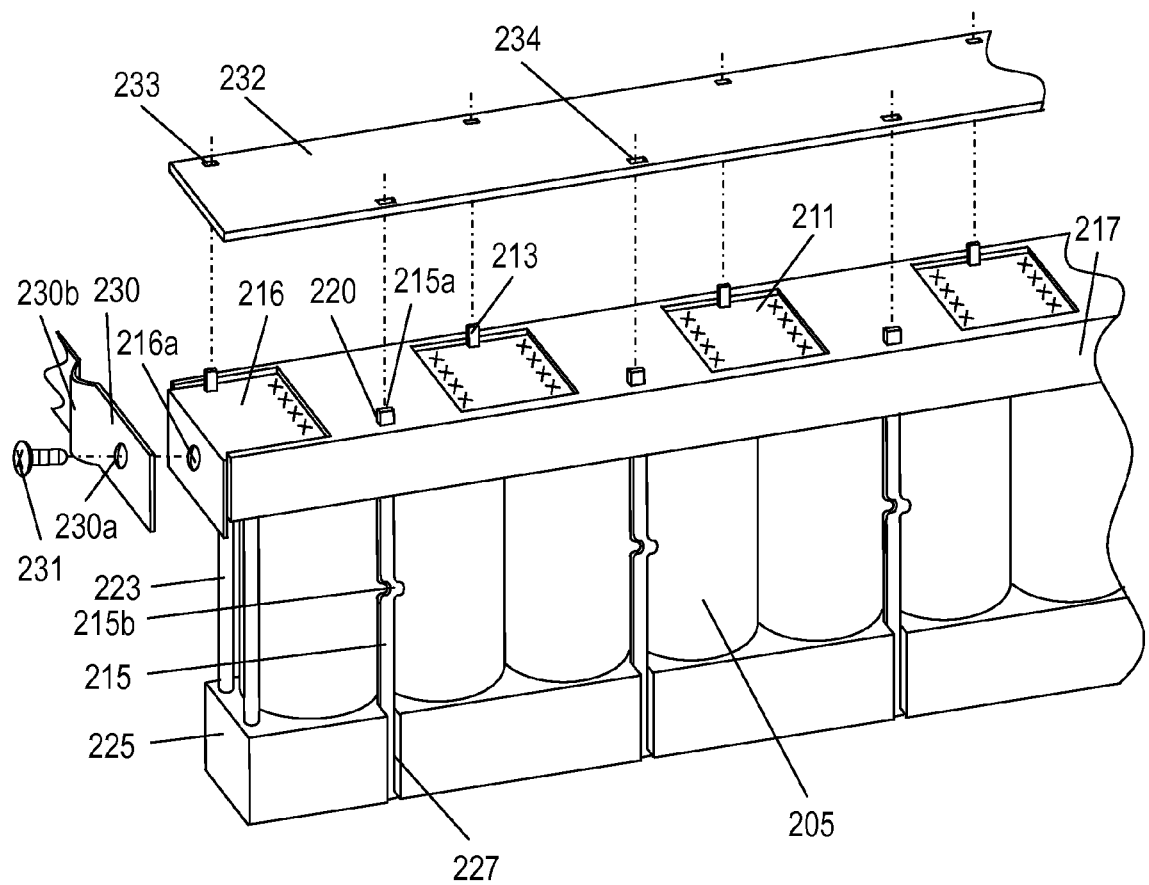
FIG. 11 is a partially assembled perspective view of the capacitor unit according to the third embodiment of the present invention.

FIG. 11 is a partially assembled perspective view of the capacitor unit according to the third embodiment of the present invention. In FIG. 11, upper case 217 and lower case 225 are connected by fixing rod 223, and capacitor 205 is strongly fixed by being sandwiched by upper case 217 and lower case 225.

First bus bar 211 and L-shaped bus bar 216 cover projection 207 arranged at the upper end face of capacitor 205. The connection of first bus bar 211 and L-shaped bus bar 216, and projection 207 is carried out by laser welding the portion indicated with mark X of FIG. 11. Capacitors 205 are reliably electrically and mechanically connected through such welding. An example of welding great number of points in spot form is shown in FIG. 11, but weld-connecting may be carried out in linear form by sequentially shifting the welding position. This enhances the connection reliability compared to the spot form. Although not shown, second bus bar 214 is similarly welded with the lower end face of capacitor 205.

The capacitor unit formed in such manner has external bus bar 230 and external bus bar screw hole 230a fastened and fixed to insert nut 221 with screw 231 for wiring with the outside. In this case, the capacitor unit is fixed through L-shaped bus bar 216, and thus external bus bar 230 and L-shaped bus bar 216 are electrically connected. External bus bar 230 is formed with external bus bar bending portion 230b. Thus, the stress caused by vibration and heat is absorbed by external bus bar bending portion 230b, thereby reducing the possibility of damage occurring in external bus bar 230.

Second conductive portion 215 is inserted to second conductive portion hole 220, and thus terminal portion 215a projects out from the upper surface of upper case 217. Bending portion 215b arranged on second conductive portion 215 is positioned between upper case 217 and lower case 225. When terminal portion 215a and first conductive portion 213 are inserted to first conductive portion hole 233 and terminal hole 234 formed in circuit substrate 232 and then soldered in such state, first bus bar 211, and second bus bar 214, and L-shaped bus bar 216 are electrically connected with circuit substrate 232. Circuit substrate 232 includes a voltage balance circuit (not shown) for measuring and controlling the voltage value of each capacitor 205.

Figure 12:
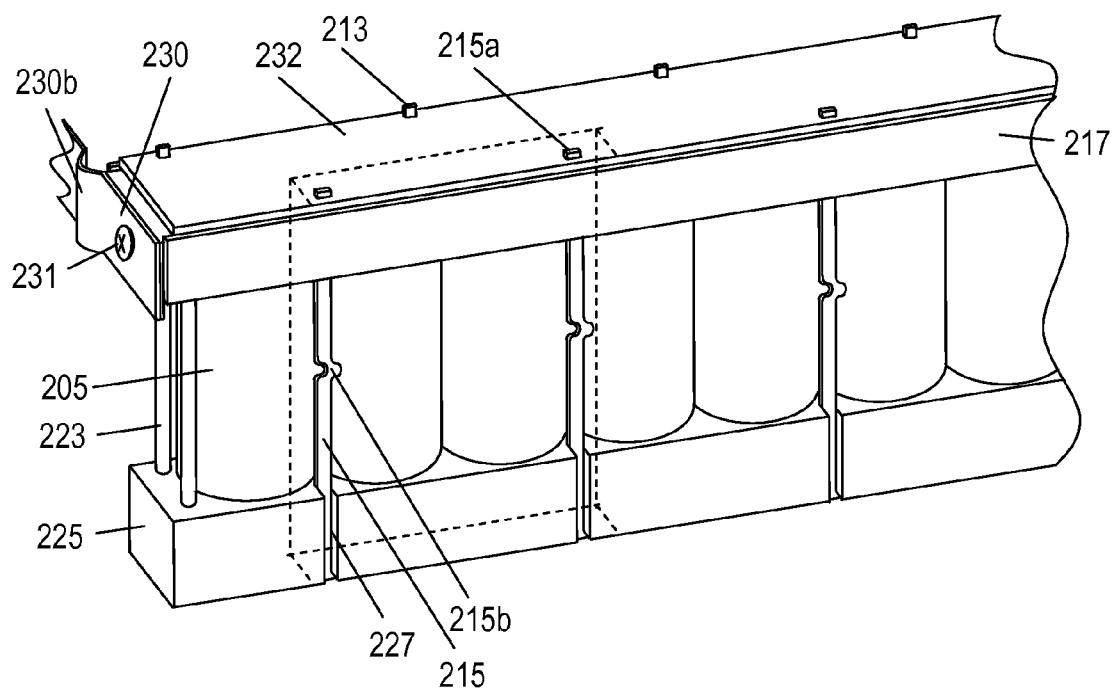
FIG. 12 is a completed perspective view of the capacitor unit according to the third embodiment of the present invention.
Figure 13:
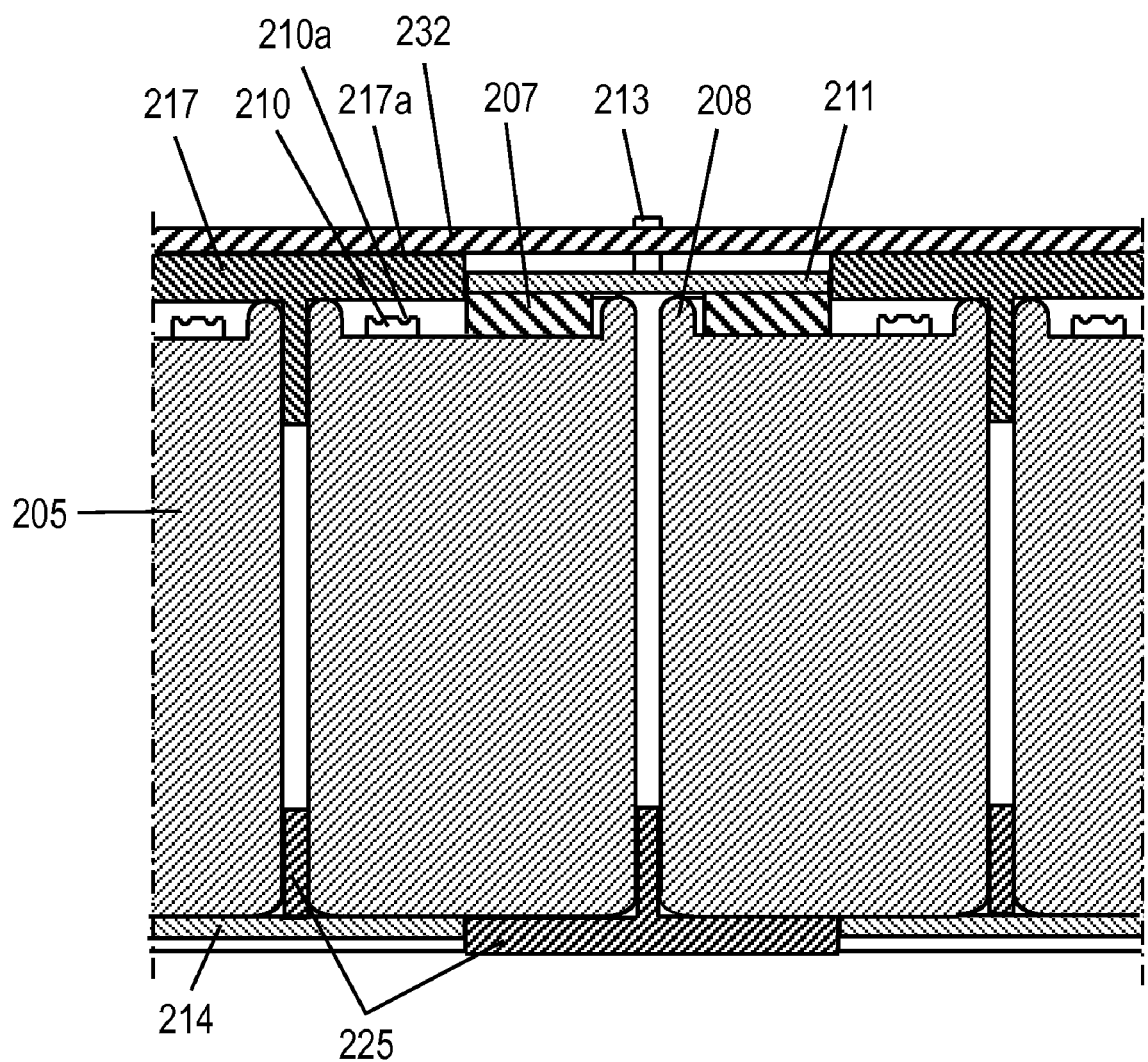
FIG. 13 is a partial cross-sectional view of the capacitor unit according to the third embodiment of the present invention.

FIG. 12 is a completed perspective view of the capacitor unit according to the third embodiment of the present invention. FIG. 13 is a partial cross-sectional view of the capacitor unit according to the third embodiment of the present invention. The cross-sectional view of the square portion shown with a broken line in FIG. 12 is shown in FIG. 13. In FIGS. 12 and 13, projection 207 is formed such that the height is higher than end face peripheral portion 208, and thus first bus bar 211 does not contact end face peripheral portion 208 and not short-circuit.

Furthermore, pressure adjustment valve 210 is faced to and covered by cover portion 217a of one part of upper case 217, and thus is configured at a distance from circuit substrate 232 and first bus bar 211. Thus, even if the vaporized electrolyte in capacitor 205 is discharged from pressure adjustment valve 210, such electrolyte does not attach to first bus bar 211 and circuit substrate 232, whereby corrosion possibility thereof reduces and high reliability is obtained. Moreover, the height of pressure adjustment valve 210 is lower than end face peripheral portion 208, and a void exists with upper case 217 arranged at the upper part of pressure adjustment valve 210.

Therefore, discharge hole 210a is not blocked, and vaporized electrolyte can be normally discharged from discharge hole 210a.

Since the thickness of the bottom surface of lower case 225 is thicker than the thickness of second bus bar 214, second bus bar 214 does not contact other than capacitor 205 and lower case 225. Therefore, earth leakage from second bus bar 214 can be prevented, and high reliability can be obtained.

In capacitor 205, the degradation of the characteristics may advance if the voltage value at both ends becomes too high. In order to prevent characteristics degradation, the voltage values of first bus bar 211 and second bus bar 214 are sequentially measured, and the voltage value at both ends of capacitor 205 need to be controlled. This is carried out with one circuit substrate 232, whereby the capacitor unit can be miniaturized and made lighter in the third embodiment.

The effects of the third embodiment of the present invention will be described below.

As described above, in the third embodiment, the voltage value at both ends of each capacitor 205 can be measured with one circuit substrate 232, and the capacitor unit can be miniaturized and made lighter.

This is obtained by electrically connecting first bus bar 211 and the voltage balance circuit of circuit substrate 232 through first conductive portion 213, and second bus bar 214 and the voltage balance circuit of circuit substrate 232 through second conductive portion 215, and measuring the voltage value at both ends of each capacitor 205. According to such configuration, the voltage value at both ends of each capacitor 205 can be measured with only circuit substrate 232 arranged on the upper side of upper case 217. As a result, the capacitor unit can be miniaturized and made lighter.

Furthermore, first conductive portion 213 and second conductive portion 215 are integrally formed with first bust bar 211 and second bus bar 214, respectively. Thus, first conductive portion 213 and second conductive portion 215 are reliably connected with first bus bar 211 and second bus bar 214, respectively, thereby reducing the possibility of damage at the connecting portion. In particular, this configuration is useful when the capacitor unit is mounted on the vehicle since the vibration of the vehicle is assumed to be transmitted to the capacitor.

Figure 14A:
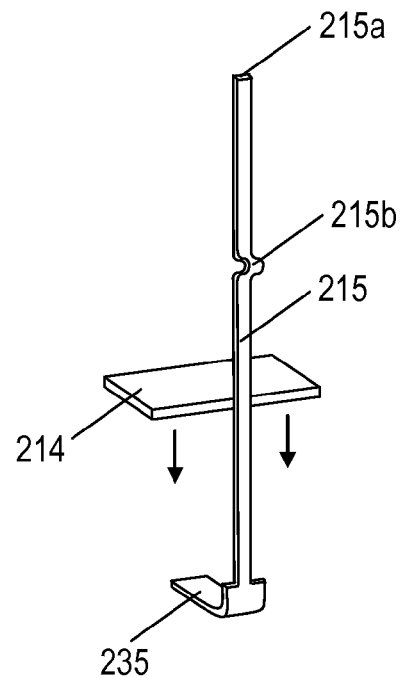
FIG. 14A is a perspective view of before the weld-connection of the second conductive portion to the second bus bar of the capacitor unit according to the third embodiment of the present invention.
Figure 14B:
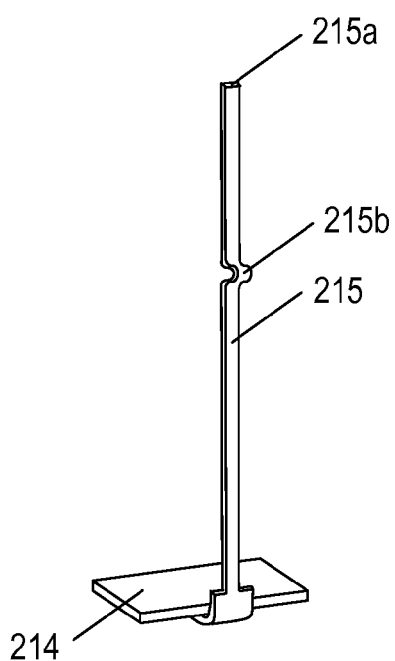
FIG. 14B is a perspective view of after the weld-connection of the second conductive portion to the second bus bar of the capacitor unit according to the third embodiment of the present invention.

FIG. 14A is a perspective view of before the weld-connection of the second conductive portion to the second bus bar of the capacitor unit according to the third embodiment of the present invention. FIG. 14B is a perspective view of after the weld-connection of the second conductive portion to the second bus bar of the capacitor unit according to the third embodiment of the present invention. In FIGS. 14A, 14B, second bus bar 214 and second conductive portion 215 may be separate bodies and weld-connected. In such configuration as well, second bus bar 214 and second conductive portion 215 are reliably connected. Second bus bar 214 and second conductive portion 215 are preferably made of the same metal to obtain satisfactory weld-connection property. Second bus bar 214 and second conductive portion 215 are more reliably connected by increasing the area of welded portion 235 shown in FIG. 14A.

In the third embodiment, capacitor 205 is parallel and vertically disposed with respect to each other, and pressure adjustment valve 210 is arranged to be on the upper side. Thus, the possibility of the electrolyte leaking out from pressure adjustment valve 210 can be reduced, and high reliability can be obtained.

Capacitor 205 may be parallel and horizontally disposed, and pressure adjustment valve 210 may be arranged on the upper side than the center of one end face. Even if the capacitor unit is arranged in the horizontal direction, the voltage value of each capacitor 205 can be measured with circuit substrate 232 arranged only on one end face side of capacitor 205 by using the configuration of the present invention, and the capacitor unit can be miniaturized and made lighter. Furthermore, as pressure adjustment valve 210 is arranged on the upper side than the center of the end face of capacitor 205, the possibility of the electrolyte leaking out from pressure adjustment valve 210 can be reduced. Moreover, the capacitor unit mounted on the vehicle is often mounted under the floor, and thus is exposed to severe vibration condition and is demanded lower height, where the present configuration is suitable for the vehicle capacitor unit if the entire height is lowered with capacitor unit 205 parallel and horizontally disposed.

Capacitor 205 of circular column shape is adopted in the third embodiment of the present invention, but the present invention is not limited thereto, and the capacitor of square column shape or other shapes may be adopted.

Fourth Embodiment

Figure 15:
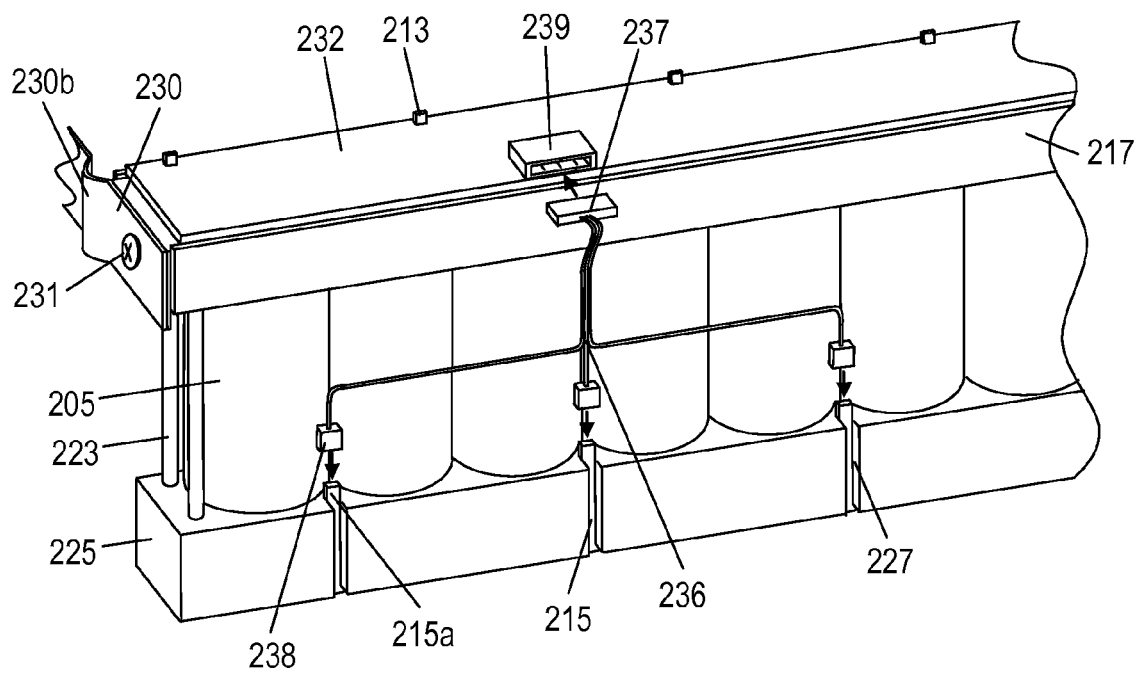
FIG. 15 is a perspective view of before flexible cable connection of a capacitor unit according to a fourth embodiment of the present invention.

FIG. 15 is a perspective view of before flexible cable connection of a capacitor unit according to a fourth embodiment of the present invention. In FIG. 15, the fourth embodiment differs from the third embodiment in that second conductive portion 215 and circuit substrate 232 are connected by way of flexible cable 236.

One end of flexible cable 236 is arranged with substrate connector 237, and the other end is arranged with bus bar connector 238. Substrate connector 237 is inserted to socket 239 mounted on circuit substrate 232, and bus bar connector 238 is connected with terminal portion 215a at the end of second conductive portion 215. Second bus bar 214 and circuit substrate 232 are thereby electrically connected.

According to such configuration as well, the voltage value at both ends of capacitor 205 can be measured with only circuit substrate 232 arranged on the upper side of upper case 217, and the capacitor unit can be miniaturized and made lighter.

Similar effects are obtained by using an electric wire having substrate connector 237 and bus bar connector 238 attached to the respective end in place of flexible cable 236.

Fifth Embodiment

In the fifth embodiment, a capacitor unit of a configuration in which a monitor terminal is arranged at the upper part of a tubular case of a capacitor, and is electrically connected with a circuit substrate will be described.

Figure 16:
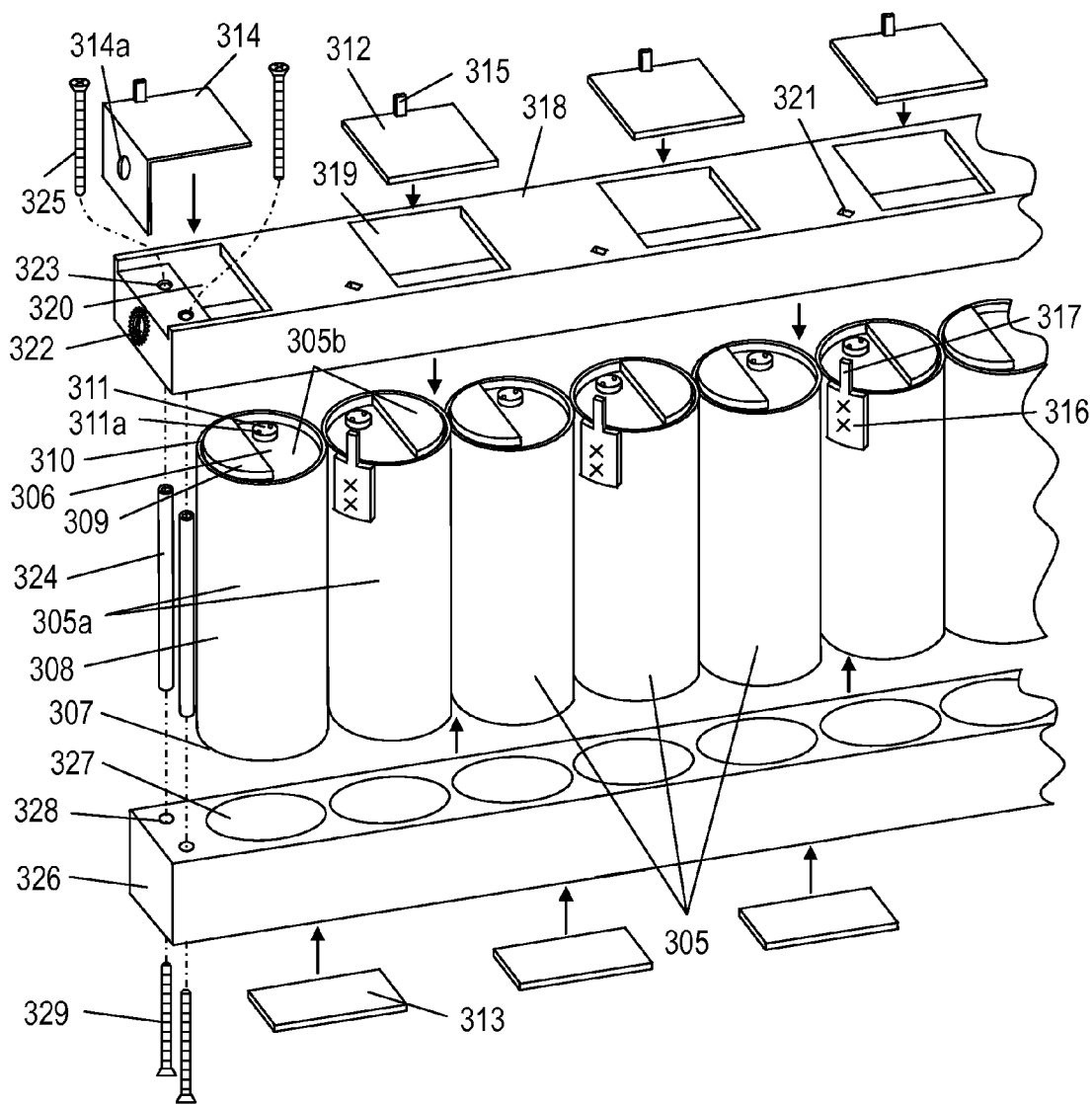
FIG. 16 is an exploded perspective view of a capacitor unit according to a fifth embodiment of the present invention.

FIG. 16 is an exploded perspective view of the capacitor unit according to the fifth embodiment of the present invention. In FIG. 16, plural capacitors 305 include bottomed cylindrical case 305a with a diameter of 3 cm having an opening at the upper surface, and lid 305b for sealing the opening. Plural capacitors 305 is an electrical dual-layer capacitor in which first end face electrode 306 is formed at the portion of lid 305b by connection with an internal electrode of capacitor 305, and second end face electrode 307 having a polarity different from first end face electrode 306 at the lower end face of tubular case 305a, and accumulates power. Tubular case 305a and lid 305b of capacitor 305 are both made of aluminum. Capacitor 305 is electrically conducted from the lower end face of tubular case 305a forming second end face electrode 307 to side surface portion 308 of tubular case 305a, and thus entire side surface portion 308 has substantially the same voltage value as second end face electrode 307. The polarity of first end face electrode 306 of adjacent capacitors 305 is different from each other since capacitors 305 are connected in series in the fifth embodiment.

Similar to first end face electrode 306, second end face electrode 307 and side surface portion 308 also have polarities different from second end face electrode 307 and side surface portion 308 of adjacent capacitor 305. Semicircular projection 309 integrally formed with first end face electrode 306 is configured to be higher than end face peripheral portion 310. Although not shown, an insulation member is arranged at peripheral portion 10 of lid 305b, so that short-circuit of first end face electrode 306 and side surface portion 308 of tubular case 305a having different polarities from each other is prevented.

Pressure adjustment valve 311 is arranged on the surface of lid 305b portion of capacitor 305. Pressure adjustment valve 311 discharges vaporized electrolyte from discharge hole 311a formed on the outer surface of pressure adjustment valve 311 when the electrolyte is vaporized in capacitor 305, and prevents the pressure in capacitor 305 from rising. Pressure adjustment valve 311 is arranged at lid 305b portion positioned at the upper part of capacitor 305, and thus the possibility the electrolyte leaks out from discharge hole 311a is reduced and high reliability is obtained.

First bus bar 312 is arranged at the upper part of capacitor 305. First bus bar 312 electrically connects adjacent capacitors 305 by being connected to projection 309 of capacitor 305.

Second bus bar 313 electrically connects adjacent capacitors 305, similar to first bus bar 312, by being connected to second end face electrode 307. First bus bar 312 and second bus bar 313 are alternately and sequentially arranged at both end portions of capacitor 305 to connect plural capacitors 305 in series.

L-shaped bus bar 314 is connected to projection 309 of capacitor 305 positioned at the most end, and L-shaped bus bar screw hole 314a is formed to electrically connect with the external wiring. The connection with the external wiring will be hereinafter described.

First bus bar 312, second bus bar 313, and L-shaped bus bar 314 are made of aluminum same as case 305a and lid 305b of capacitor 305 to enhance the weld-connection property with first end face electrode 306 and second end face electrode 307 of capacitor 305, and is formed by press molding an aluminum plate. In the fifth embodiment, first bus bar 312, second bus bar 313, and L-shaped bus bar 314 are made of aluminum, but may be made of metal other than aluminum as long as it is the same as case 305a and lid 305b of capacitor 305.

Bus bar conductive portion 315 is arranged in a projecting manner at the upper part of first bus bar 312. Bus bar conductive portion 315 is performed with tin plating to connect with circuit substrate 332 (see FIG. 17), to be hereinafter described, by soldering. The voltage value at first bus bar 312 and L-shaped bus bar 314 is detected by connecting bus bar conductive portion 315 with circuit substrate 332.

Monitor terminal portion 317 is made of aluminum, and is integrated with side surface conductive portion 316 and arranged projecting in the upward direction. Side surface conductive portion 316 is connected with side surface portion 308 by laser welding the portion indicated with mark X. Side surface portion 308 is also electrically conducted with second end face electrode 307, and thus circuit substrate 332 can detect the voltage value at second end face electrode 307 by connecting monitor terminal portion 317 with circuit substrate 332. Monitor terminal portion 317 is performed with tin plating to perform soldering with circuit substrate 332, similar to bus bar conductive portion 315.

First resinous fixing case 318 is inserted and fixed with the upper part of capacitor 305. First fixing case 318 is arranged with first bus bar opening 319 and L-shaped bus bar opening 320 for connecting first bus bar 312 and L-shaped bus bar 314 and projection 309. First fixing case 318 is also formed with monitor terminal portion hole 321, where monitor terminal portion 317 is fixed by being inserted to monitor terminal portion hole 321. Insert nut 322 is buried at the left end of first fixing case 318, and L-shaped bus bar 314 and external bus bar 330 (see FIG. 17) are electrically and mechanically connected by insert nut 322. Upper fixation screw hole 323 is arranged near L-shaped bus bar opening 320. Fixing rod 324 is arranged at the position of upper fixation screw hole 323, where fixing rod 324 and first fixing case 318 are fixed by fastening upper fixation screw 325 from above. In this case, upper fixation screw 325 is a countersunk screw so that L-shaped bus bar 314 and upper fixation screw 325 do not contact. Although not shown, upper fixation screw hole for attaching fixing rod 324 is also formed at the right end of first fixing case 318.

Similar to first fixing case 318, second fixing case 326 is also made of resin. Circular holding hole 327 is formed at the upper part of second fixing case 326, where the lower part of capacitor 305 is inserted and fixed to holding hole 327. Furthermore, lower fixation screw hole 328 is arranged at the left end of second fixing case 326, and fixing rod 324 and second fixing case 326 are fixed by fastening lower fixation screw 329 including a countersunk screw to fixing rod 324 arranged at the position of lower fixation screw hole 328. Although not shown, lower fixation screw hole for attaching fixing rod 324 is also formed at the right end of second fixing case 326.

Figure 17:
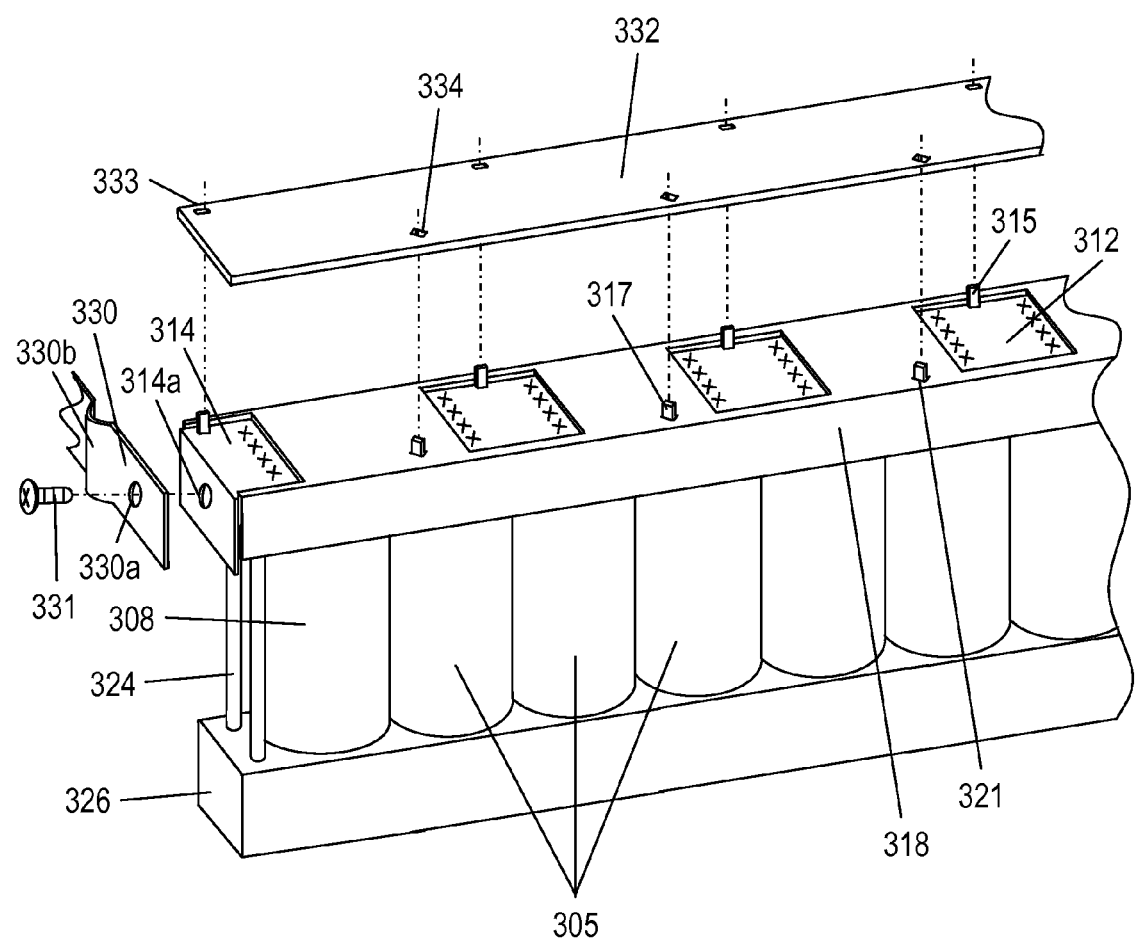
FIG. 17 is a partially assembled perspective view of the capacitor unit according to the fifth embodiment of the present invention.
Figure 18:
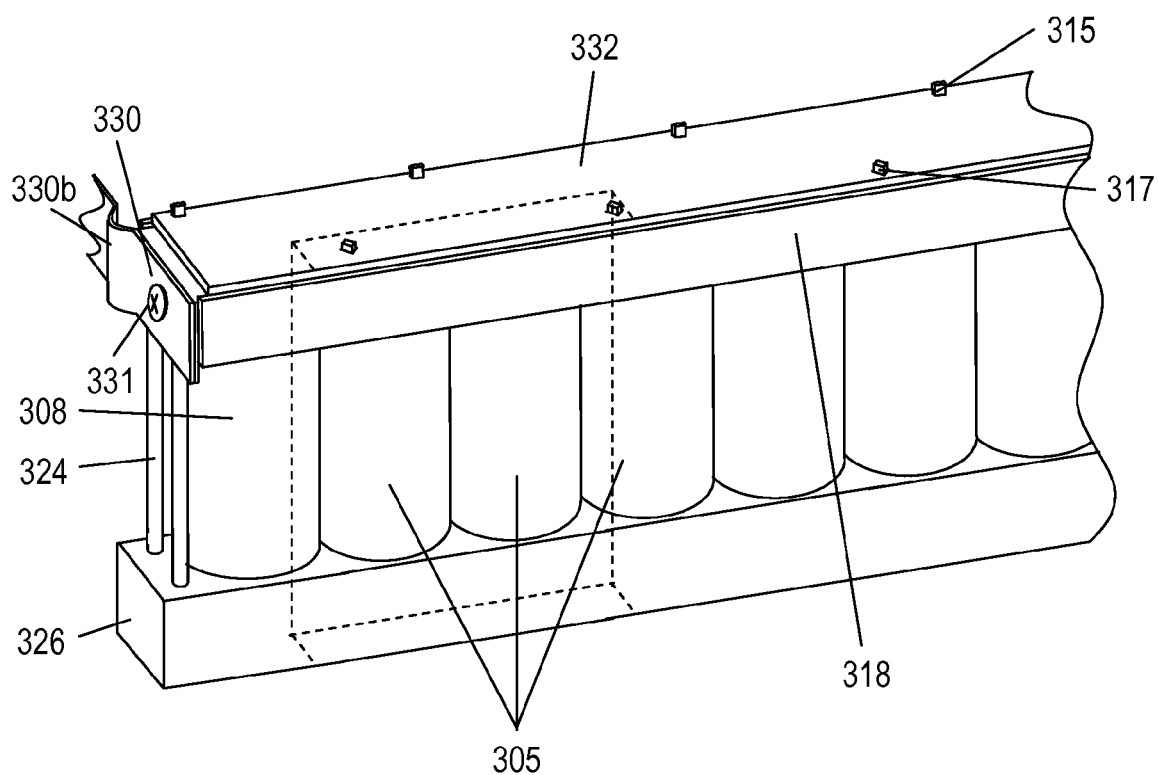
FIG. 18 is a completed perspective view of the capacitor unit according to the fifth embodiment of the present invention.

FIG. 17 is a partially assembled perspective view of the capacitor unit according to the fifth embodiment of the present invention. FIG. 18 is a completed perspective view of the capacitor unit according to the fifth embodiment of the present invention. In FIGS. 17 and 18, first fixing case 318 and second fixing case 326 are connected by fixing rod 324. Capacitor 305 is strongly fixed by being sandwiched by first fixing case 318 and second fixing case 326.

First bus bar 312 and L-shaped bus bar 314 are covered on projection 309 arranged at the upper end face of capacitor 305. The connection of first bus bar 312 and L-shaped bus bar 314, and projection 309 is carried out by laser welding the portion indicated with mark X of FIG. 17. Adjacent capacitors 305 are reliably electrically and mechanically connected through such welding. An example of welding great number of points in spot form is shown in FIG. 17, but weld-connecting may be carried out in linear form by sequentially shifting the welding position. This enhances the connection reliability compared to welding in spot form. Although not shown, second bus bar 313 is similarly welded with the lower end face of capacitor 305.

The capacitor unit formed in such manner has external bus bar screw hole 330a formed in external bus bar 330 for wiring with the outside fastened and fixed to insert nut 322 with screw 331. In this case, the capacitor unit is fixed through L-shaped bus bar 314, and thus external bus bar 330 and L-shaped bus bar 314 are electrically connected. In this case, external bus bar 330 is fixed through L-shaped bus bar 314, and thus external bus bar 330 and L-shaped bus bar 314 are electrically connected. External bus bar 330 is formed with bending portion 330b. Thus, the stress caused by vibration and heat is absorbed by bending portion 330b, thereby reducing the possibility of damage occurring in external bus bar 330.

Since monitor terminal portion 317 is inserted to monitor terminal portion hole 321, monitor terminal portion 317 projects out from the upper surface of first fixing case 318. Monitor terminal portion 317 and bus bar conductive portion 315 are inserted and soldered to bus bar connection hole 333 and monitor terminal portion connection hole 334 formed in circuit substrate 334 in this state, so that first bus bar 312, L-shaped bus bar 314 and side surface conductive portion 316 are electrically connected with circuit substrate 332. Circuit substrate 332 includes a voltage balance circuit (not shown) for measuring and controlling the voltage value of each capacitor 305.

Figure 19:
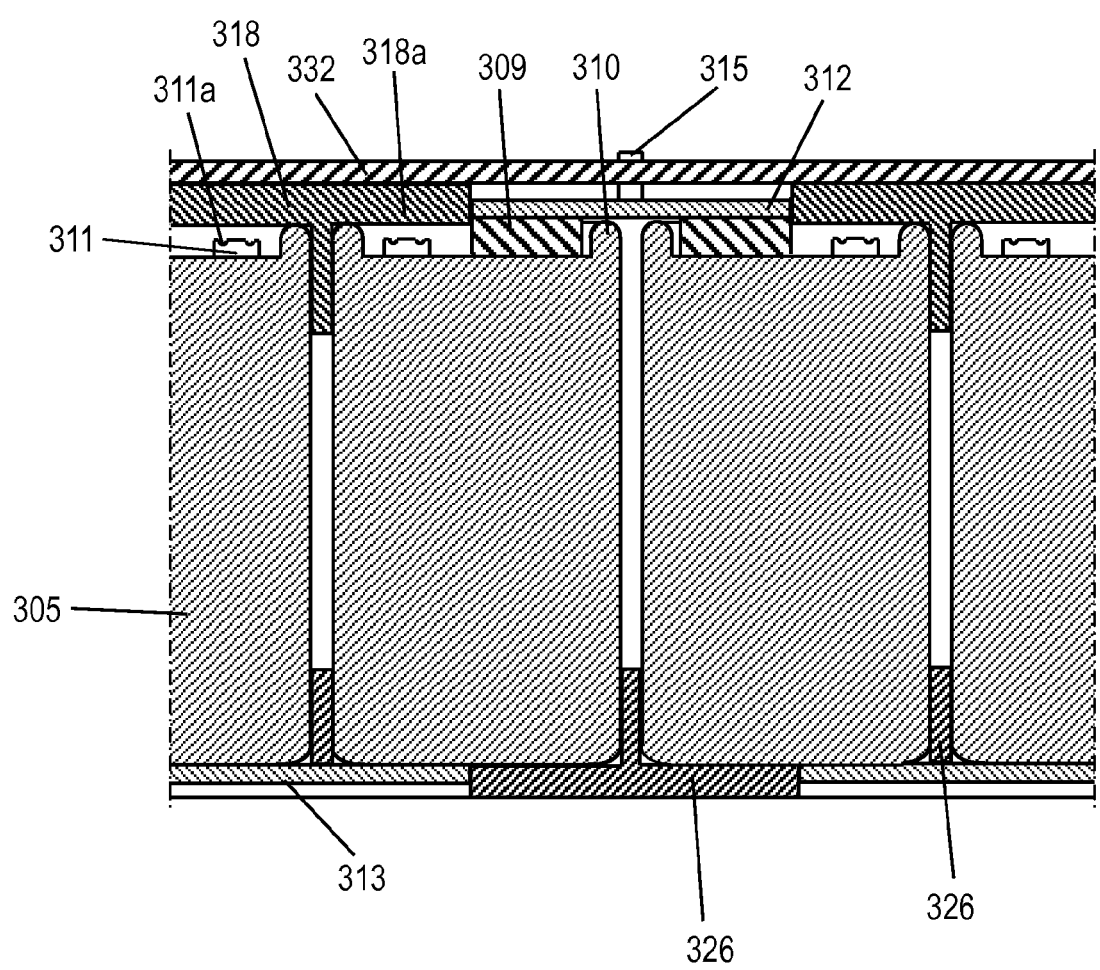
FIG. 19 is a partial cross-sectional view of the capacitor unit according to the fifth embodiment of the present invention.

FIG. 19 is a partial cross-sectional view of the capacitor unit according to the fifth embodiment of the present invention.

The cross-sectional view of the square portion shown with a broken line in FIG. 18 is shown in FIG. 19. In FIG. 19, projection 309 is arranged such that the height is higher than end face peripheral portion 310, and thus first bus bar 312 does not contact end face peripheral portion 310 and not short-circuit.

Pressure adjustment valve 311 is faced to and covered by cover portion 318a of one part of first fixing case 318, and thus is configured at a distance from circuit substrate 332 and first bus bar 312. Moreover, the height of pressure adjustment valve 311 is lower than end face peripheral portion 310, and a void exists between pressure adjustment valve 311 and first fixing case 318 arranged at the upper part thereof. Therefore, discharge hole 311a is not blocked, and vaporized electrolyte can be normally discharged from discharge hole 311a.

The operation of the capacitor unit according to the fifth embodiment of the present invention will be described below.

As described above, capacitor 305 has a possibility the degradation of characteristics may advance if the voltage value at both ends becomes too high. In order to prevent such degradation of characteristics, the voltage value at first end face electrode 306 and second end face electrode 307 of each capacitor 305 needs to be sequentially measured, and the voltage value at both ends of capacitor 305 needs to be controlled.

In the fifth embodiment, first bus bar 312 and circuit substrate 332 are connected by way of bus bar conductive portion 315, and side surface portion 308 and circuit substrate 332 are connected by way of monitor terminal portion 317. In other words, side surface portion 308 is electrically conducted with second end face electrode 307, and has substantially the same voltage value. Therefore, the voltage value at second end face electrode 307 can be measured with circuit substrate 332 by electrically connecting side surface portion 308 and circuit substrate 332.

As a result, the voltage value at first end face electrode 306 and second end face electrode 307 can be measured with circuit substrate 322, and the voltage value at both ends of capacitor 305 can be controlled.

The effects of the fifth embodiment will be described below.

First, the capacitor can be miniaturized and made lighter in the fifth embodiment. This is because the voltage value at first end face electrode 306 and second end face electrode 307 can be measured and controlled with one circuit substrate 322 according to the configuration described above. The electrical connection of side surface portion 308 and circuit substrate 332 is possible with only side surface conductive portion 316 integrated with monitor terminal portion 317 arranged at the upper part of side surface portion 308. Therefore, the capacitor unit can be miniaturized and made lighter.

Furthermore, in the fifth embodiment, side surface conductive portion 316 is welded to side surface portion 308 of capacitor 305. Thus, side surface conductive portion 316 and side surface portion 308 are strongly connected, and the possibility of damage at the connecting portion can be reduced. In particular, this configuration is useful when the capacitor unit is mounted on the vehicle since the vibration of the vehicle is assumed to be transmitted to the capacitor.

Furthermore, pressure adjustment valve 311 is arranged at a distance with circuit substrate 332 and first bus bar 312 by facing cover portion 318a. According to such configuration, even if the vaporized electrolyte is discharged from discharge hole 311a, the vaporized electrolyte does not attach to circuit substrate 332 and first bus bar 312 and the corrosion possibility thereof can be reduced. Therefore, high reliability of the capacitor unit can be obtained.

Capacitor 305 may be parallel and horizontally disposed, and pressure adjustment valve 311 may be arranged on the upper side than the center of lid 305b of capacitor 305. Even if the capacitor unit is arranged in the horizontal direction, the voltage value of each capacitor 305 can be measured with circuit substrate 332 arranged only on first end face electrode 306 side of capacitor 305 by using the configuration of the present invention, and the capacitor unit can be miniaturized and made lighter. Furthermore, as pressure adjustment valve 311 is arranged on the upper side than the center of lid 305b of capacitor 305, the possibility of the electrolyte leaking out from discharge hole 311a can be reduced. Moreover, the capacitor unit mounted on the vehicle is often mounted under the floor, and thus is demanded lower height, where the present configuration is suitable for the vehicle capacitor unit if the entire height is lowered with capacitor unit 5 parallel and horizontally disposed.

Side surface portion 308 of capacitor 305 includes an electrode of the same polarity as second end face electrode 307, and thus electrically connects first end face electrodes 306 of adjacent capacitors 305 and also electrically connects side surface portions 308, and connects capacitors 305 in series.

Capacitor 305 of circular column shape is adopted in the fifth embodiment, but the present invention is not limited thereto, and the capacitor of square column shape or other shapes may be adopted.

Sixth Embodiment

The configuration of a capacitor unit according to a sixth embodiment of the present invention will be described below using the drawings.

Figure 20:
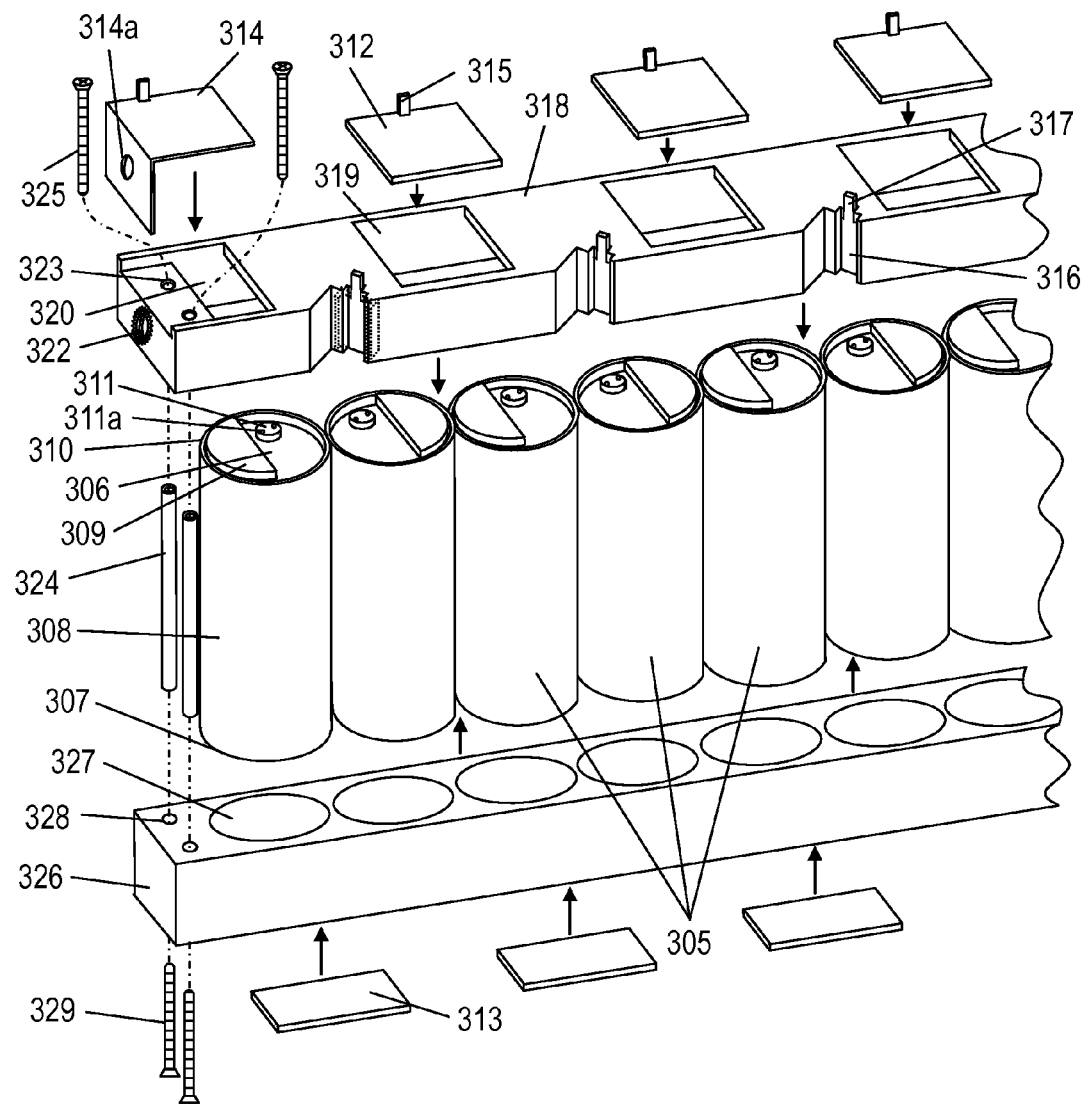
FIG. 20 is an exploded perspective view of a capacitor unit according to a sixth embodiment of the present invention.

FIG. 20 is an exploded perspective view of the capacitor unit according to the sixth embodiment of the present invention. In FIG. 20, the difference between the sixth embodiment and the fifth embodiment is that side surface conductive portion 316 is fixed to first fixing case 318. Side surface conductive portion 316 is integrally formed with first fixing case 318 by insert molding, and is reliably fixed. Although not illustrated, side surface conductive portion 316 is partially exposed at the inner side of first fixing case 318 to connect with side surface portion 308. Furthermore, side surface conductive portion 316 is made of aluminum, similar to case 305a and lid 305b of capacitor 305. Monitor terminal portion 317 is projected in the upward direction from first fixing case 318 to connect with the circuit substrate, and is performed with tin plating. Other configuring parts are similar to the fifth embodiment.

Figure 21:
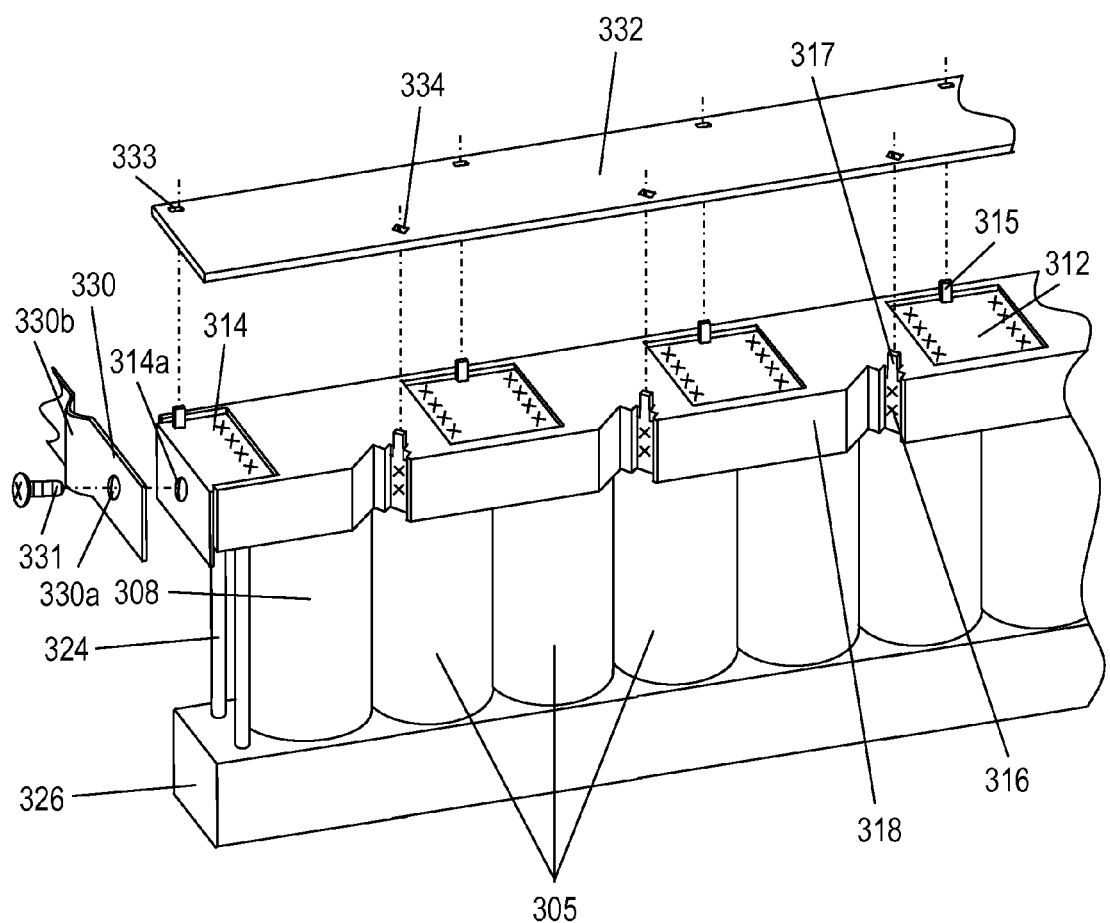
FIG. 21 is a partially assembled perspective view of the capacitor unit according to the sixth embodiment of the present invention.
Figure 22:
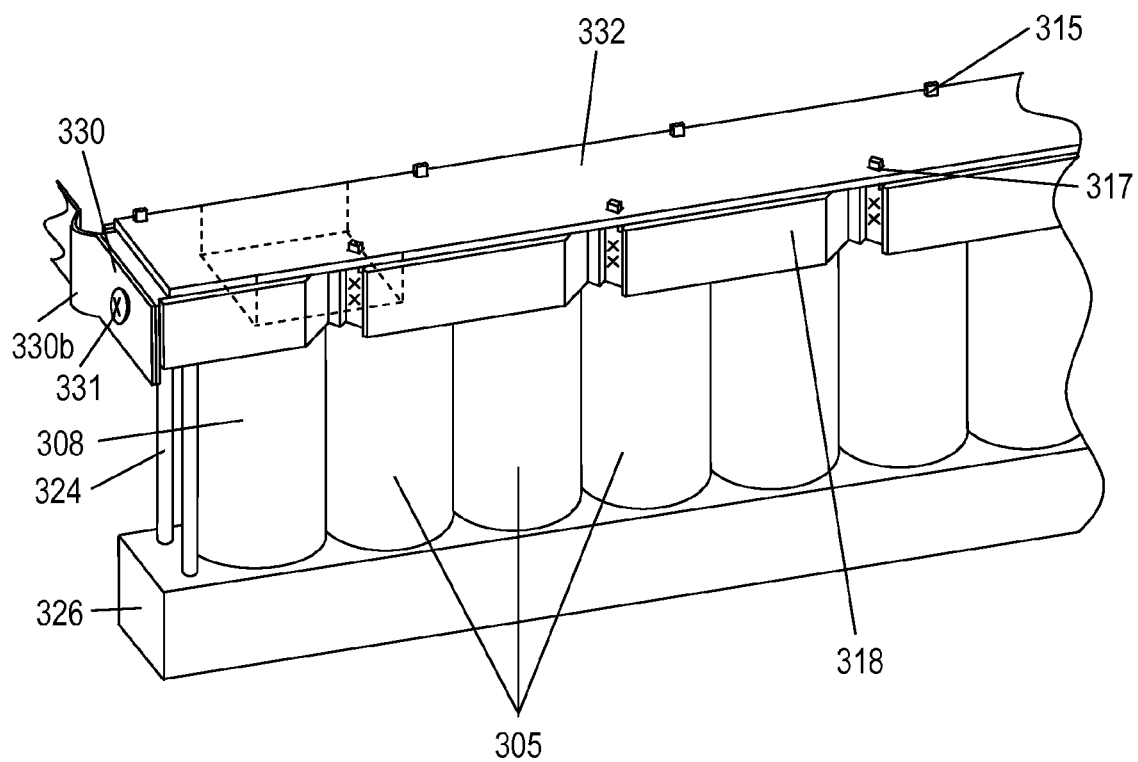
FIG. 22 is a completed perspective view of the capacitor unit according to the sixth embodiment of the present invention.

FIG. 21 is a partially assembled perspective view of the capacitor unit according to the sixth embodiment of the present invention. FIG. 22 is a completed perspective view of the capacitor unit according to the sixth embodiment of the present invention. In FIGS. 21 and 22, side surface conductive portion 316 is connected with side surface portion 308 by laser welding the position of mark X. Monitor terminal portion 317 and bus bar conductive portion 315 are inserted to monitor terminal portion connection hole 334 and bus bar connection hole 333, respectively, and first end face electrode 306 and side surface portion 308 are electrically connected with circuit substrate 332. When monitor terminal portion 317 and bus bar conductive portion 315 are soldered to monitor terminal portion connection hole 334 and bus bar connection hole 333, respectively, the capacitor unit shown in FIG. 22 is completed.

Figure 23:
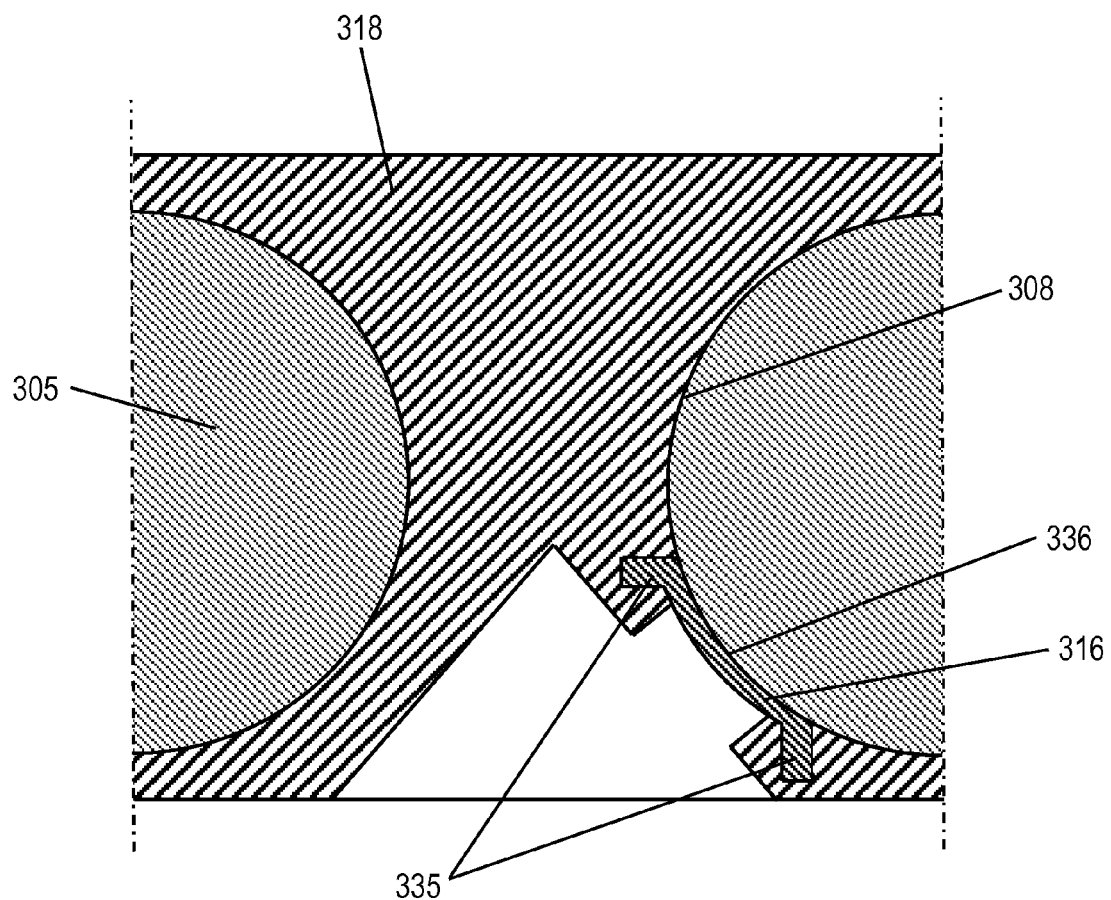
FIG. 23 is a partial cross-sectional view of the capacitor unit according to the sixth embodiment of the present invention.

FIG. 23 is a partial cross-sectional view of the capacitor unit according to the sixth embodiment of the present invention. The cross-sectional view of the square portion shown with a broken line in FIG. 22 is shown in FIG. 23. In FIG. 23, both left and right ends 335 of side surface conductive portion 316 are bent in a direction opposite to contacting surface 336 with side surface portion 308. Contacting surface 336 of side surface conductive portion 316 has a circular arc shape. In the sixth embodiment, side surface conductive portion 316 and side surface portion 308 are connected by laser welding. However, instead of performing the welding, a microscopic protruding rib may be arranged on contacting surface 336, and side surface conductive portion 316 and side surface portion 308 of capacitor 305 may be electrically connected by inserting capacitor 305 to first fixing case 318 while squashing the rib. In such configuration as well, the connection of side surface conductive portion 316 and side surface portion 308 is ensured.

The effects of the sixth embodiment will be described below.

According to the sixth embodiment, similar to the fifth embodiment, side surface portion 308 and first end face electrode 306 are electrically connected with circuit substrate 332, and the voltage value of each capacitor 305 is controlled with only circuit substrate 332 arranged at the upper part of first fixing case 318. As a result, the capacitor unit can be miniaturized and made lighter.

Side surface conductive portion 316 is integrally formed with first fixing case 318 by insert molding, and is strongly fixed. As a result, the possibility of the connection of side surface conductive portion 316 and first fixing case 318 breaking such as when the vibration is transmitted to the capacitor unit when the capacitor unit is mounted on the vehicle can be reduced.

Furthermore, both left and right ends 335 of the buried portion in first fixing case 318 of side surface conductive portion 316 has a bent configuration. Thus, compared to when side surface conductive portion 316 has a flat configuration, the contacting area of side surface conductive portion 316 and first fixing case 317 increases. Therefore, side surface conductive portion 316 and first fixing case 318 are more reliably connected. Both left and right ends 335 may have a curved configuration. In such configuration as well, the contacting area with first fixing case 318 increases, and similar effects are obtained.

Seventh Embodiment

The configuration of a capacitor unit according to a seventh embodiment of the present invention will be described using the drawings. In the seventh embodiment, a capacitor unit having a configuration in which capacitors each including a first end face electrode and a second end face electrode at both ends are arranged in parallel, and the first end face electrode and the second end face electrode of the adjacent capacitors are connected by a bus bar arranged along the length direction of the capacitor will be described.

Figure 24:
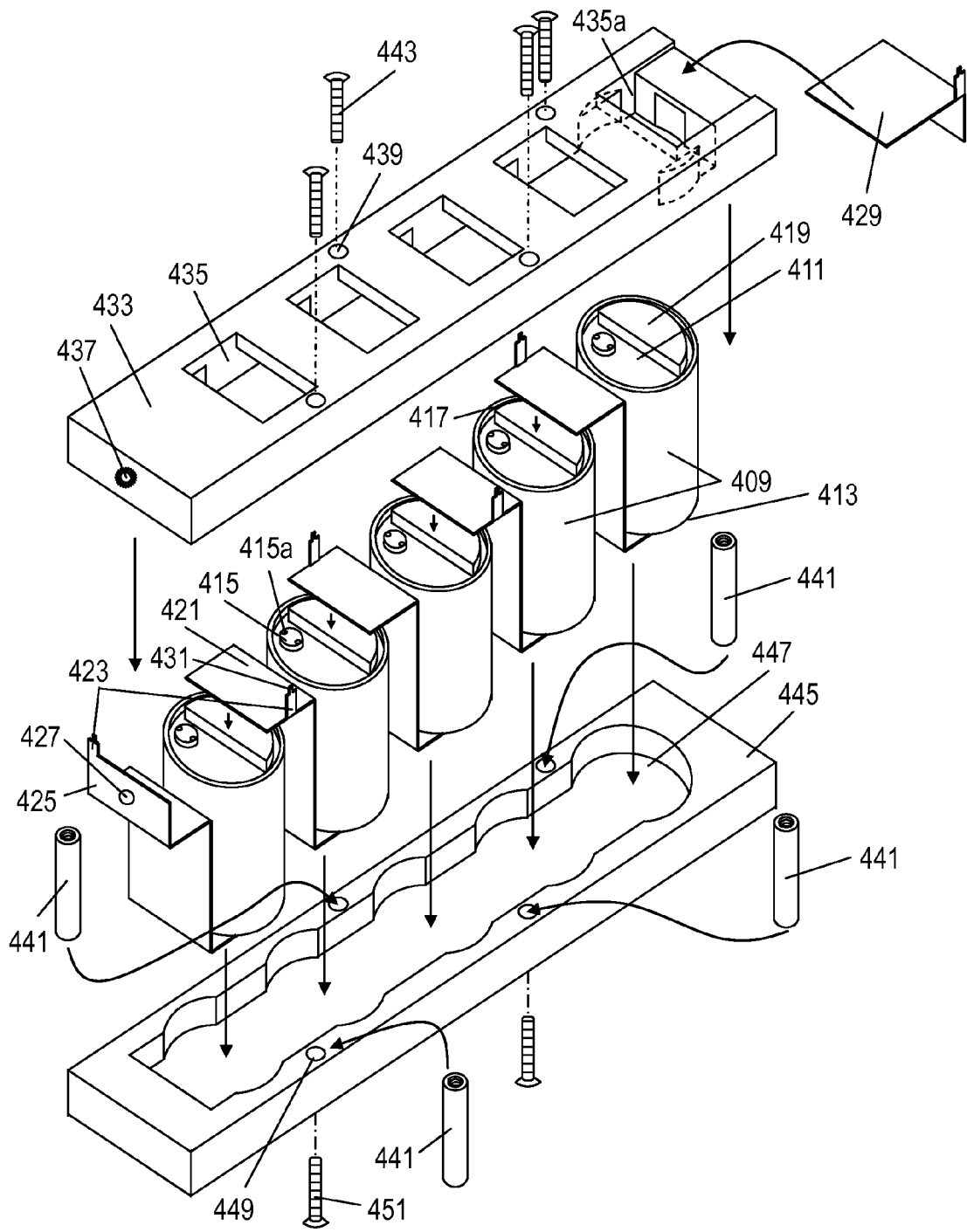
FIG. 24 is an exploded perspective view of the capacitor unit according to the seventh embodiment.

FIG. 24 is an exploded perspective view of the capacitor unit according to the seventh embodiment. In FIG. 24, plural capacitors 409 installed in a parallel and vertical state with respect to each other are electrical dual-layer capacitor of circular column shape having a diameter of 3 cm, and accumulates electricity. Each capacitor 409 includes first end face electrode 411 at the upper end face, and includes second end face electrode 413 having a polarity different from first end face electrode 411 at the lower end face. In the seventh embodiment, first end face electrode 411 of each capacitor 409 is positive pole, and second end face electrode 413 is negative pole.

First end face electrode 411 is caulked by way of an insulation member (not shown) with the side surface portion of capacitor 409 to interiorly seal capacitor 409. Furthermore, first end face electrode 411 is arranged with pressure adjustment valve 415, and semicircular projection 419 having first end face electrode 411 partially projected out than end face peripheral portion 417.

When the electrolyte in capacitor 409 is vaporized, pressure adjustment valve 415 discharges the vaporized electrolyte from discharge hole 415a formed on the outer surface of pressure adjustment valve 415, and prevents increase in pressure of capacitor 409. Pressure adjustment valve 415 is arranged at the upper end face of capacitor 409, and thus the possibility the electrolyte in capacitor 409 leaks to the outside is small. Both end faces and the side face of capacitor 409 used in the seventh embodiment are made of aluminum.

Bus bar 421 has a crank shape, and electrically connects first end face electrode 411 and second end face electrode 413 of adjacent capacitors 409. In the connection of bus bar 421 and first end face electrode 411, bus bar 421 is contacted with semicircular projection 419 projecting one part of first end face electrode 411. In the seventh embodiment, bus bar 421 has a crank shape, but is not limited thereto, and may be any shape as long as first end face electrode 411 and second end face electrode 413 can be connected. Conductive portion 423 of projecting shape, to be hereinafter described, is integrally formed at the upper part of bus bar 421.

Crank-shaped end bus bar 425 is connected with second side face electrode 413 of capacitor 409 positioned at nearest side. Screw hole 427 is formed to electrically connect with the external wiring. The connection with the external wiring will be hereinafter described. Conductive portion 423 is arranged at the upper part of crank-shaped end bus bar 425, similar to bus bar 421.

L-shaped end bus bar 429 is arranged for external wiring, similar to crank-shaped end bus bar 425, and conductive portion 423 is arranged at the upper part. Although not shown, L-shaped end bus bar 429 is also formed with screw hole for connecting with the external wiring, similar to crank-shaped end bus bar 425. L-shaped end bus bar 429 is connected with projection 419 of capacitor 409 positioned at the far side.

In the seventh embodiment, bus bar 421, crank-shaped end bus bar 425, and L-shaped end bus bar 429 are made of aluminum same as the end face and the side face of capacitor 409 to enhance the weld-connection property with first end face electrode 411 and second end face electrode 413 of capacitor 409. However, metal other than aluminum may be used as long as it is the same as the end face and the side face of capacitor 409. Bus bar 421, crank-shaped end bus bar 425, and L-shaped end bus bar 429 are formed by press molding the aluminum plate.

Conductive portion 423 is integrally formed in a projecting shape at the upper part of bus bar 421, crank-shaped end bus bar 425, and L-shaped end bus bar 429. Furthermore, terminal portion 431 of projecting shape is integrally formed at the upper part of conductive portion 423. Terminal portion 431 is performed with tin plating to connect with circuit substrate 453 of FIG. 27, to be hereinafter described, by soldering. Circuit substrate 453 can detect the voltage value at bus bar 421, crank-shaped end bus bar 425, and L-shaped end bus bar 429 by connecting terminal portion 431 and circuit substrate 453.

First fixing case 433 is made of resin, and inserted and fixed with the upper part of capacitor 409. Conductive portion 423 and one part of bus bar 421 are exposed from bus bar opening 435 formed in first fixing case 433. L-shaped bus bar 429 is arranged at the upper part of first fixing case 433, and connected with projection 419 exposed from end opening 435a. Insert nut 437 is buried at a left end of first fixing case 433, where crank-shaped end bus bar 425 and external bus bar 455 are electrically and mechanically connected by insert nut 437 (see FIG. 27). Upper fixation screw hole 439 is formed in first fixing case 433. Fixing rod 441 and first fixing case 433 are fixed by arranging fixing rod 441 at a position of upper fixation screw hole 439, and fastening upper fixation screw 443 from above.

Second fixing case 445 is also made of resin, similar to first fixing case 433. Second fixing case 445 is formed with holding hole 447, where the lower part of capacitor 409 and bus bar 421 are inserted to and fixed in holding hole 447. In this case, bus bar 421 needs to cover first end face electrode 411 capacitor 409, and thus capacitor 409 is sequentially inserted from the near side towards the far side. According to such task, end face electrode 411 is connected with second end face electrode 413 of adjacent capacitor 409 by bus bar 421. Furthermore, lower fixation screw hole 449 is formed in second fixing case 445. Fixing rod 441 and second fixing case 445 are fixed by fastening lower fixation screw 451 to fixing rod 441 arranged at the position of lower fixation screw hole 449.

Figure 25:
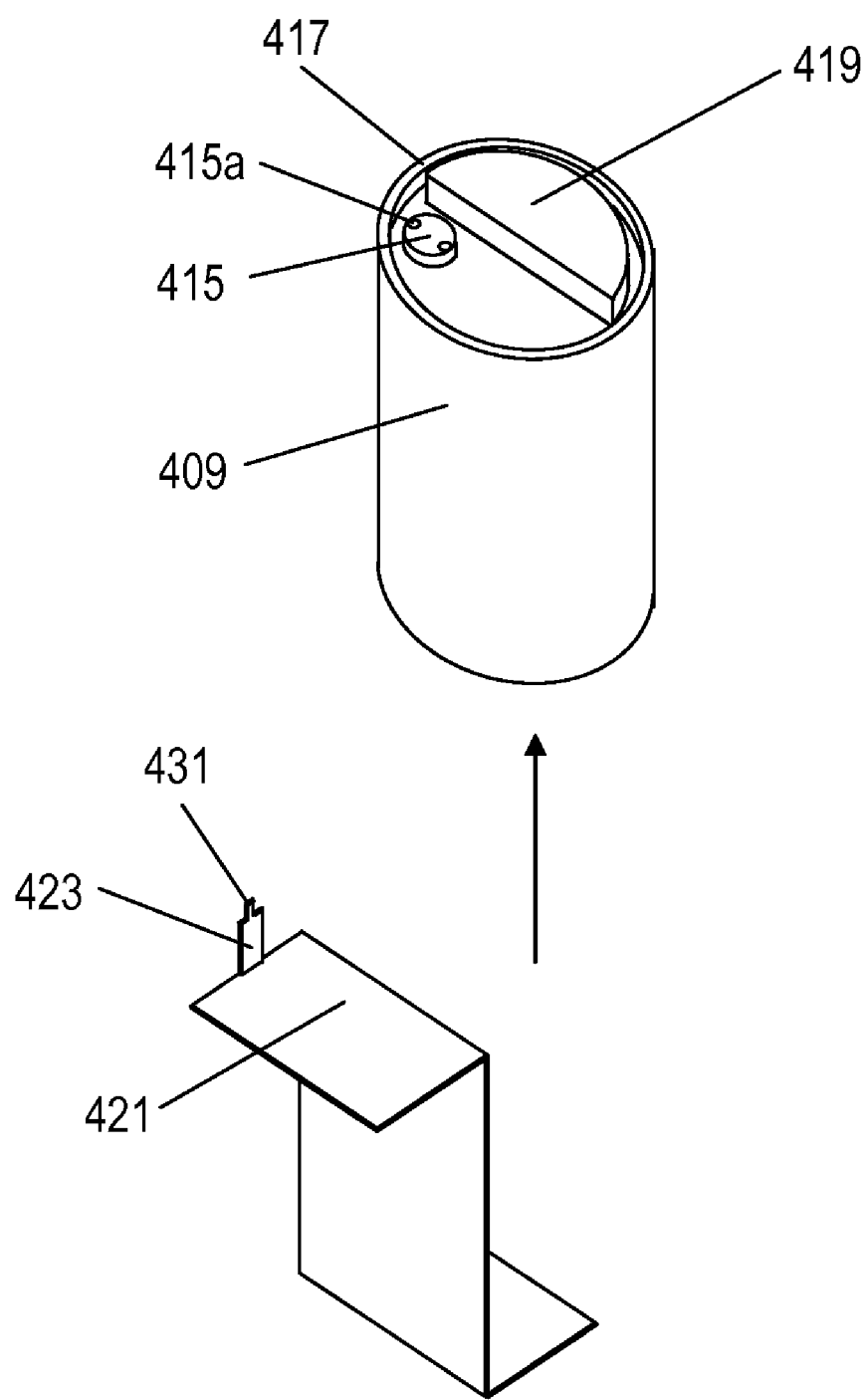
FIG. 25 is a perspective view showing the welding of the capacitor and the bus bar according to the seventh embodiment of the present invention.

FIG. 25 is a perspective view showing the welding of the capacitor and the bus bar according to the seventh embodiment of the present invention. In FIG. 25, when the lower part of capacitor 409 and bus bar 421 are inserted to second fixing case 445, second end face electrode 413 and bus bar 421 of capacitor 409 are connected in advance. The connection of second end face electrode 413 and bus bar 421 is carried out by contacting bus bar 421 with second end face electrode 413 from the direction of arrow, and then welding the same. Capacitor 409 in which second end face 413 and bus bar 421 are welded is then inserted to second fixing case 445.

Figure 26:
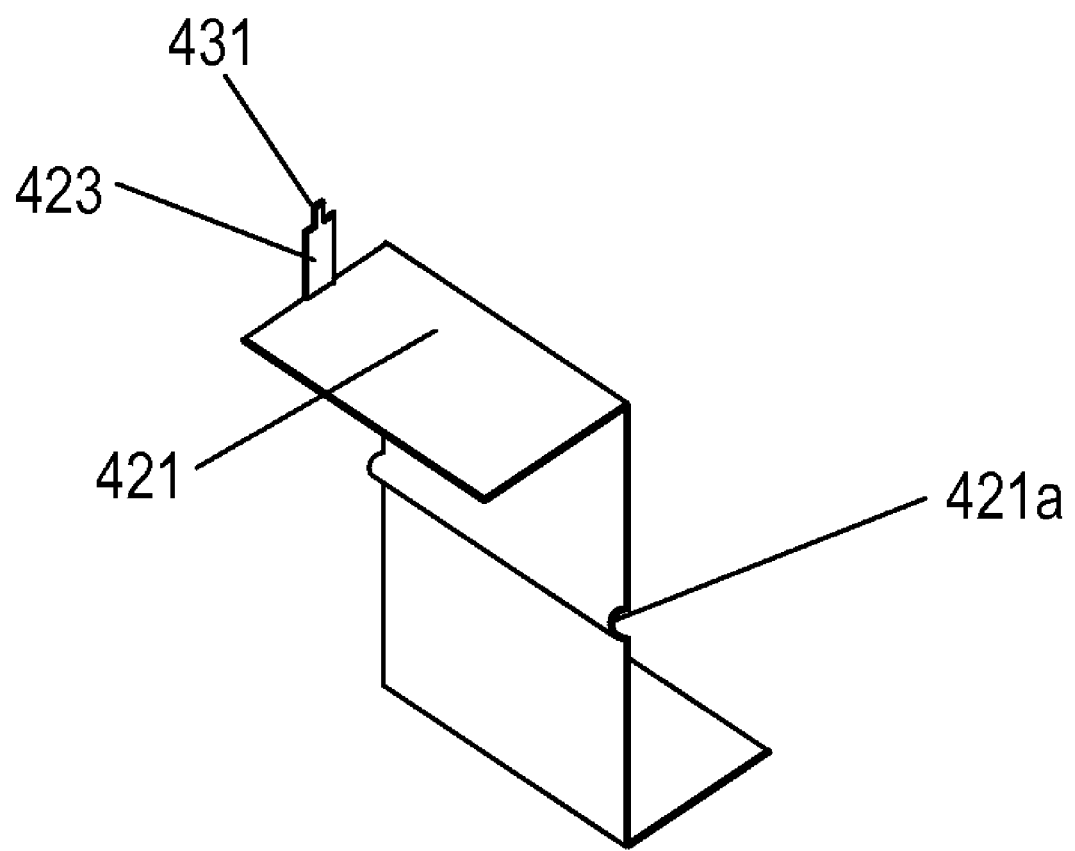
FIG. 26 is a perspective view of the bus bar of another shape according to the seventh embodiment of the present invention.

FIG. 26 is a perspective view of the bus bar of another shape according to the seventh embodiment of the present invention. In FIG. 26, bus bar 421 may be formed with bending portion 421a. Bending portion 421a arranged near the center part of bus bar 421 absorbs stress generated at bus bar 421 by vibration and heat. Therefore, the possibility bus bar 421 may break can be reduced.

Figure 27:
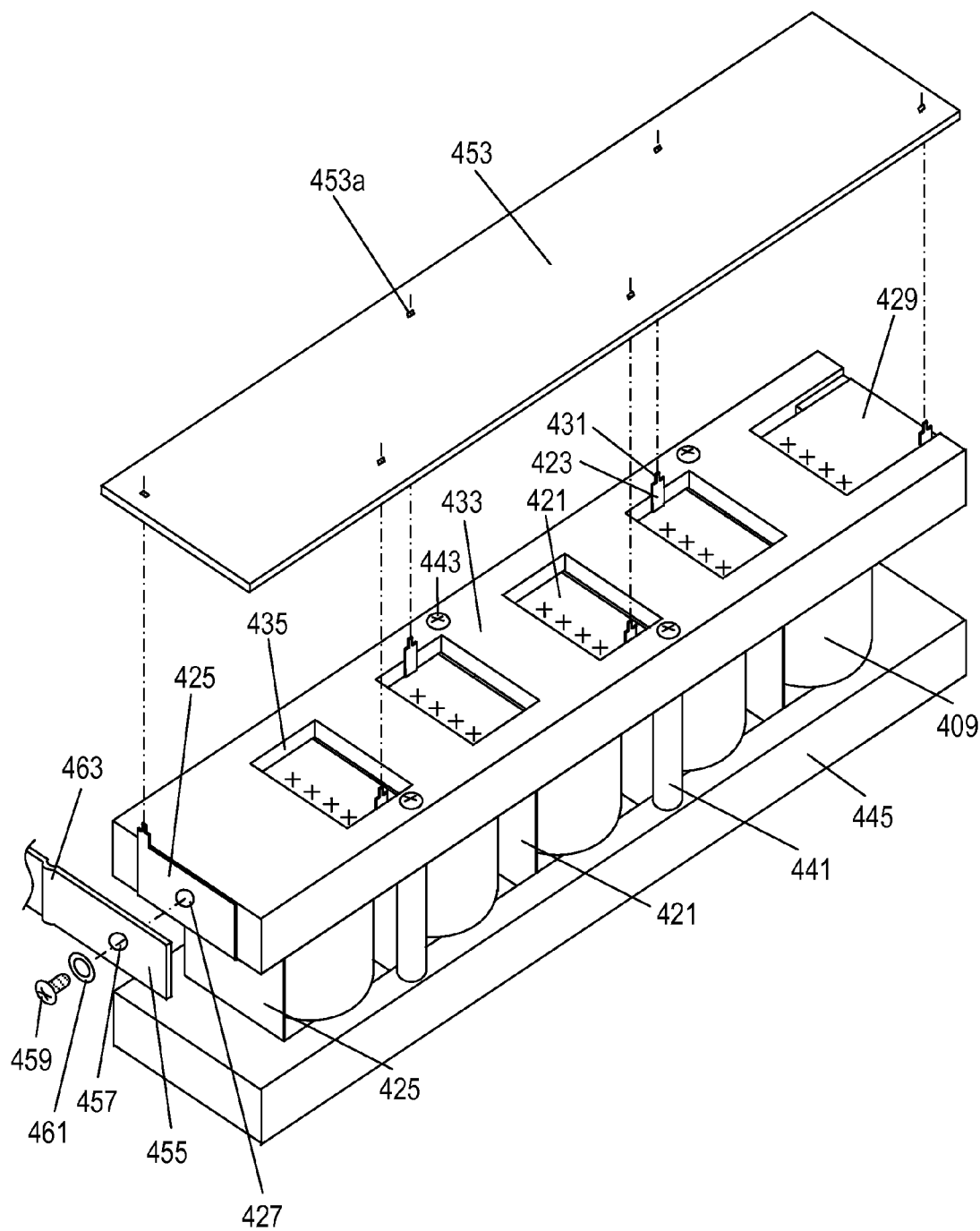
FIG. 27 is a partially assembled perspective view of the capacitor unit according to the seventh embodiment of the present invention.

FIG. 27 is a partially assembled perspective view of the capacitor unit according to the seventh embodiment of the present invention. In FIG. 27, first fixing case 433 and second fixing case 445 are connected by fixing rod 441, and capacitor 409 is securely fixed by being sandwiched by first fixing case 433 and second fixing case 445. Bus bar 421 and L-shaped bus bar 429 are securely connected with projection 419 by laser welding the portion of mark X. In FIG. 27, great number of points is welded in spot form, but may be linearly welded by sequentially shifting the welding position. This allows stronger connection compared to welding in spot form. Conductive portion 423 arranged in bus bar 421, L-shaped end bus bar 429, and crank-shaped end bus bar 425 is connected by inserting terminal portion 431 to connection hole 453a formed in circuit substrate 453, and thus is exposed from bus bar opening 435.

Circuit substrate 453 includes a voltage balance circuit (not shown). The voltage value of each capacitor 409 can be measured and controlled by electrically connecting circuit substrate 453, and bus bar 421, L-shaped end bus bar 429, and crank-shaped end bus bar 425.

Screw hole 427 formed in crank-shaped end bus bar 425 is fastened and fixed to insert nut 437 with screw 459 along with external bus bar screw hole 457 formed in external bus bar 455 for wiring with the outside. In this case, screw 459 is fastened through washer 461. External bus bar bending portion 463 is arranged at external bus bar 455, where external bus bar bending portion 463 absorbs stress generated by vibration and heat thereby reducing the possibility of breakage of external bus bar 455.

Figure 28:
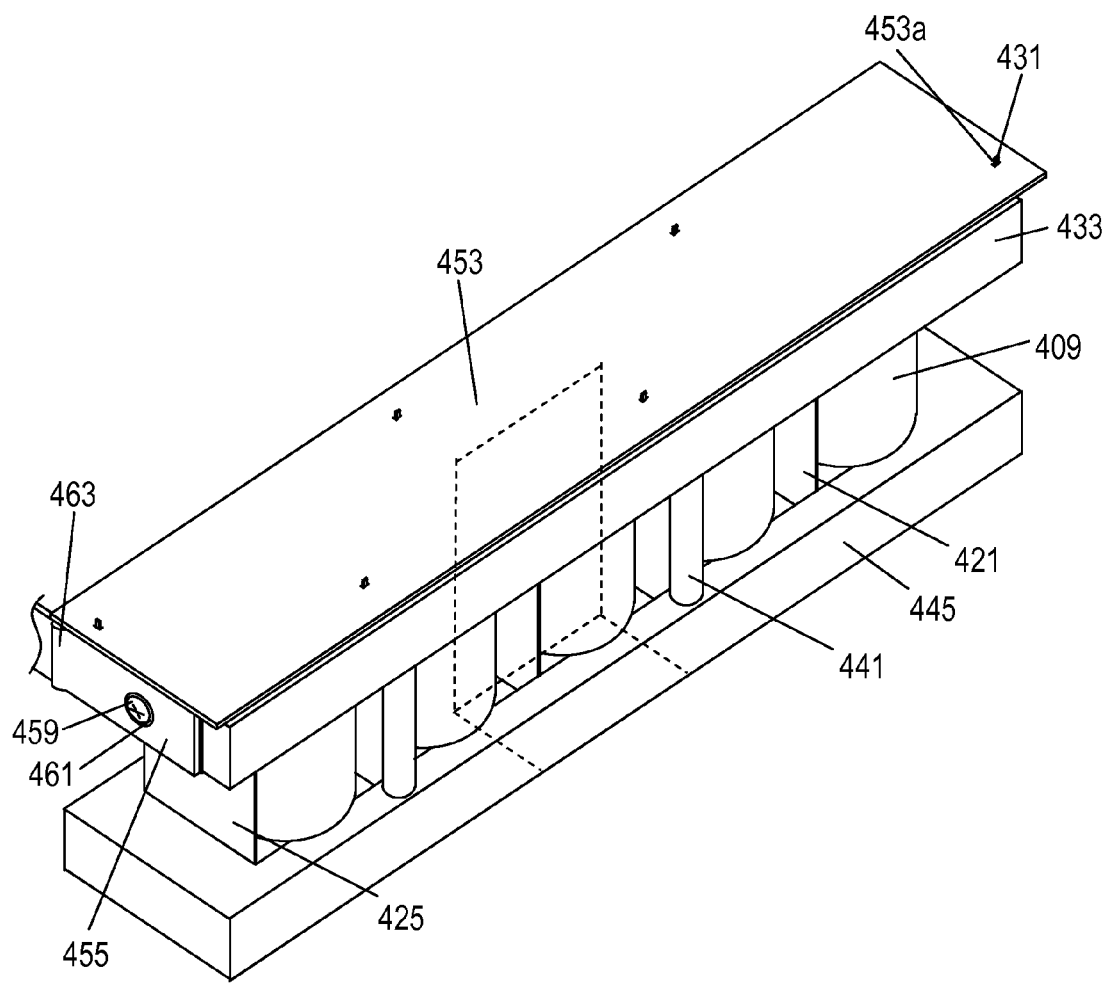
FIG. 28 is a completed perspective view of the capacitor unit according to the seventh embodiment of the present invention.

FIG. 28 is a completed perspective view of the capacitor unit according to the seventh embodiment of the present invention. In FIG. 28, circuit substrate 453 is installed at the upper part of first fixing case 433, terminal portion 431 arranged on bus bar 421, L-shaped end bus bar 429, and crank-shaped end bus bar 425 is inserted to connection hole 453a and connected by soldering. Screw 459 is inserted and fixed to external bus bar screw hole 457, and the capacitor unit is electrically connected with the external wiring by way of external bus bar 455.

Figure 29:
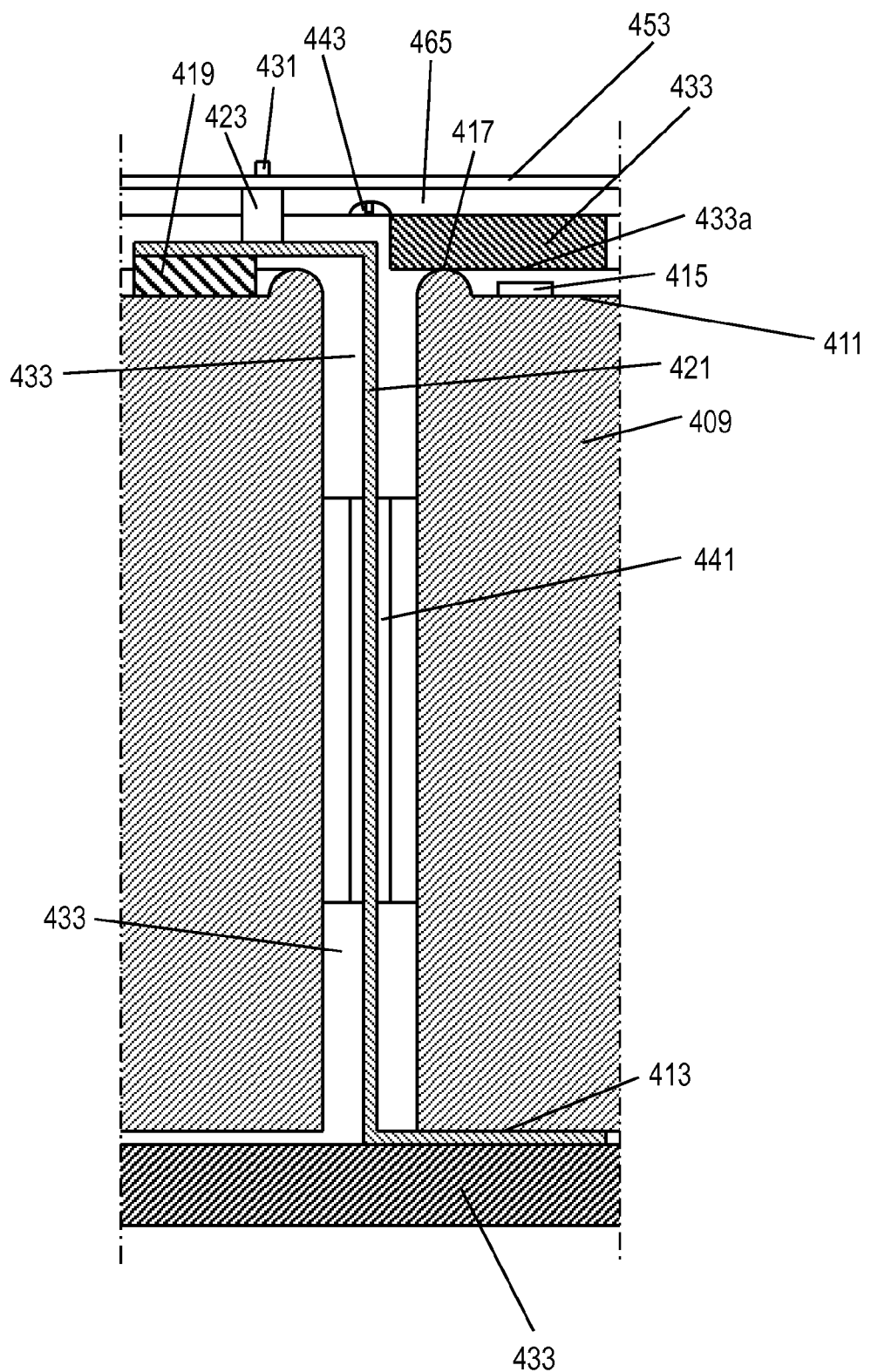
FIG. 29 is a partial cross-sectional view of the capacitor unit according to the seventh embodiment of the present invention.

FIG. 29 is a partial cross-sectional view of the capacitor unit according to the seventh embodiment of the present invention. The cross-sectional view of the square portion shown with a broken line in FIG. 28 is shown in FIG. 29. In FIG. 29, projection 419 is formed such that the height is higher than end face peripheral portion 417, and thus bus bar 421 does not contact end face peripheral portion 417 and not short-circuit. Furthermore, bus bar 421 is arranged through a void with the side face of capacitor 409 so that bus bar 421 does not contact the side surface of capacitor 409, and thus the possibility of short-circuit is reduced even with the configuration in which capacitor 409 includes an electrode at the side surface.

Pressure adjustment valve 415 is faced to and covered by cover portion 433a of one part of first fixing case 433, and thus is configured at a distance from circuit substrate 453 and bus bar 421 by cover portion 433a. Pressure adjustment valve 415 is formed lower than end face peripheral portion 417, and a void exists between pressure adjustment valve 415 and first fixing case 433 arranged at the upper part. Therefore, discharge hole 415a of FIG. 24 is not blocked, and the vaporized electrolyte is normally discharged from discharge hole 415a.

Terminal portion 431 has a shape projecting out from conductive portion 423, and the diameter of connection hole 453a of FIG. 27 is substantially the same size as terminal portion 431, and thus circuit substrate 453 is not inserted to the lower part than terminal portion 431. Thus, void 465 exists between circuit substrate 453 and first fixing case 433 by the amount of projection of conductive portion 423 from first fixing case 433. Since the height of the screw head of upper fixation screw 443 is lower than the height of void 465, the possibility the screw head of upper fixation screw 443 contacts circuit substrate 453 is small.

The effects of the capacitor unit according to the seventh embodiment of the present invention will be described below.

First, the capacitor unit can be miniaturized and made lighter in the seventh embodiment.

As shown in FIG. 24, plural adjacent capacitors 409 are arranged in parallel such that the end face electrode has the same polarity, and first end face electrode 411 and second end face electrode 413 of adjacent capacitors 409 of plural capacitors 409 arranged in parallel are connected by crank-shaped bus bar 421.

According to such configuration, conductive portion 423 projecting out in the arrangement direction of circuit substrate 453 can be arranged at bus bar 421 for connecting each capacitor 409, and each bus bar 421 can be connected to one circuit substrate 453 through conductive portion 423. In this case, the voltage value of bus bar 421 detected by a voltage circuit arranged in circuit substrate 453 is substantially the same as the voltage value of end face electrode connected with respective bus bar 421. As a result, the voltage value at both ends of each capacitor 409 can be measured and controlled with one circuit substrate 453, and the capacitor unit can be miniaturized and made lighter.

As shown in FIG. 26, bending portion 421a may be arranged on bus bar 421. Thus the stress generated in bus bar 421 by heat and vibration is absorbed by bending portion 421a, and the possibility of causing breakage in bus bar 421 can be reduced. In particular, when the capacitor unit is mounted on the vehicle, vibration resistance property is demanded on the capacitor unit since strong vibration has a possibility of being transmitted thereto. Therefore, the present configuration is useful as the vehicle capacitor unit.

As shown in FIG. 29, pressure adjustment valve 415 is configured to be at a distance from circuit substrate 453 and bus bar 421 by facing cover portion 433a. According to such configuration, even if the vaporized electrolyte is discharged from discharge hole 415a in FIG. 24, the vaporized electrolyte does not attach to circuit substrate 453 and bus bar 421 and the corrosion possibility thereof can be reduced. Therefore, high reliability of the capacitor unit can be obtained.

Capacitor 409 may be parallel and horizontally disposed, and pressure adjustment valve 415 may be arranged on the upper side than the center of first end face electrode 411 of capacitor 409. Even if the capacitor unit is arranged in the horizontal direction, the voltage value of each capacitor 409 can be measured with circuit substrate 453 arranged only on first end face electrode 411 side of capacitor 409 by using the configuration of the present invention, and the capacitor unit can be miniaturized and made lighter. Furthermore, in the present configuration, even if circuit substrate 453 is arranged on second end face electrode 413 side, the possibility of damage of the circuit substrate 453 is reduced without circuit substrate 453 being subjected to the influence of the weight of capacitor 409 since capacitor unit is arranged laid in the horizontal direction. Furthermore, as pressure adjustment valve 415 is arranged on the upper side than the center of first end face electrode 411 of capacitor 409, the possibility of the electrolyte leaking out from discharge hole 415a can be reduced. Moreover, the capacitor unit mounted on the vehicle is often mounted under the floor, and thus is demanded lower height, where the present configuration is suitable for the vehicle capacitor unit if the entire height is lowered with capacitor unit parallel and horizontally disposed.

Capacitor 409 of circular column shape is adopted in the seventh embodiment, but the present invention is not limited thereto, and the capacitor of square column shape or other shapes may be adopted.

Eighth Embodiment

The configuration of a capacitor unit according to an eighth embodiment of the present invention will be described below using the drawings. In the eighth embodiment, the capacitor unit having a configuration of absorbing and holding the height error of the power accumulating element will be described.

Figure 30:
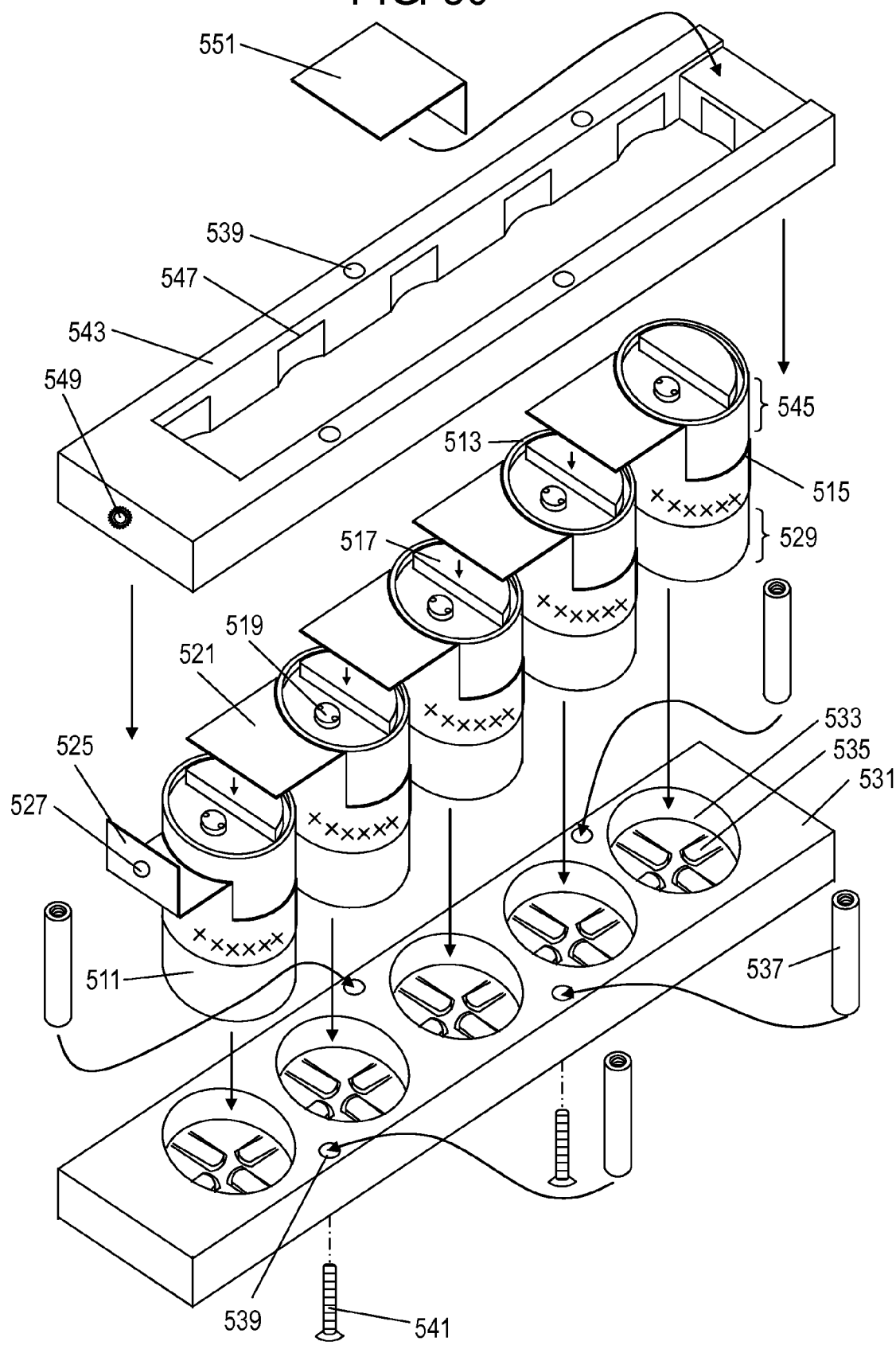
FIG. 30 is a partially exploded perspective view of a capacitor unit according to an eighth embodiment of the present invention.

FIG. 30 is a partially exploded perspective view of the capacitor unit according to the eighth embodiment of the present invention. In FIG. 30, power accumulating element 511 for accumulating power is an electrical dual-layer capacitor of circular column shape having a diameter of 3 cm. The manufacturing method of power accumulating element 511 is similar to a general cylindrical battery. Therefore, one end face (upper surface in FIG. 30) of power accumulating element 511 is formed with end face peripheral portion 513 raised by caulking step. The circular column side surface of power accumulating element 511 is made of aluminum, and is connected with the interior to be a negative pole. Therefore, the entire circular column side surface of power accumulating element 511 forms side face electrode 515. The end face is a lid made of aluminum, and is press molded to form semicircular end face electrode 517 higher than end face peripheral portion 513. End face electrode 517 is connected with the interior to be a positive pole. Thus, an insulation member (not shown) is arranged between the circular column portion and the lid portion of power accumulating element 511 and then caulked. Pressure adjustment valve 519 is arranged at a position other than end face electrode 517 of the lid portion. Pressure adjustment valve 519 is provided to escape the electrolyte when the electrolyte filled inside power accumulating element 511 is vaporized. The rise in internal pressure of power accumulating element 511 thus can be prevented.

Bus bar 521 used in electrically and mechanically connecting plural aligned power accumulating elements 511 to each other will now be described. Bus bar 521 is made of aluminum same as side face electrode 515 and end face electrode 517. Other metals may be used as long as the metal is the same, but since the internal electrode of the electrical dual-layer capacitor is made of aluminum, they are made of aluminum for weld-connecting the internal electrode to side face electrode 515 and end face electrode 517. Therefore, as welding is carried out in joining bus bar 521 to side face electrode 515 and end face electrode 517, bus bar 521 is also made of aluminum, Through the use of the same metal, the welding property can be enhanced, and the corrosion resistance property can be enhanced as local battery does not form from humidity.

Figure 31:
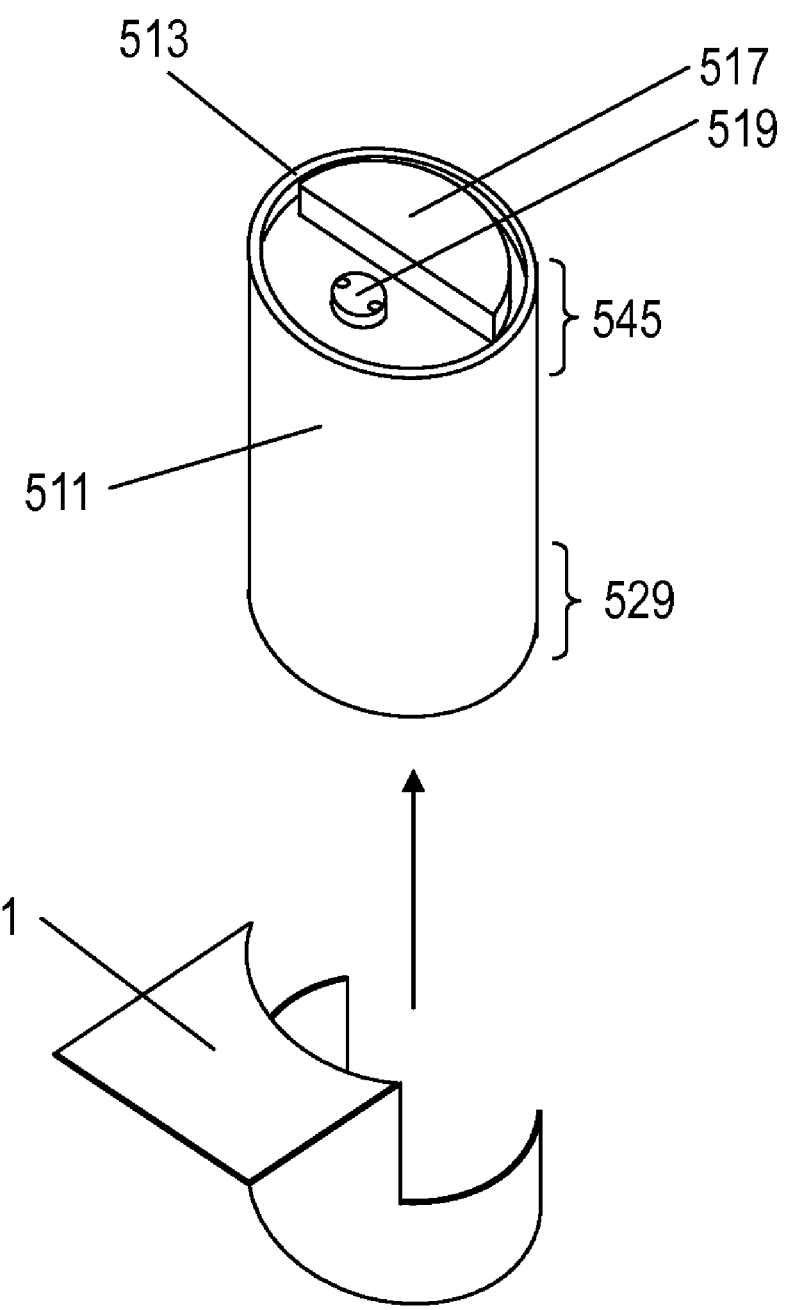
FIG. 31 is a perspective view of the power accumulating element and the bus bar of the capacitor unit according to the eighth embodiment of the present invention.

FIG. 31 is a perspective view of the power accumulating element and the bus bar of the capacitor unit according to the eighth embodiment of the present invention. In FIG. 31, bus bar 521 includes a circumferential portion to be fitted to the side surface of power accumulating element 511 and a flat portion to be weld-connected to end face electrode 517 of adjacent power accumulating element 511. These are obtained by press molding an aluminum plate having a plate thickness of 0.5 mm.

Figure 32:
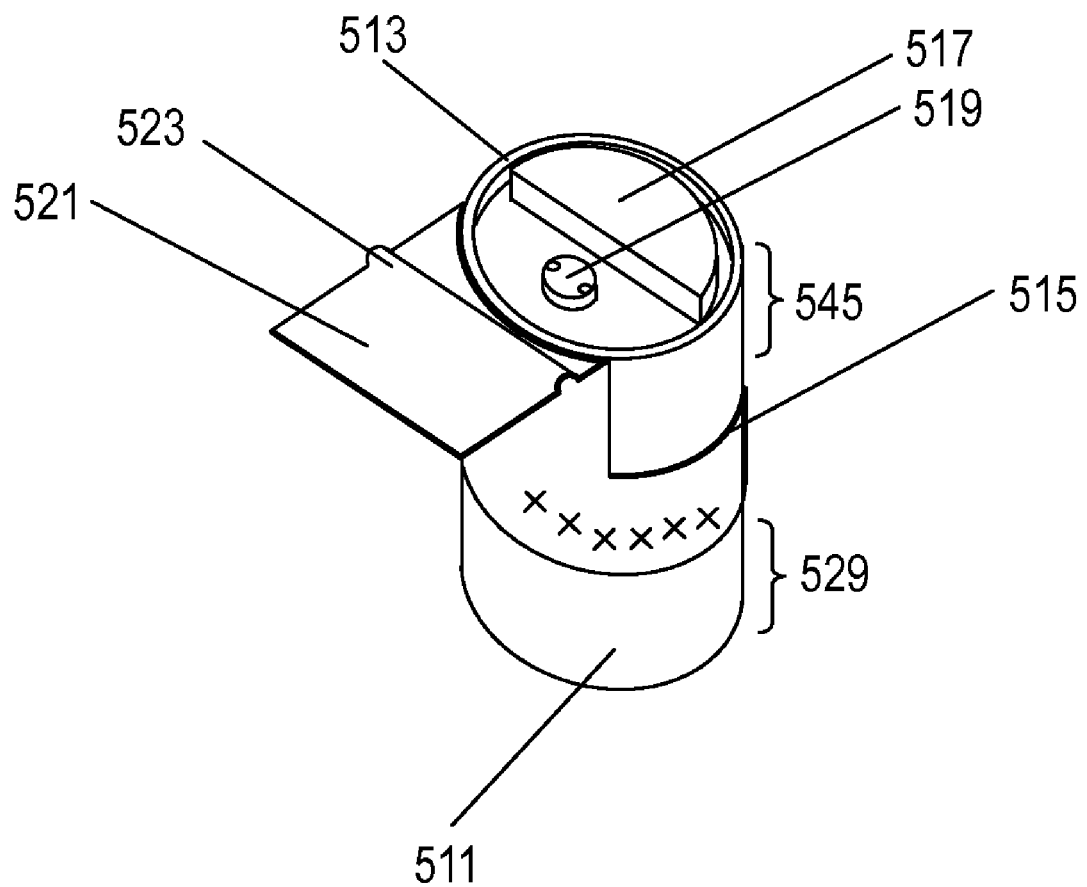
FIG. 32 is a perspective view of a state in which the bus bar with bending portion of the capacitor unit is attached to the power accumulating element according to the eighth embodiment of the present invention.

FIG. 32 is a perspective view of a state in which the bus bar with bending portion of the capacitor unit is attached to the power accumulating element according to the eighth embodiment of the present invention. In FIG. 32, the shape of bus bar 521 may be such that bending portion 523 is provided between the portion (flat portion) to be connected to end face electrode 517 and the portion (circumferential portion) to be connected to side face electrode 515. Bending portion 523 is easily processed if provided on the flat portion side. The role of bending portion 523 will be hereinafter described.

Bus bar 521 is fitted to the side surface of power accumulating element 511, and is connected by laser welding to obtain reliable electrical and mechanical connecting with side face electrode 515. The laser welding site is shown with mark X in FIG. 30. In FIG. 30, great number of points are welded in spot-form, but may be linearly weld-connected by sequentially shifting the welding position. The connection reliability enhances in this case compared to when welded in spot-form. Power accumulating element 511 integrated with bus bar 521 is thereby formed.

Bus bar 521 is connected to one of power accumulating elements 511 other than power accumulating element 511 having side face electrode 515 that becomes the highest voltage value or the lowest voltage value of plurality of power accumulating elements 511. In other words, in the eighth embodiment, five power accumulating elements 511 are connected in series as shown in FIG. 30, where side face electrode 515 is negative pole and end face electrode 517 is positive pole. Therefore, when five power accumulating elements 511 are connected in series, side face electrode 515 of power accumulating element 511 on the nearest side of FIG. 30 has the lowest voltage value. Bus bar 521 is connected to other four power accumulating elements 511 excluding power accumulating element 511 on the nearest side. When the internal connection of power accumulating element 511 is reversed, side face electrode 515 of power accumulating element 511 on the nearest side will have the highest voltage value. In this case as well, the structure of the capacitor is the same and the positive pole and the negative pole are simply reversed.

Negative pole terminal bus bar 525 is connected to power accumulating element 511 on the nearest side in place of bus bar 521. The configuration of negative pole terminal bus bar 525 is substantially the same as bus bar 521, but the portion to connect to end face electrode 517 is unnecessary as adjacent power accumulating element 511 does not exist. However, screw hole 527 for connecting with a power line and external bus bar 553 (see FIG. 33) is formed in negative pole bus bar 525 to electrically connect with the exterior of the capacitor unit. To facilitate the connection with the power line and external bus bar 553, bending process is performed to fit to the end of upper case 543. The relevant portion is not limited to the structure of FIG. 30, and may be appropriately changed according to the shape of the capacitor unit, the drawing of the power line, and the like. The connection of side face electrode 515 of power accumulating element 511 on the nearest side and negative pole terminal bus bar 525 is carried out by welding through the same method as when connecting bus bar 521 to other power accumulating elements 511.

Bottom part 529 of power accumulating element 511 weld-connected with bus bar 521 or negative pole terminal bus bar 525 is inserted to holding hole 533 formed in lower case 531. Lower case 531 is made of resin, and elastic portion 535 is integrally formed at the bottom surface of holding hole 533. The diameter of holding hole 533 is made larger by about 0.1 to 0.2 mm than the outer diameter of power accumulating element 511 to that power accumulating element 511 can be smoothly accommodated.

As shown in FIG. 30, elastic portion 535 has a cantilever shape, which distal end is formed to be at a position higher than the bottom surface of holding hole 533. Therefore, when bottom part 529 of power accumulating element 511 contacts elastic portion 535, power accumulating element 511 is pushed upward. The height from the bottom surface of holding hole 533 at the distal end of elastic portion 535 corresponds to the displacement range of elastic portion 535. The displacement range is set to be larger than the height error of plurality of power accumulating elements 511 obtained in advance. In FIG. 30, elastic portion 535 is arranged at four locations, but may be arranged at more or less than four locations as long as the elasticity of holding power accumulating element 511 is provided. However, at least one is necessary. The shape of elastic portion 535 is also such that the distal end of the cantilever becomes higher towards the middle of the bottom surface of holding hole 533, but may be arranged in the opposite direction (becomes higher towards the periphery of the bottom surface) or may be arranged in the oblique direction or in the circumferential direction. Elastic portion 535 may be configured as a separate body from lower case 531, and the elastic material such as a spring may be arranged at the bottom surface of holding hole 533, but the elasticity of the elastic material may vary in this case. Therefore, integral formation is desirable as variation in elasticity can be reduced.

Fixing rod 537 is attached in advance to lower case 531 to securely fix with upper case 543. In the eighth embodiment, four fixing rods 537 are used. Fixing rod 537 is formed with a female screw at both ends. Fixation screw hole 539 is formed in lower case 531. Therefore, lower case 531 and fixing rod 537 are fixed by fastening fixation screw 541 with fixing rod 537 arranged at the position of fixation screw hole 539. In this case, fixation screw 541 is a countersunk screw so that the head of fixation screw 541 does not project out from lower case 531.

When inserting power accumulating element 511 to holding hole 533 of lower case 531, the flat portion of bus bar 521 needs to cover end face electrode 517 of adjacent power accumulating element 511. Therefore, power accumulating element 511 is inserted from the nearest side in order towards the far side as shown in FIG. 30. Through such task, the flat portion of bus bar 521 connected to adjacent power accumulating element 511 contacts end face electrode 517. However, bus bar 521 is not covered on end face electrode 517 of power accumulating element 511 on the farthest side in FIG. 30 as adjacent power accumulating element 511 does not exist. Positive pole terminal bus bar 551 is connected.

After inserting power accumulating element 511 to lower case 531, upper part 545 of power accumulating element 511 is inserted to upper case 543. Upper case 543 has a rectangular shape when seen from the upper surface so that bus bar 521 and pressure adjustment valve 519 are exposed. Contacting portion 547 to which end face peripheral portion 513 of power accumulating element 511 partially contacts is arranged at upper case 543. Contacting portion 547 is integrally formed to upper case 543, and thus contacting portion 547 becomes a reference of the fixed position of each power accumulating element 511. Furthermore, fixation screw hole 539 similar to in lower case 531 is formed in upper case 543 to mechanically connect with fixing rod 537. Insert nut 549 is buried at the position facing screw hole 527 of negative pole terminal bus bar 525. Since end face electrode 517 of power accumulating element 511 on the farthest side of FIG. 30 has the highest voltage value, positive pole terminal bus bar 551 for external connection is attached thereto. Positive pole terminal bus bar 551 also includes a screw hole (not shown) similar to screw hole 527 of negative pole terminal bus bar 525, and an insert nut (not shown) is also buried at the position facing the screw hole of positive pole terminal bus bar 551. Since upper case 543 is made of resin same as lower case 531, the components described above are integrally formed by injection molding.

When upper part 545 of power accumulating element 511 is inserted to upper case 543, end face peripheral portion 513 of power accumulating element 511 partially contacts contacting portion 547. However, since elastic portion 535 is in a state of pushing power accumulating element 511 upward in FIG. 30, a gap forms between upper case 543 and fixing rod 537 by such amount. Fixation screw 541 is fastened with upper case 543 pushed down so that gap is eliminated. As a result, upper case 543 and lower case 531 are connected and fixed.

Figure 33:
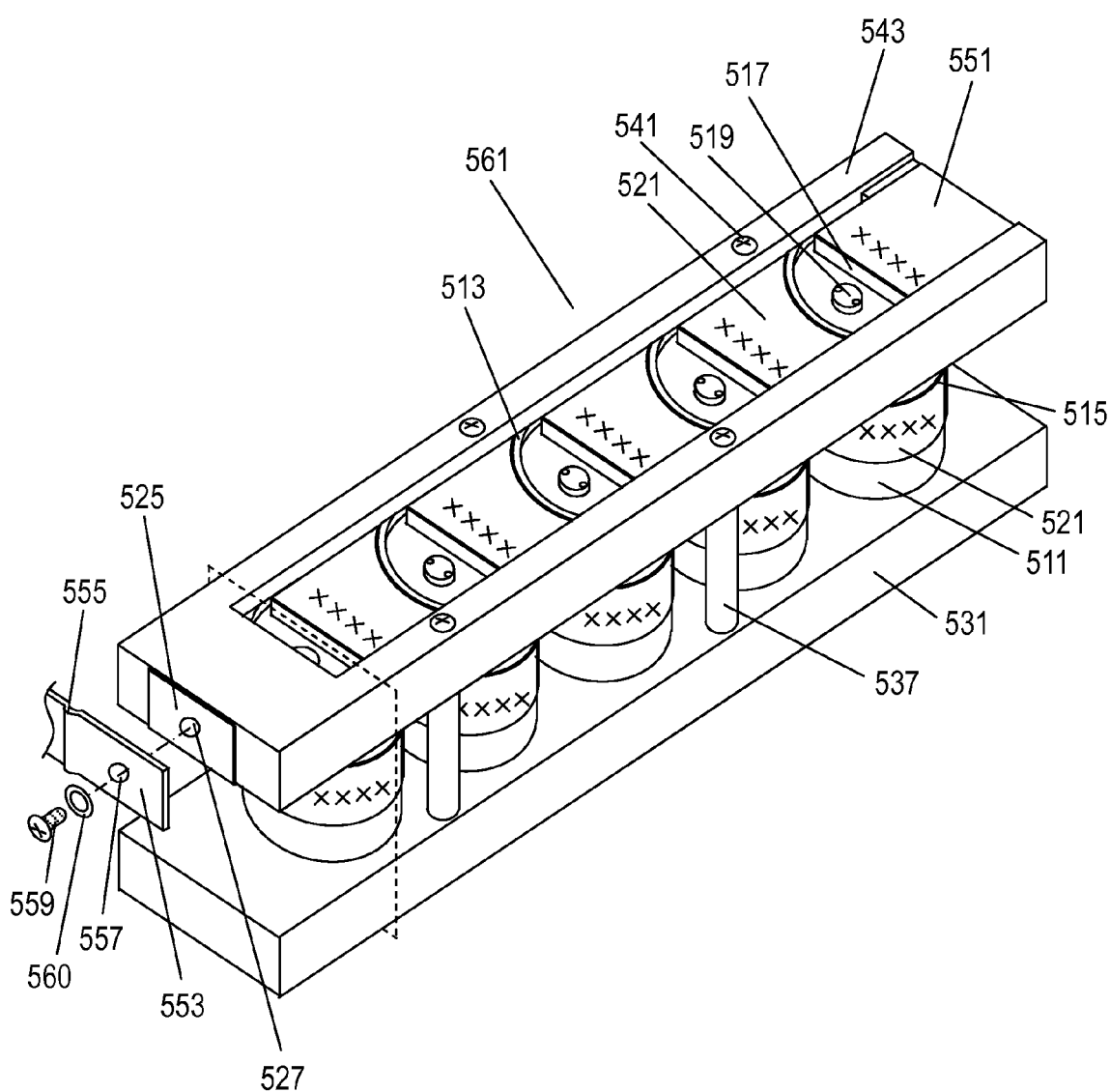
FIG. 33 is a completed perspective view of the capacitor unit according to the eighth embodiment of the present invention.

FIG. 33 is a completed perspective view of the capacitor unit according to the eighth embodiment of the present invention. In FIG. 33, bus bar 521 covers end face electrode 517 of adjacent power accumulating element 511, and thus the covered portion is electrically and mechanically connected by laser welding. In this case, bus bar 521 does not contact end face peripheral portion 513 and not short-circuit as the height of end face electrode 517 is higher than end face peripheral portion 513. The laser welded portion is shown with a mark X, where greater number of points may be welded in spot-form or may be welded linearly similar to the laser welding on side face electrode 515.

In this case, positive pole terminal bus bar 551 covers end face electrode 517 of power accumulating element 511 on the farthest side and the covered portion is laser welded and connected similar to other bus bars 521. Through such task, external wiring can be made to positive pole terminal bus bar 551. Negative pole terminal bus bar 525 has a folded portion fitted to upper case 543, and thus external wiring can also be made to negative pole terminal bus bar 525. In the eighth embodiment, external wiring is achieved with external bus bar 553. External bus bar 553 is made of copper having a thickness of 1 mm, where bending portion 555 is integrally formed at one part. Bending portion 555 absorbs stress caused by vibration, thermal expansion and the like when external bus bar 553 is fixed. Screw hole 557 for screw fixation is also formed. Therefore, external bus bar 553 is arranged such that screw hole 557 coincides with screw hole 527 of negative pole terminal bus bar 525, and screw 559 is fastened to insert nut 549 with washer 560 to electrically connect external bus bar 553 and negative pole terminal bus bar 525. Similar connection is carried out with respect to positive pole terminal bus bar 551. Although omitted in FIG. 33, the other end of external bus bar 553 is connected to another capacitor unit 561. Thus, greater number of capacitor units 561 can be connected.

Adjacent power accumulating elements 511 include a gap when inserted to upper case 543 and lower case 531. The flat portion of bus bar 521 thus becomes long by the amount of gap, and the position of bus bar 521 can be easily adjusted. As a result, when power accumulating element 511 is pushed in with contacting portion 547, the position of bus bar 521 can be easily adjusted, and thus influence of holding down other power accumulating elements 511 by bus bar 521 can be reduced and respective power accumulating element 511 can be more independently fixed. As shown in FIG. 32, the influence of holding down other power accumulating elements 511 by bus bar 521 can be further absorbed by arranging bending portion 523 on bus bar 521, as shown in FIG. 32. Bending portion 523 also has a role of absorbing stress caused by vibration, thermal expansion, and the like when bus bar 521 is fixed, similar to bending portion 555.

Figure 34:
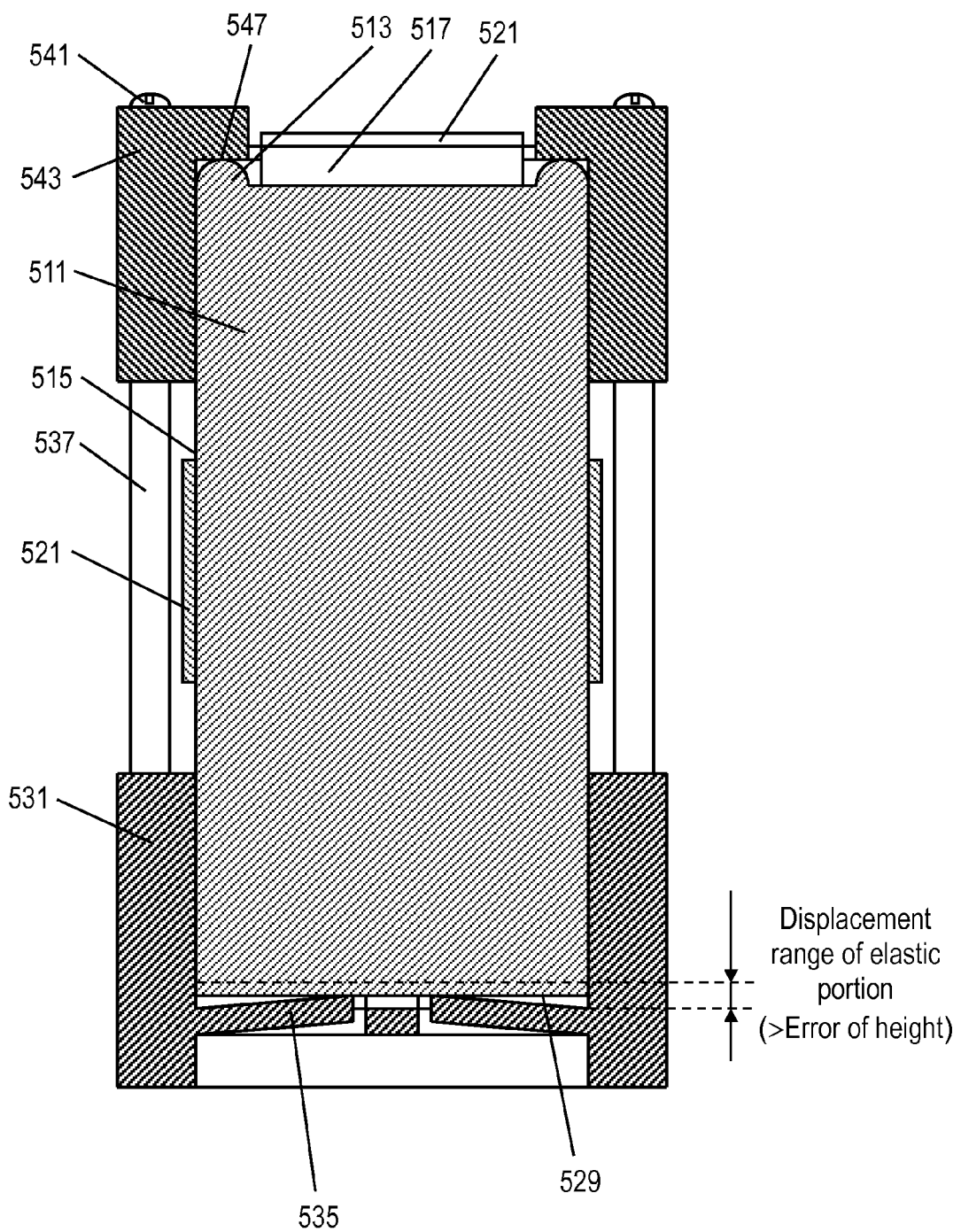
FIG. 34 is a cross-sectional view of the capacitor unit according to the eighth embodiment of the present invention.

FIG. 34 is a cross-sectional view of the capacitor unit according to the eighth embodiment of the present invention. The cross-sectional view of the portion shown with a broken line in FIG. 33 is shown in FIG. 34. In FIG. 34, power accumulating element 511 has end face peripheral portion 513 partially pushed down by contacting portion 547 when upper case 543 is fastened to fixing rod 537 with fixation screw 541. Bottom part 529 of power accumulating element 511 is fixed by pushing down elastic portion 535. The displacement range of elastic portion 535 in this case is set to be larger than the height error of power accumulating element 511. Thus, even if an error occurs in the height of power accumulating element 511, with contacting portion 547 as a reference, the error can be absorbed by when the displacement amount of elastic portion 535 changes. Therefore, all power accumulating elements 511 can be reliably fixed, vehicle vibration stress on the weld-connecting portion and bus bar 521 can be reduced, and high reliability can be obtained.

Although not shown, a terminal portion may be arranged on bus bar 521, negative pole terminal bus bar 525, and positive pole terminal bus bar 551 to electrically connect with the circuit substrate, similar to the first to the seventh embodiments, so that the capacitor unit can be miniaturized and made lighter.

According to the above configuration and operation, the capacitor unit can be miniaturized and made lighter, and furthermore, the height error of power accumulating element 511 can be absorbed by elastic portion 535, and thus stress fatigue by the heat generation of the weld-connecting portion and the fluctuation of bus bar 521 can be reduced, and the capacitor unit in which high reliability is obtained can be realized.

In the eighth embodiment, screw 559 is fastened with insert nut 549. However, a nut accommodating portion having an inner width that contacts the nut may be integrally molded at the position facing screw hole 527 of upper case 543, and the nut may be accommodated in the nut accommodating portion. In this case, screw 559 can be fastened without the nut spinning since the corner of the nut contacts the wall surface of the inner width portion of the nut accommodating portion. The same configuration may also be provided on positive pole terminal bus bar 551 side.

In the eighth embodiment, description has been made with power accumulating element 511 as circular column shape, but may be a square column shape. Furthermore, the configuration in which the electrical dual-layer capacitor is used for power accumulating element 511 has been described, but other capacitors such as electrochemical capacitor, secondary batteries, and the like may be used.

In the eighth embodiment, a case in which the capacitor unit is applied to the vehicle has been described, but this is not the sole case, and application can be made to a general emergency auxiliary power supply, and the like.

Ninth Embodiment

A configuration of a capacitor unit according to a ninth embodiment of the present invention will be described using the drawings. In the ninth embodiment, a capacitor unit including a configuration of holding a first power accumulating element and a second power accumulating element while absorbing the height error in a power accumulating unit configured by connecting the first power accumulating element and the second power accumulating element with a lower bus bar will be described.

In the ninth embodiment, a configuration example of the vehicle capacitor unit will be described.

Figure 35:
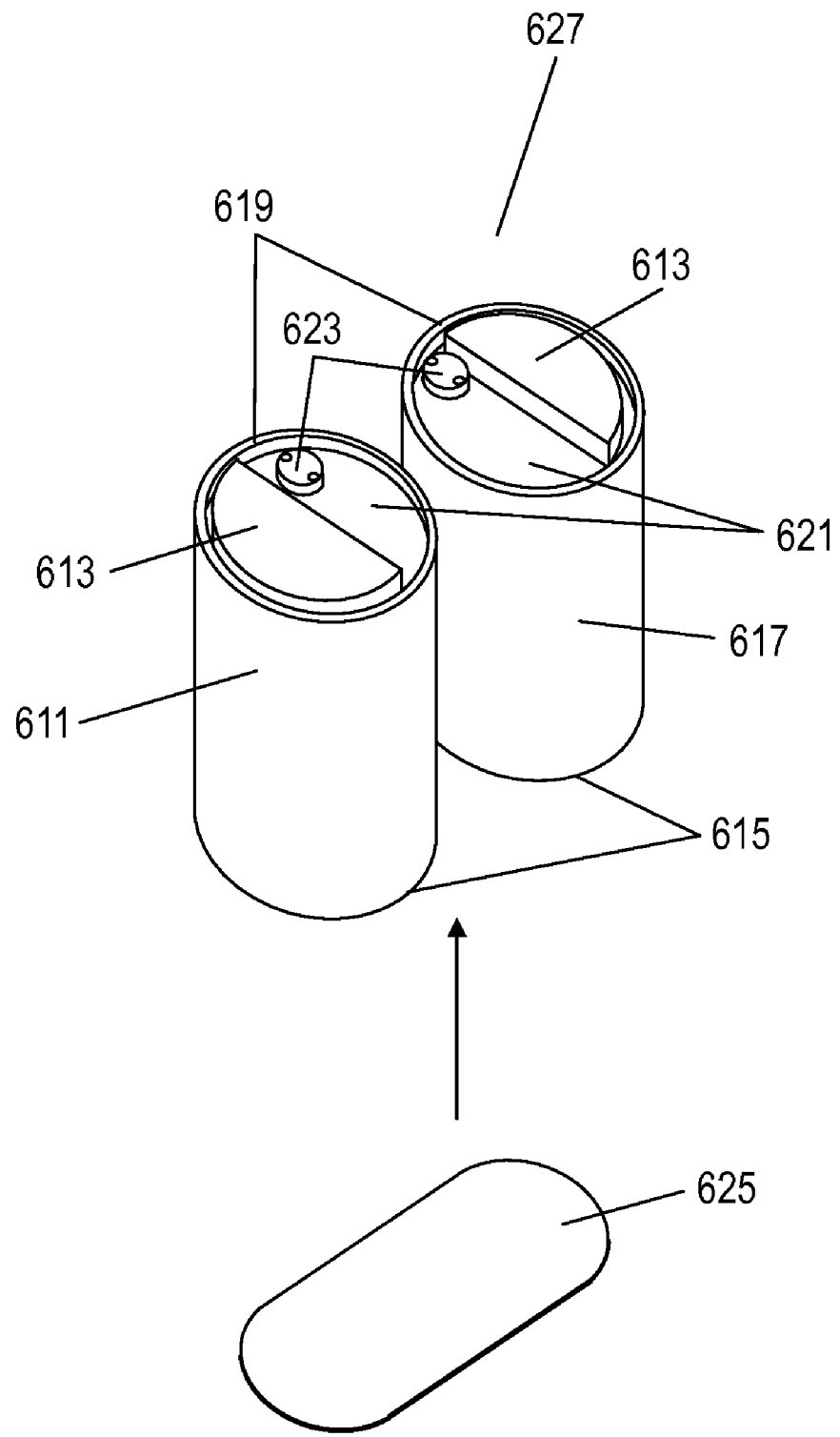
FIG. 35 is an exploded perspective view in the power accumulating unit of the capacitor unit according to a ninth embodiment of the present invention.

FIG. 35 is an exploded perspective view in the power accumulating unit of the capacitor unit according to the ninth embodiment of the present invention. In FIG. 35, the power accumulating element of circular column shape for accumulating power has two types. First power accumulating element 611 is connected at the interior such that upper electrode 613 and lower electrode 615 arranged at both ends of circular column shape become the positive pole and the negative pole, respectively. Second power accumulating element 617 is connected at the interior such that upper electrode 613 and lower electrode 615 become the negative pole and the positive pole, respectively. First power accumulating element 611 and second power accumulating element 617 are both electrical dual-layer capacitors having a diameter of 3 cm. The manufacturing method of first power accumulating element 611 and second power accumulating element 617 is similar to a general cylindrical battery. Therefore, raised upper end peripheral portion 619 is formed through the caulking step in both one end face (upper surface in FIG. 35) of first power accumulating element 611 and second power accumulating element 617. The bottomed cylindrical portion and upper end 621 of first power accumulating element 611 and second power accumulating element 617 are made of aluminum. Upper end 621 is subjected to press molding to form semi-circular upper electrode 613 higher than upper end peripheral portion 619. An insulation member (not shown) is arranged and caulked between the bottomed cylindrical portion and upper end 621.

Upper end 621 is arranged with pressure adjustment valve 623 at a position excluding the central portion other than upper electrode 613. Pressure adjustment valve 623 escapes the vaporized electrolyte when the electrolyte filled inside first power accumulating element 611 and second power accumulating element 617 is vaporized. The rise in internal pressure of first power accumulating element 611 and second power accumulating element 617 thus can be prevented.

In first power accumulating element 611 and second power accumulating element 617, the positions of pressure adjustment valve 623 with respect to upper electrode 613 are different from each other. Specifically, when seen such that upper electrode 613 is on the near side, pressure adjustment valve 623 of first power accumulating element 611 is arranged at the upper left of upper electrode 613, whereas pressure adjustment valve 623 of second power accumulating element 617 is arranged at the upper right of upper electrode 613. According to such configuration, first power accumulating element 611 and second accumulating element 617 in which the internal connection of positive pole and negative pole are different can be distinguished. Furthermore, when arranging to be laid in the horizontal direction, the completed capacitor unit can be arranged such that all pressure adjustment valves 623 are on the upper side, and thus the impregnation of the electrolyte to pressure adjustment valve 623 can be avoided.

Each lower electrode 615 of first power accumulating element 611 and second power accumulating element 617 are electrically and mechanically connected by lower bus bar 625 of flat elliptical plate-shaped metal. In this case, upper electrode 613 of first power accumulating element 611 and upper electrode 613 of second power accumulating element 617 are arranged at positions most distant from each other and are connected with lower bus bar 625 to reduce the connection distance of upper bus bar 655 (see FIG. 36) and lower the internal resistance. Since lower bus bar 625 is made of aluminum having a plate thickness of 0.5 mm, it is made of the same metal as lower electrode 615. Satisfactory laser welding can be performed thereon by using the same metal. As a result, reliable connection can be obtained, local battery does not form by humidity, and corrosion property also enhances. Other metals may be used as long as the same metal are used, but since the internal electrode of the electrical dual-layer capacitor is made of aluminum, the upper electrode and the lower electrode are made of aluminum in weld-connecting the internal electrode to upper electrode 613 and lower electrode 615. Therefore, lower bus bar 625 is also made of aluminum.

In the configuration of FIG. 35, pressure adjustment valve 623 is arranged at upper end 621, and thus if first power accumulating element 611 and second power accumulating element 617 are arranged upside down of FIG. 35, the electrolyte impregnates to pressure adjustment valve 623, and the vaporized electrolyte may not be escaped. Thus, pressure adjustment valve 623 is arranged on the upper side, but upper electrodes 613 in first power accumulating element 611 and second power accumulating element 617 may be connected with lower bus bar 625 in the configuration of the power accumulating element in which pressure adjustment valve 623 is unnecessary. In this case, upper electrode 613 faces downward.

According to such configuration, first power accumulating element 611 and second power accumulating element 617 are connected in series by lower bus bar 625. One set of first power accumulating element 611 and second power accumulating element 617 connected with lower bus bar 625 is hereinafter referred to as power accumulating unit 627.

The overall configuration of the capacitor unit will now be described.

Figure 36:
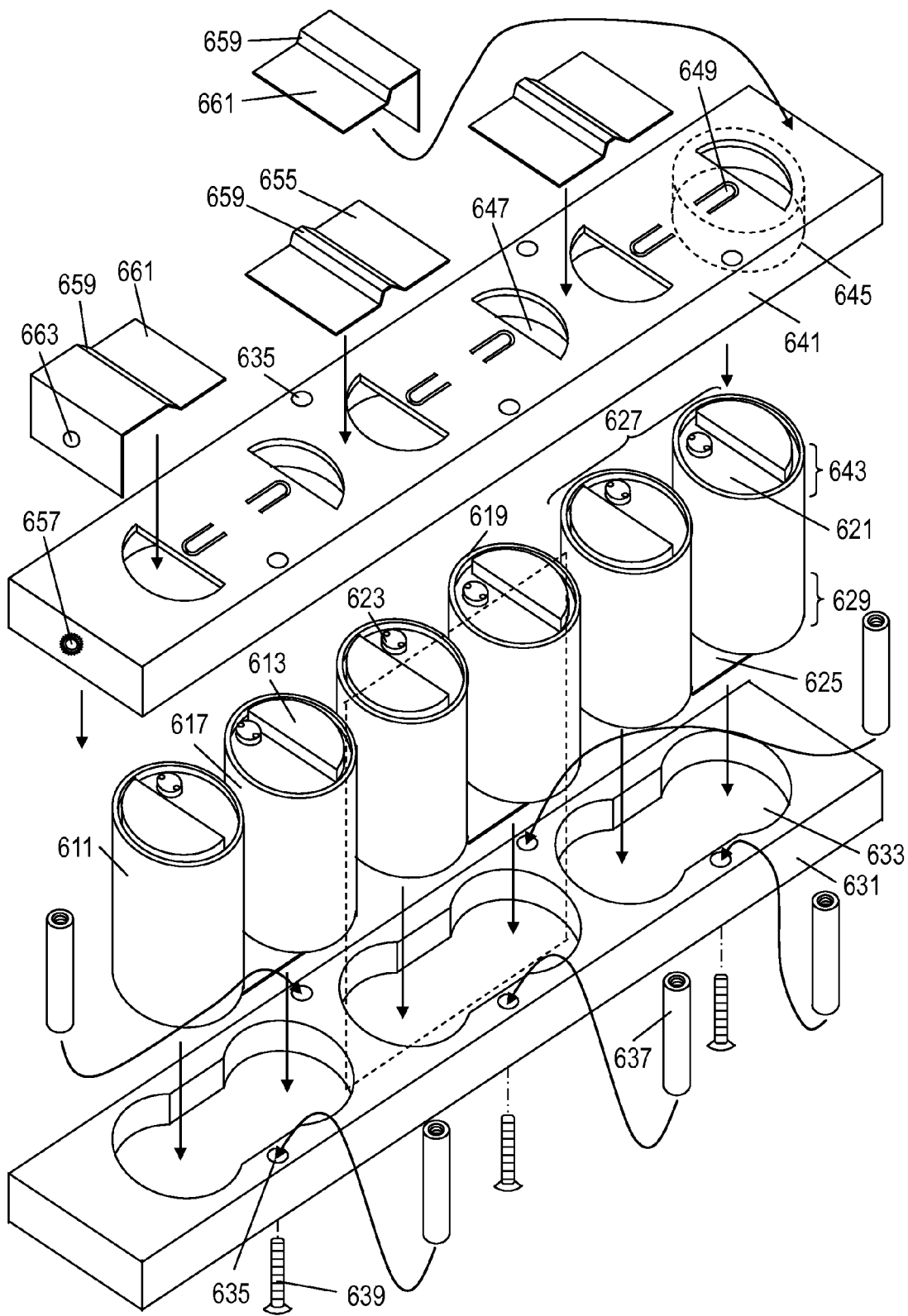
FIG. 36 is a partially exploded perspective view of the capacitor unit according to the ninth embodiment of the present invention.

FIG. 36 is a partially exploded perspective view of the capacitor unit according to the ninth embodiment of the present invention. In FIG. 36, lower part 629 of plural (three sets herein) power accumulating units 627 is inserted to lower holding hole 633 integrally formed in resinous lower case 631. In this case, the size of lower holding hole 633 is larger by about 0.1 to 0.2 mm than the bottom surface dimension of power accumulating unit 627 so that power accumulating unit 627 can be smoothly accommodated. Lower bus bar 625 is flat, and is connected so as to closely attach to first power accumulating element 611 and second power accumulating element 617, and the bottom surface of lower holding hole 633 is formed flat as shown in FIG. 36. Therefore, when power accumulating unit 627 is inserted to lower holding hole 633, the reference plane in the height direction of power accumulating unit 627 becomes the bottom surface of lower holding hole 633.

Plural (five in FIG. 36) fixation screw holes 635 are formed in lower case 631. Fixing rod 637 is attached to fixation screw hole 635. Specifically, since a female screw is formed at both ends of fixing rod 637, connection and fixation can be realized by fastening fixation screw 639 through fixation screw hole 635. In this case, fixation screw 639 is a countersunk screw so that the head of fixation screw 639 does not project out from lower case 631. Lower case 631 and upper case 641 are strongly fixed in such manner.

Upper case 641 will now be described. Upper case 641 is made of resin similar to lower case 631, and fixes power accumulating unit 627. A function of absorbing the error in height of first power accumulating element 611 and second power accumulating element 617 is also provided. First, upper holding hole 645 (cylindrical portion shown with broken line of FIG. 36) is formed to fix upper part 643 of power accumulating unit 627. Upper holding hole 645 differs in shape from lower holding hole 633, and has an independent cylindrical shape having a diameter larger by 0.1 to 0.2 mm than the diameter of first power accumulating element 611 and second power accumulating element 617. Upper part 643 of first power accumulating element 611 and second power accumulating element 617 is inserted thereto. Upper bus bar 655 can be easily connected since upper electrode 613 projects out from opening 647 formed at upper case 641.

Elastic portion 649 of cantilever shape is integrally formed in upper case 641. Elastic portion 649 absorbs the error of height of first power accumulating element 611 and second power accumulating element 617 by contacting part of upper end 621 of each first power accumulating element 611 and each second power accumulating element 617. The details will be hereinafter described. In the ninth embodiment, elastic portion 649 is arranged at one location each for each first power accumulating element 611 and each second power accumulating element 617.

Figure 37:
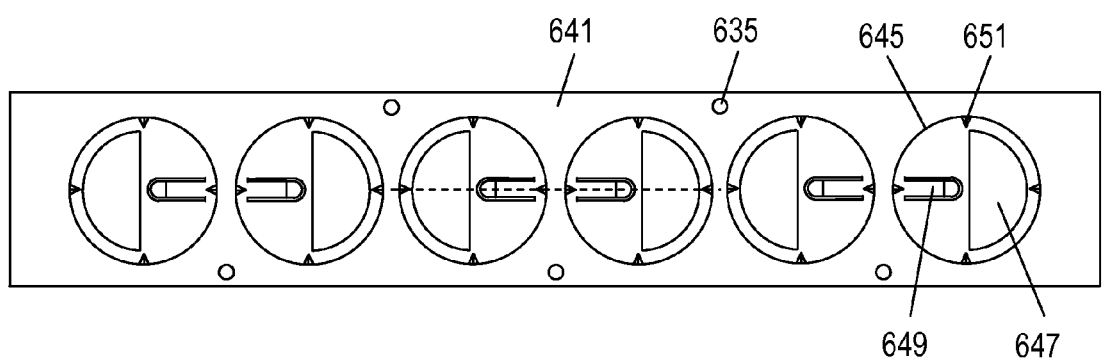
FIG. 37 is a plan view of the upper case of the capacitor unit according to the ninth embodiment of the present invention seen from the bottom part.

FIG. 37 is a plan view of the upper case of the capacitor unit according to the ninth embodiment of the present invention seen from the bottom part. In FIG. 37, six independent upper holding holes 645 are formed in upper case 641. Each upper holding hole 645 is integrally formed with rib 651 at the circumferential portion at the end of each upper holding hole 645 in addition to opening 647 and elastic portion 649. Rib 651 has a triangular pyramid shape, and is formed at plural (four in FIG. 37) locations. Therefore, when upper part 643 of first power accumulating element 611 and second power accumulating element 617 is inserted to upper holding hole 645, one part of upper end 621 contacts elastic portion 649, and one part of upper end peripheral portion 619 also contacts rib 651.

The details thereof will be described with reference to FIG. 38 and FIG. 39. In such figures, the highest (first power accumulating element 611 on the left side of FIGS. 38 and 39) and the lowest (second power accumulating element 617 on the right side of FIGS. 38 and 39) in the error range of the height of first power accumulating element 611 and second power accumulating element 617 are shown.

Figure 38:
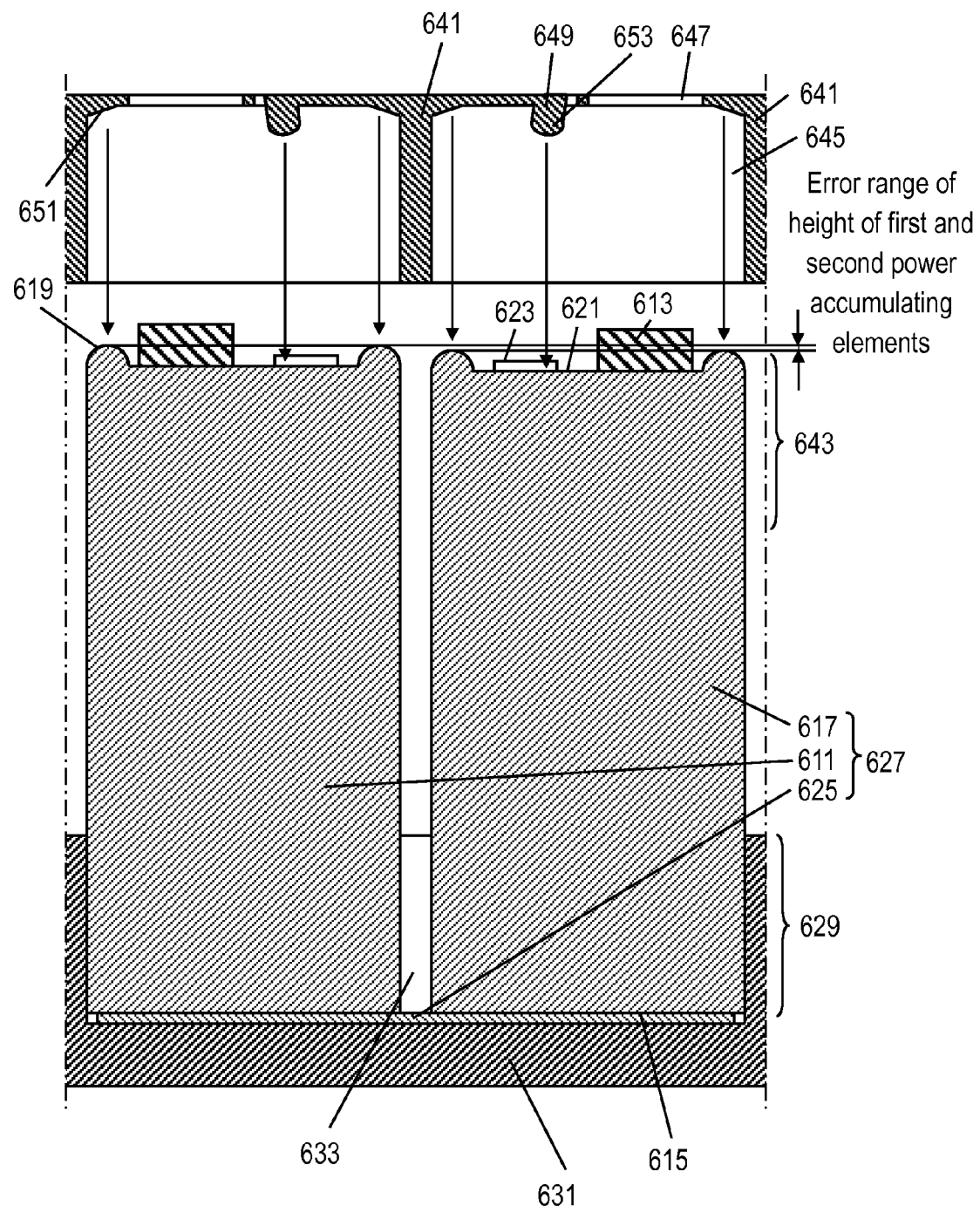
FIG. 38 is a partial cross-sectional view of when attaching the upper case of the capacitor unit according to the ninth embodiment of the present invention.

FIG. 38 is a partial cross-sectional view of when attaching the upper case of the capacitor unit according to the ninth embodiment of the present invention. In other words, a partial cross-sectional view of before inserting upper part 643 of first power accumulating element 611 and second power accumulating element 617 to upper holding hole 645 is shown. The cross-section shows the square broken line portion of FIG. 36 and the broken line portion of FIG. 37.

Since the reference plane in the height direction of power accumulating unit 627 is the bottom surface of lower holding hole 633, the error of height of first power accumulating element 611 and second power accumulating element 617 appears at upper part 643. Therefore, the error of height needs to be absorbed by upper case 641. Specifically, the error of height is absorbed in the following manner.

When upper part 643 is inserted to upper holding hole 645, elastic portion distal end 653 integrally formed at elastic portion 649 first contacts upper end 621, as shown with an arrow in FIG. 38. Elastic portion distal end 653 is arranged to project out from elastic portion 649. Thus, elastic portion 649 contacts avoiding upper electrode 613 at the central portion of upper end 621 and in a concentrated manner to the portion close as possible to the center. As a result, first power accumulating element 611 and second power accumulating element 617 receive the elastic stress in a direction substantially perpendicular to the reference plane of the lower end. Thereafter, upper end peripheral portion 619 contacts rib 651 at four locations.

Figure 39:
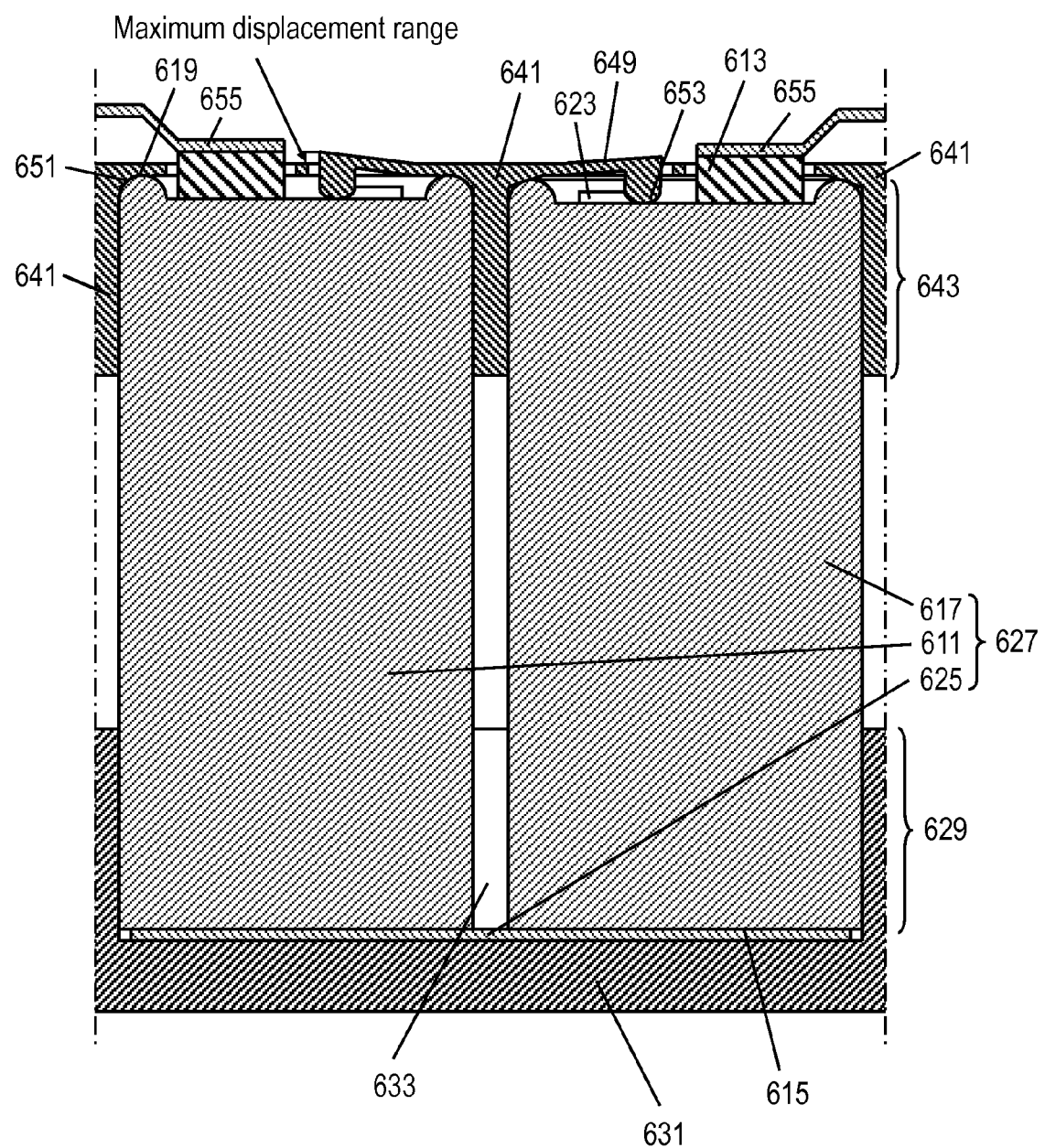
FIG. 39 is a partial cross-sectional view of the capacitor according to the ninth embodiment of the present invention.

FIG. 39 is a partial cross-sectional view of the capacitor unit according to the ninth embodiment of the present invention. In other words, a partial cross-sectional view of after upper part 643 is inserted to upper holding hole 645 is shown. In FIG. 39, elastic portion distal end 653 generates warp by contacting upper end 621. As a result, stress is exerted downward while absorbing the error of height of first power accumulating element 611 and second power accumulating element 617, and power accumulating unit 627 can be fixed. In this case, the warp manner (displacement range) of elastic portion 649 differs between first power accumulating element 611, which is the highest, and second power accumulating element 617, which is the lowest. This difference absorbs the error of height. The maximum displacement range shown in FIG. 39 is the maximum width elastic portion 649 can displace when the power accumulating element (first power accumulating element 611 herein) having a maximum height error is inserted to upper holding hole 645, and thus displacement does not occur beyond such range. The displacement range of elastic portion 649 can absorb all height errors as displacement greater than the error of height of plural first power accumulating elements 611 and second power accumulating elements 617 is enabled.

Furthermore, upper end peripheral portion 619 contacts rib 651. Since rib 651 is formed to a triangular pyramid shape, squashing starts from the contacting portion of rib 651 when first power accumulating element 611 and second power accumulating element 617 are pushed into upper holding hole 645. As a result, not only elastic portion 649, but rib 651 also exerts downward stress on first power accumulating element 611 and second power accumulating element 617. Power accumulating unit 627 is more strongly held by such stress. In this case, the distal end of rib 651 has a height of being slightly squashed even when second power accumulating element 617 on the right side having the lowest height is inserted to upper holding hole 645. In other words, rib 651 has a height such that upper end peripheral portion 619 of second power accumulating element 617 having the lowest height within the error range of the height can partially contact. Thus, even second power accumulating element 617 having the lowest height can reliably contact rib 651, and thus all power accumulating units 627 can be adequately held, and high reliability with respect to the vibration of the vehicle is obtained.

The size, position, number etc. of elastic portion 649 and rib 651 may be appropriately changed depending on the size and weight of the power accumulating element to hold, and furthermore, the vibration condition etc. Elastic portion 649 may be formed in an oblique direction under the condition elastic portion distal end 653 is positioned near the center of upper end 621. Elastic portion 649 and rib 651 are desirably formed by being integrally molded with upper case 641 to ensure such dimensional accuracy and to reliably contact first power accumulating element 611 and second power accumulating element 617. In FIG. 39, upper bus bar 655 is connected to upper electrode 613, and the details thereof will be hereinafter described.

In FIG. 36, fixation screw hole 635 for fixing fixing rod 637 is formed in upper case 641, similar to lower case 631. Upper case 641 and lower case 631 are eventually strongly fixed by fastening fixation screw 639 thereto. According to such assembly, the displacement range of elastic portion 649 and the squashed amount of rib 651 are determined, and power accumulating unit 627 can be adequately held and fixed while absorbing the height error. Insert nut 657 is buried at the left end of upper case 641 in FIG. 36. Similarly, although not shown, an insert nut is buried at the right end of upper case 641.

The configuration of upper bus bar 655 will now be described. Upper bus bar 655 connects upper electrodes 613 of adjacent power accumulating units 627. In the capacitor unit according to the ninth embodiment, two upper bus bars 655 are used. Upper bus bar 655 is made of the same metal (aluminum) as upper electrode 613 to laser welding connect with upper electrode 613. The plate thickness is 0.5 mm, similar to lower bus bar 625. Furthermore, bending portion 659 is integrally formed at the central portion of upper bus bar 655 through press working. The stress caused by thermal expansion and vibration applied on upper bus bar 655 can be reduced, and high reliability of the connecting portion with upper electrode 613 and upper bus bar 655 itself can be obtained. Furthermore, even if the height of adjacent power accumulating units 627 differ within the error range, the error of height can be absorbed with bending portion 659. Therefore, laser welding can be carried out with upper electrode 613 and upper bus bar 655 closely attached, and the reliability can be enhanced.

Since adjacent power accumulating unit 627 does not exist, external connection upper bus bar 661 for wiring with the outside is connected to upper electrode 613 the farthest end of plural power accumulating units 627 connected with upper bus bar 655 and lower bus bar 625. Connection is made to upper electrode 613 at the left end and the right end in FIG. 36. External connection upper bus bar 661 is made of aluminum having a plate thickness of 0.5 mm same as upper bus bar 655, and is also formed with bending portion 659. The role of bending portion 659 is the same as upper bus bar 655. External connection upper bus bar 661 is formed with screw hole 663 to electrically connect with the outside. Screw hole 663 is positioned to face insert nut 657 when external connection upper bus bar 661 is connected to upper electrode 613.

Figure 40:
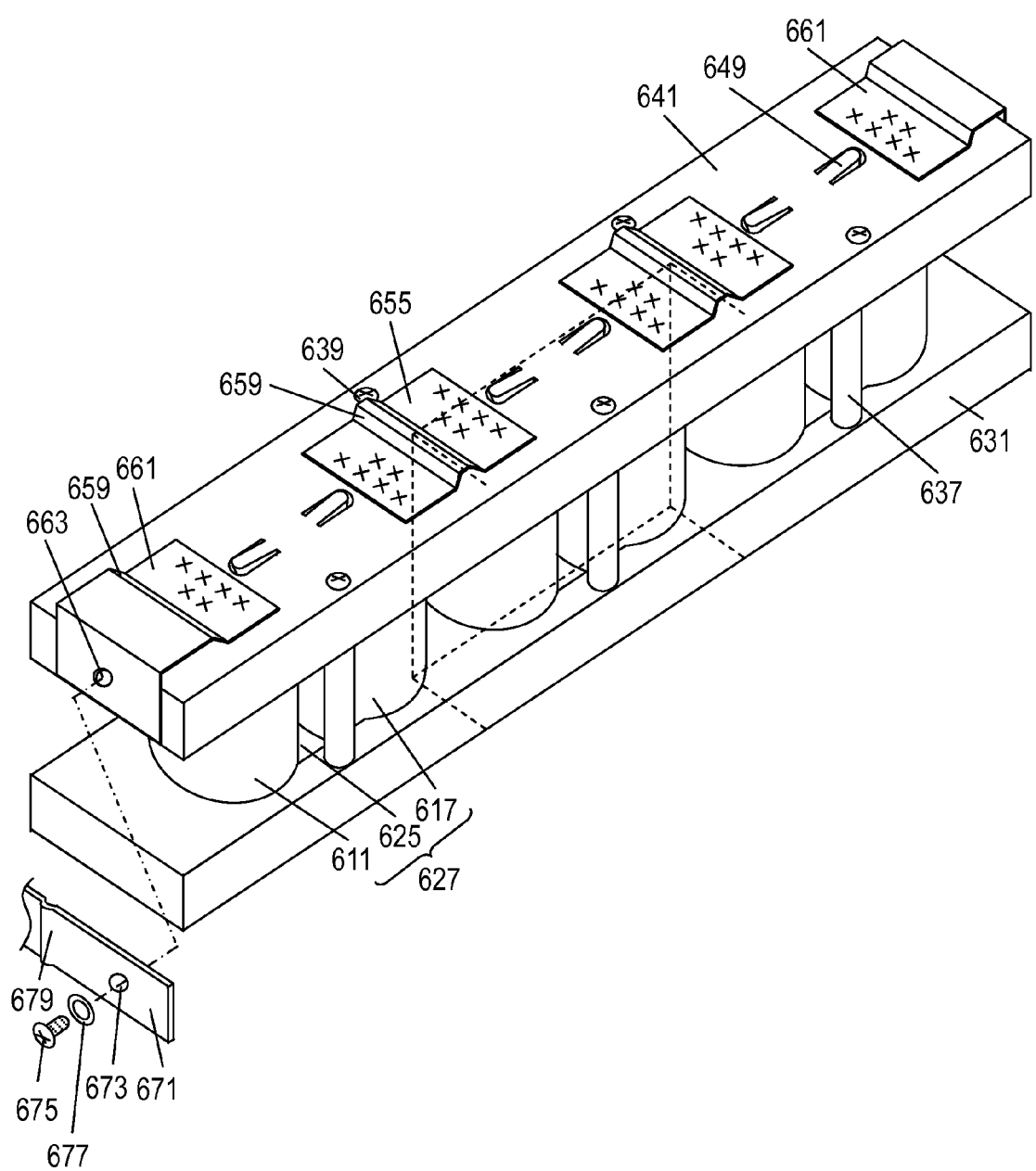
FIG. 40 is a partially assembled perspective view of the capacitor unit according to the ninth embodiment of the present invention.

FIG. 40 is a partially assembled perspective view of the capacitor unit according to the ninth embodiment of the present invention. The cross-sectional view shown with a square broken line portion of FIG. 40 corresponds to FIG. 39. In FIG. 40, upper bus bar 655 or external connection upper bus bar 661 and upper electrode 613 are welded by laser similar to the connection of lower bus bar 625 to lower electrode 615. The laser welding site is shown with a mark X. In FIG. 40, great number of points are welded in spot-form, but may be linearly weld-connected by sequentially shifting the welding position. The connection reliability enhances in this case compared to when welded in spot form. The linear laser welding may be applied to the connection of lower bus bar 625 and lower electrode 615.

External bus bar 671 for connecting to the outside is attached to external connection upper bus bar 661. Specifically, screw 675 is fastened to insert nut 657 through external bus bar hole 673 formed in external bus bar 671 and screw hole 663 for electrical connection. In this case, washer 677 may be interposed. The loosening of screw 675 can be reduced in such case. External bus bar 671 is made of copper having a plate thickness of 1 mm. The internal resistance of external bus bar 671 and the contact resistance of external bus bar 671 and external connection upper bus bar 661 thereby lower, and thus loss by heat generation can be reduced. Although not shown, the external bus bar is similarly connected to external connection upper bus bar 661 at the right end of FIG. 40. A plurality of capacitor units may be connected using external bus bar 671. In this case, external bus bar bending portion 679 is desirably arranged to reduce the application of stress caused by thermal expansion and vibration external bus bar 671.

Furthermore, although not shown, a terminal portion may be arranged on upper bus bar 655, external connection upper bus bar 661 and the like to electrically connect with the circuit substrate, similar to the first to the seventh embodiments, so that the capacitor unit can be miniaturized and made lighter.

According to the above configuration and operation, the capacitor unit can be miniaturized and made lighter, and furthermore, the height error of power accumulating unit 627 can be absorbed by elastic portion 649, and elastic portion 649 and rib 651 can apply stress downward to strongly hold and fix power accumulating unit 627, and thus stress fatigue by the heat generation of the weld-connecting portion and the fluctuation of upper bus bar 655 and lower bus bar 625 can be reduced. The capacitor unit in which high reliability is obtained thus can be realized.

In the ninth embodiment, screw 675 is fastened with insert nut 657. However, a nut accommodating portion having an inner width that contacts the nut may be integrally molded at the position facing screw hole 663 of upper case 641, and the nut may be accommodated in the nut accommodating portion. In this case, screw 675 can be fastened without the nut spinning since the corner of the nut contacts the wall surface of the inner width portion of the nut accommodating portion.

In the ninth embodiment, description has been made with first power accumulating unit 611 and second power accumulating unit 617 as circular column shape, but may be a square column shape. Furthermore, the configuration in which the electrical dual-layer capacitor is used for first power accumulating unit 611 and second power accumulating unit 617 has been described, but other capacitors such as electrochemical capacitor, secondary batteries, and the like may be used.

In the ninth embodiment, a case in which the capacitor unit is applied to the vehicle has been described, but this is not the sole case, and application can be made to a general emergency auxiliary power supply, and the like.

Tenth Embodiment

The configuration of a capacitor unit according to a tenth embodiment of the present invention will be described below using the drawings. In the tenth embodiment, a capacitor unit including a configuration in which a plurality of capacitors and a capacitor block including an upper case and a lower case for holding the same are connected in great numbers will be described.

Figure 41:
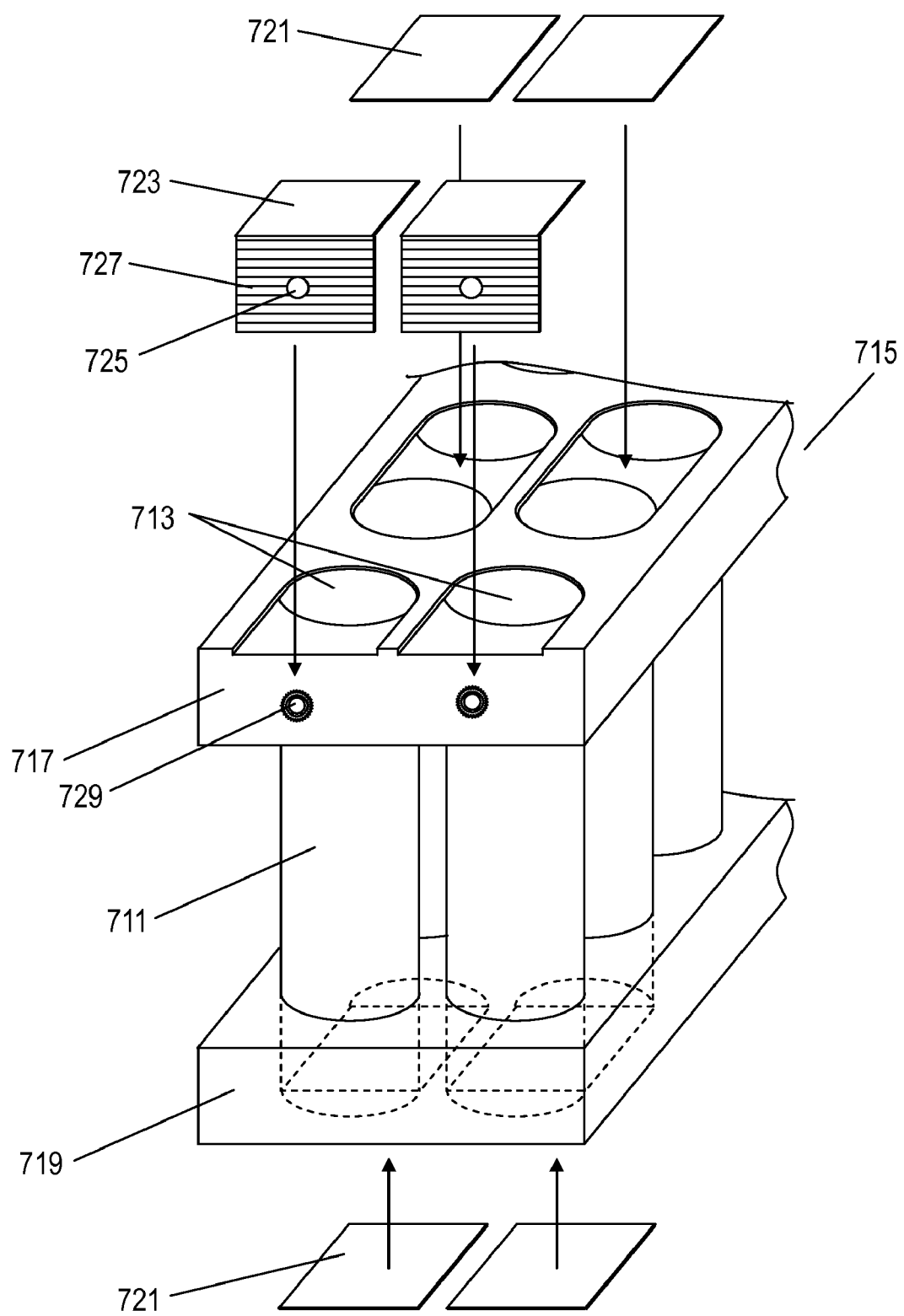
FIG. 41 is a partially exploded perspective view in a capacitor block of a capacitor unit according to a tenth embodiment of the present invention.

FIG. 41 is a partially exploded perspective view in the capacitor block of the capacitor unit according to a tenth embodiment of the present invention. In FIG. 41, capacitor 711 for accumulating power is an electrical dual-layer capacitor of circular column shape having a diameter of 3 cm, where electrode 713 made of aluminum is arranged at both end faces. Electrode 713 is configured such that one end face is the positive pole and the other end face is the negative pole. Capacitor block 715 is formed with plural (e.g., ten) capacitors 711 forming a set.

The detailed configuration of capacitor block 715 will now be described. Plural (ten) capacitors 711 have the upper end face inserted to and held by upper case 717 and the lower end face by lower case 719. Upper case 717 and lower case 719 are made of resin, and are both integrally molded with a holding hole (not shown) having a diameter of receiving capacitor 711. In the example of FIG. 41, five holding holes are formed for two columns (total of ten) in the depth direction to insert ten capacitors 711.

In the tenth embodiment, capacitor 711 held by capacitor block 715 connects electrode 713 with internal bus bar while being inserted to upper case 717 and lower case 719 so that the polarity of electrode 713 of adjacent capacitors 711 has opposite sign to each other. Therefore, capacitors 711 of capacitor block 715 are all connected in series.

In order to connect in such manner, the holding hole of upper case 717 and lower case 719 is formed to expose one part of electrode 713. Adjacent exposed electrodes 713 are connected with internal bus bar 721. Since the internal bus bar is made of aluminum and has a thickness of 0.5 mm, it can be laser welded with electrode 713 also made of aluminum. As a result, ten capacitors 711 are weld-connected in series between electrodes 713 of capacitors 711 (two on nearest side of FIG. 41) at the end of capacitor block 715.

Extraction electrode 723 made of aluminum is connected to electrode 713 of capacitor 711 at the end through laser welding. Extraction electrode 723 has an L-shape, where screw hole 725 for fixing external bus bar 731 is formed on the surface not welded with electrode 713. Bumps 727 serving as projections are formed on the surface formed with screw hole 725 of extraction electrode 723, that is, at the contacting portion with external bus bar. Bump 727 has a triangular shape which cross section is like the blade of a saw, and has a height of about 0.2 mm. Such screw hole 725 and bump 727 are integrally molded by pressing extraction electrode 723.

Insert nut 729 is buried in upper case 717 at the position facing screw hole 725. External bus bar 731 and extraction electrode 723 thus can be screw fixed. Capacitor block 715 is formed by the above configuration.

Figure 42A:
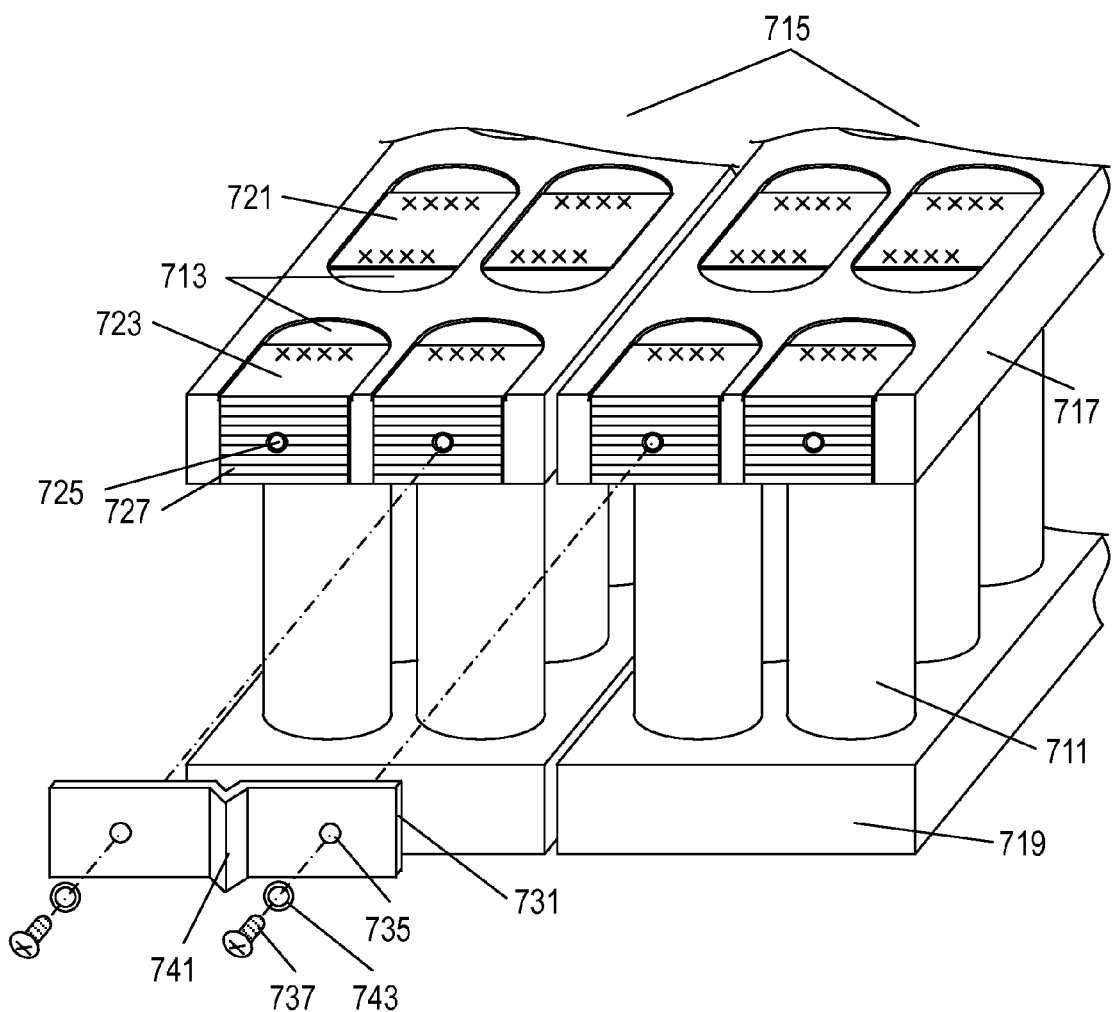
FIG. 42A is a perspective view showing the connection of the external bus bar of the capacitor unit according to the tenth embodiment of the present invention.
Figure 42B:
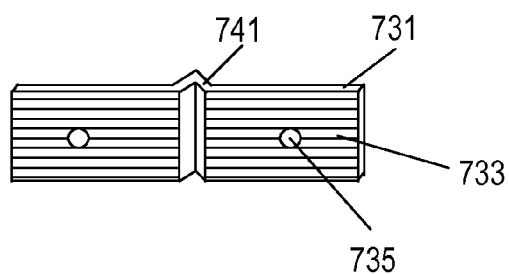
FIG. 42B is a perspective view of the contacting surface side with the extraction electrode of the external bus bar of the capacitor unit according to the tenth embodiment of the present invention.

The connection configuration of such capacitor block 715 will now be described. FIG. 42A is a perspective view showing the connection of the external bus bar of the capacitor unit according to the tenth embodiment of the present invention. FIG. 42B is a perspective view of the contacting surface side with the extraction electrode of the external bus bar of the capacitor unit according to the tenth embodiment of the present invention. In FIGS. 42A, B, the mark X shows the welding location with respect to internal bus bar 721 and electrode 713 of extraction electrode 723, where the welding site is linearly in great number numbers in the tenth embodiment to enhance the reliability of the connecting portion.

Adjacent capacitor blocks 715 are connected by attaching external bus bar 731 to respective extraction electrode 723. In this case, as shown in FIG. 42B, bump 733 having the same shape as extraction electrode 723 is integrally molded at the contacting portion with extraction electrode 723 of external bus bar 731. Therefore, bumps 727, 733 fit to each other when external bus bar 731 is contacted to extraction electrode 723. The contacting area thereof thus increases, and thus the contact resistance lowers, and the heat generation at the contacting portion reduces. Since external bus bar 731 is made of copper and has a thickness of 1 mm, the internal resistance of external bus bar 731 itself can be reduced, thereby contributing to reduction in heat generation.

Bumps 727, 733 are formed to a groove shape in the horizontal direction. When capacitor block 715 is mounted on the vehicle with capacitor 711 standing, the vibration direction received by capacitor 711 when using the vehicle is the up and down direction of FIG. 42. Therefore, the groove is formed to be perpendicular to the vibration direction to reduce the shift in the up and down direction of extraction electrode 723 and external bus bar 731 that generates by the vibration in the up and down direction.

As shown in FIG. 42A, screw hole 735 is formed in external bus bar 731 at positions (two locations) corresponding to screw hole 725 of extraction electrode 723. Bending portion 741 is arranged at one part of external bus bar 731. In the tenth embodiment, bending portion 741 is arranged at the central portion of bus bar 731 or position that does not interfere when screw 737 is fixed. Thus, position shift of adjacent capacitor blocks 715, thermal expansion due to temperature change, and displacement due to vibration of the vehicle can be absorbed by bending portion 741, and the reliability of external bus bar 731 can be enhanced. Bump 733, screw hole 735, and bending portion 741 arranged in external bus bar 731 are all formed by press working.

The connecting and fixing method of external bus bar 731 and extraction electrode 723 will now be described. External bus bar 731 is arranged such that extraction electrode 723 and screw holes 725, 735 coincide and bumps 727, 733 fit to each other. Thereafter, screw 737 is inserted to screw holes 725, 735, and fastened to insert nut 729 through external bus bar 731 and extraction electrode 723 to fix external bus bar 731 and extraction electrode 723. Screw 737 may be fastened through washer 743. In this case, the loosening of screw 737 by the vibration of the vehicle can be reduced.

Figure 43:
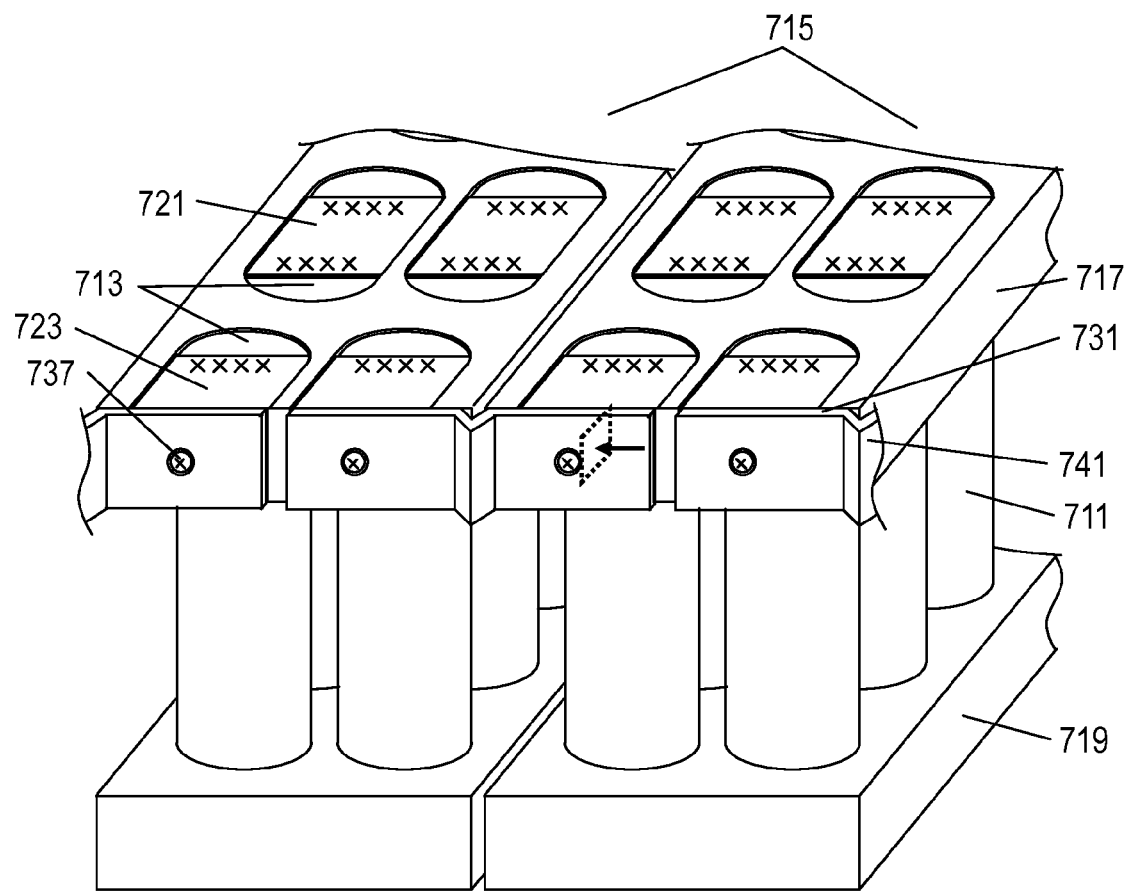
FIG. 43 is a partial perspective view of when the capacitor unit according to the tenth embodiment of the present invention is completed.

FIG. 43 is a partial perspective view of when the capacitor unit according to the tenth embodiment of the present invention is completed. In FIG. 43, capacitor blocks 715 are connected in series, in parallel, or in series parallel by sequentially connecting plural capacitor blocks 715, and the capacitor unit having the power specification necessary for the vehicle regeneration system can be configured.

The fixed portion of screw 737 will be described.

Figure 44:
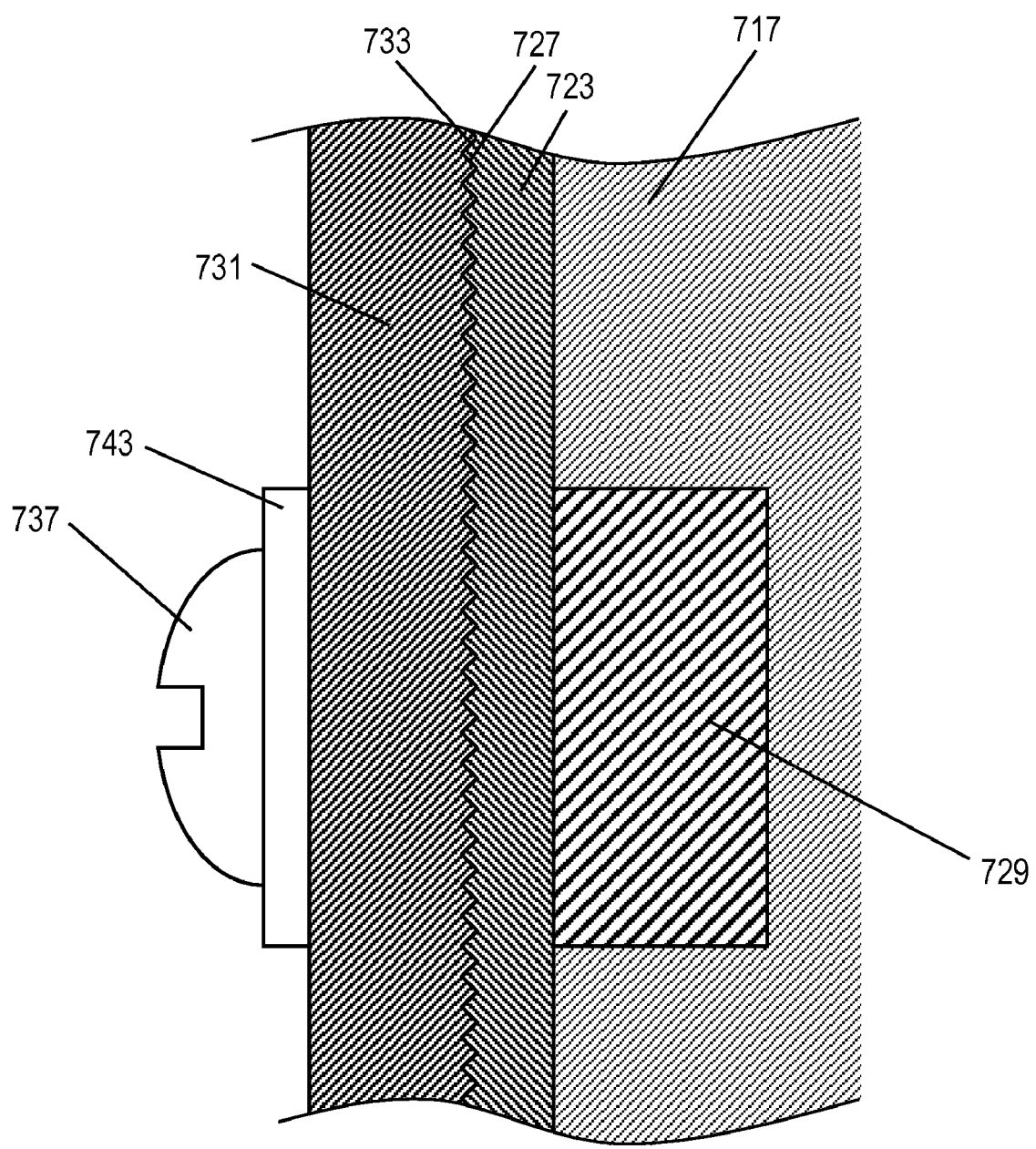
FIG. 44 is a cross-sectional view of a screw attachment portion of the capacitor unit according to the tenth embodiment of the present invention.

FIG. 44 is a cross-sectional view of a screw attachment portion of the capacitor unit according to the tenth embodiment of the present invention. A cross-sectional view of the portion shown with a broken line of FIG. 43 seen from the side of the arrow is shown. In FIG. 44, screw 737 is fastened to insert nut 729 through washer 743, external bus bar 731, and extraction electrode 723, so that external bus bar 731 and extraction electrode 723 are electrically and mechanically connected. In this case, bumps 727. 733 are compressed so as to bite to each other by the fastening of screw 737 in the fitted state. As a result, external bus bar 731 is made of copper and is harder than extraction electrode 723 made of aluminum, and thus bump 733 of external bus bar 731 compresses and partially deforms bump 727 of extraction electrode 723. Stronger connection is thus achieved, and the contact resistance can be further reduced.

Figure 45A:
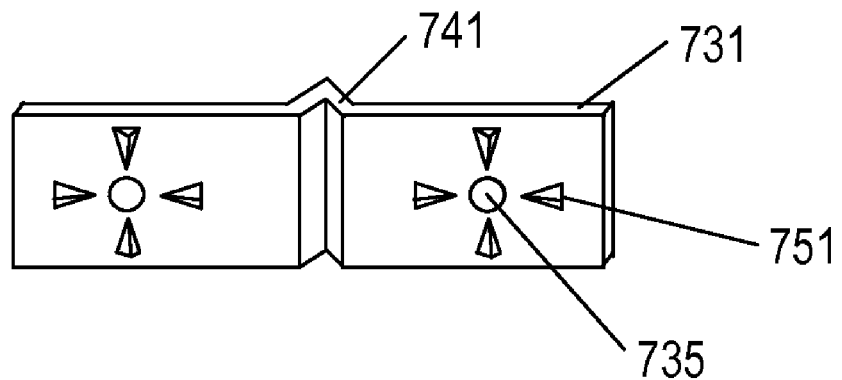
FIG. 45A is a perspective view of the external bus bar arranged with a triangular pyramid-shaped projection of the capacitor unit according to the tenth embodiment of the present invention.
Figure 45B:
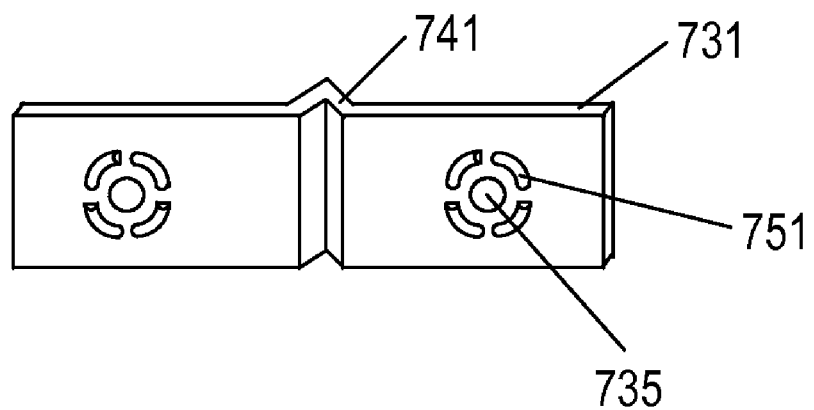
FIG. 45B is a perspective view of the external bus bar arranged with a circular arc-shaped projection of the capacitor unit according to the tenth embodiment of the present invention.

FIG. 45A is a perspective view of the external bus bar arranged with a triangular pyramid-shaped projection of the capacitor unit according to the tenth embodiment of the present invention. FIG. 45B is a perspective view of the external bus bar arranged with a circular arc-shaped projection of the capacitor unit according to the tenth embodiment of the present invention. In the tenth embodiment, the projection is formed as bumps 727, 733, but may be projection 751 integrally formed at the peripheral portion in screw hole 735 of at least external bus bar 731. In this case, external electrode 723 may be flat or may be arranged with similar projection. The shape of projection 751 is triangular pyramid in FIG. 45A and circular arc in FIG. 45B. In either case, projection 751 is pushed into extraction electrode 723 by fastening screw 737. Here, the stress concentrates at the distal end of projection 751, and thus screw 737 is fastened while squashing projection 751. The contact resistance of extraction electrode 723 and external bus bar 731 thereby reduces, and heat generation can be reduced. In FIG. 45A, projection 751 has a triangular pyramid shape, but may be other pyramid shape or circular cone shape.

Although not shown, a terminal portion may be arranged on internal bus bar 721 and extraction electrode 723 to electrically connect with the circuit substrate, similar to the first to the seventh embodiments, so that the capacitor unit can be miniaturized and made lighter. In this case, the configuration can be simplified when one circuit substrate is connected to plural capacitor blocks 715 compared to when the circuit substrate is arranged for each capacitor block 715.

According to such configuration, similar to the first to the seventh embodiments, the capacitor unit can be miniaturized and made lighter, and furthermore, the contact resistance can be reduced in capacitor block 715 by weld-connecting all capacitors 711 with internal bus bar 721. Capacitor blocks 715 are connected so as to fit external bus bar 731 arranged with bump 733 to bump 727 of extraction electrode 723 with screw 737 to thereby reduce the contact resistance, and thus a capacitor unit of high reliability with reduced heat generation can be realized.

Although omitted in capacitor 711 of the tenth embodiment shown in FIGS. 41, 42A, 42B, and 43, a capacitor arranged with a pressure adjustment valve that discharges the vaporized electrolyte to the outside so that the internal pressure does not become high when the electrolyte filled inside capacitor 711 is vaporized may be used. In this case, the pressure adjustment valve needs to be arranged at the portion not covered by internal bus bar 721 and extraction electrode 723 in electrode 713 so as not to inhibit the operation of pressure adjustment valve.

Furthermore, in the tenth embodiment, extraction electrode 723 is weld-connected to electrode 713 of capacitor 711 at the end of capacitor block 715 (two capacitors 711 on the near side in FIG. 41). However, external bus bar 731 may be connected directly to electrode 713 without interposing extraction electrode 723. In this case, extraction electrode 723 and insert nut 729 are unnecessary, and the configuration is simplified. However, since a female screw portion for fastening screw 737 needs to be formed in electrode 713, the thickness of electrode 713 becomes thick. Bump 727 also needs to be formed on the surface of electrode 713 when bump 733 is arranged on external bus bar 731.

Figure 46:
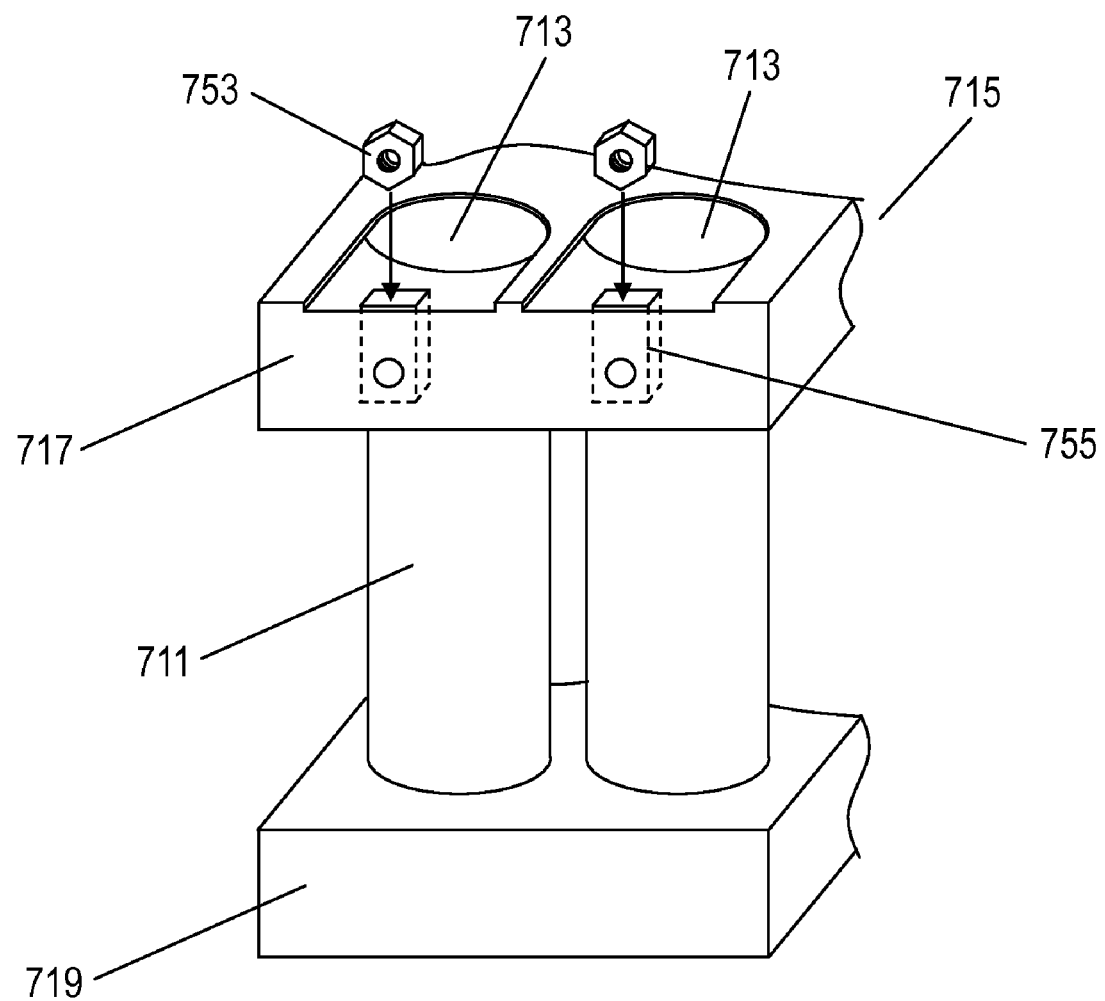
FIG. 46 is a perspective view of a nut accommodating portion of the capacitor unit according to the tenth embodiment of the present invention.
Figure 47:
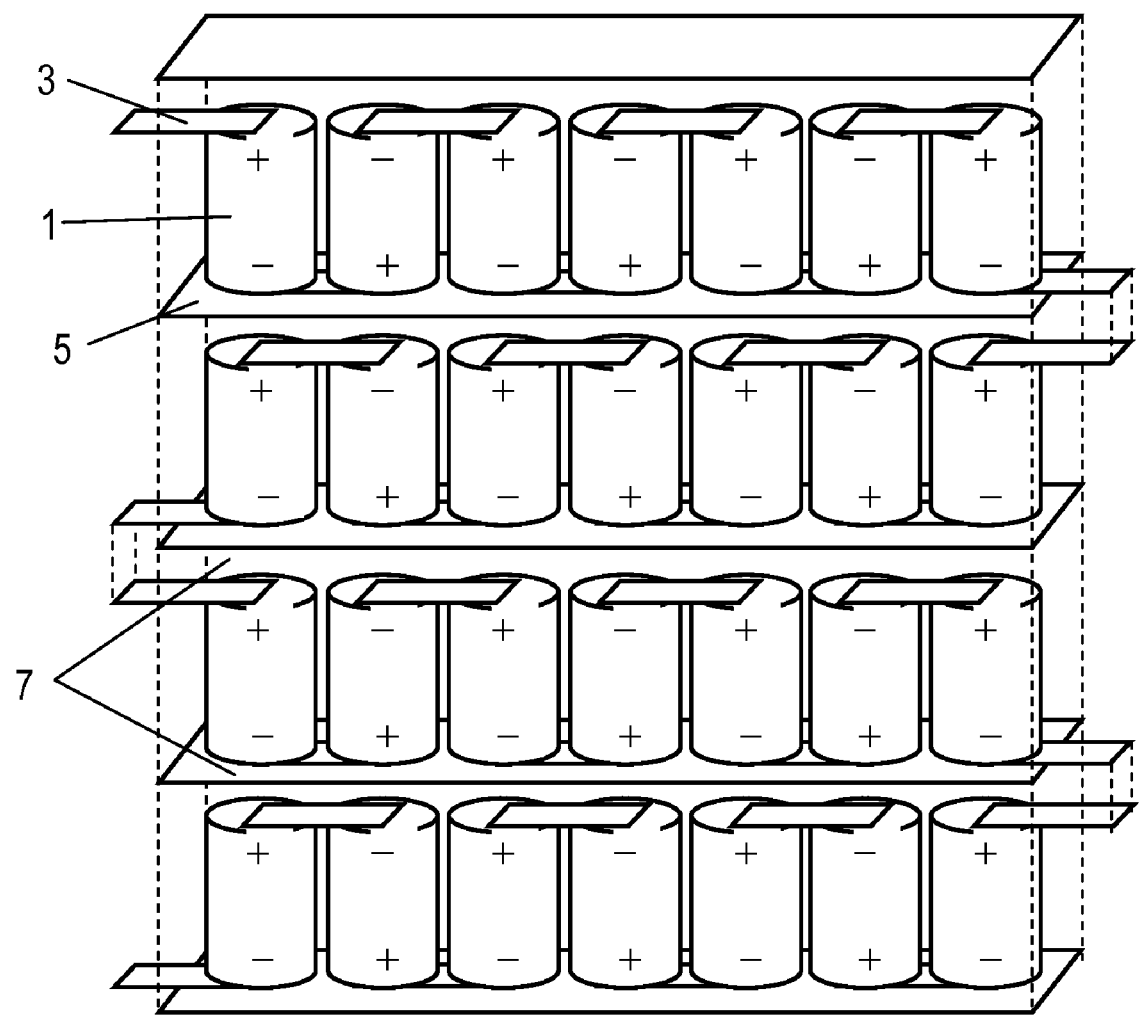
FIG. 47 is a perspective view of a conventional battery unit.

In the tenth embodiment, screw 737 is fastened with insert nut 729. However, as shown with a broken line of FIG. 46, nut accommodating portion 755 having an inner width that contacts nut 753 may be integrally molded at the position facing screw hole 725 of upper case 717, and nut 753 may be accommodated in nut accommodating portion 755. In this case, screw 737 can be fastened without nut 753 spinning since the corner of nut 753 contacts the wall surface of the inner width portion of nut accommodating portion 755.

Capacitor block 715 of the tenth embodiment has all capacitors 711 weld-connected in series with internal bus bar 721, but may be connected in parallel or in series parallel.

Furthermore, a case in which the capacitor unit is applied to the vehicle regeneration system used in the hybrid vehicle and the idling stop vehicle has been described in the tenth embodiment. However, not limited thereto, application can be made to a vehicle auxiliary power supply or a general emergency auxiliary power supply etc. of each system that consumes large current in a short period of time such as electrical power steering and electrical supercharger.

INDUSTRIAL APPLICABILITY

The capacitor unit according to the present invention can measure and control the voltage value at both ends of each capacitor with one circuit substrate by the conductive portion arranged at the flat portion of the bus bar for connecting each capacitor. As a result, the capacitor unit can be miniaturized and made lighter, and in particular, can be effectively used as a capacitor unit etc. serving as the auxiliary power supply particularly for vehicles.

The invention claimed is:
1. A capacitor unit comprising:
   a plurality of capacitors arranged side by side, each capacitor including an end face electrode at one end face and a side face electrode at a side face, the side face electrode having a polarity different from the end face electrode;
   a plurality of bus bars, each bus bar being connected to the end face electrode of one of the capacitors and the side face electrode of an adjacent one of the capacitors;
   a circuit substrate arranged at a side of the plurality of capacitors having the end face electrodes; and
   a plurality of conductive portions electrically connecting the bus bars to the circuit substrate, the conductive portions extending from the bus bars, respectively, toward the circuit substrate.

2. The capacitor unit of claim 1, wherein each bus bar includes a bending portion arranged near the end face electrode of the one of the capacitors to which the bus bar is connected.

3. The capacitor unit of claim 1, further comprising:
a first fixing case and a second fixing case for holding the capacitors parallel to each other;
a plurality of bus bar holes arranged at an upper surface of the first fixing case for inserting a connecting portion of each bus bar toward the side face electrode of a respective one of the capacitors; and
a through-hole formed at a position facing the connecting portion at a side surface of the first fixing case when the connecting portion is inserted to the bus bar hole,
wherein one end of each capacitor is inserted into the first fixing case and the other end of each capacitor is inserted into the second fixing case.

4. A capacitor unit comprising:
a plurality of power accumulating elements, each power accumulating element having a columnar shape, and each power accumulating element including an end face electrode arranged at one end face of the columnar shape and a side face electrode arranged at a side face of the columnar shape;
a bus bar weld-connected to the side face electrode of one of the power accumulating elements other than power accumulating elements having the side face electrode of either highest voltage value or lowest voltage value when the plurality of power accumulating elements are aligned and electrically and mechanically connected with respect to each other, and weld-connected to the end face electrode of the adjacent one of the power accumulating elements;
a lower case in which a bottom part of at least one of the power accumulating elements is inserted, the lower case being integrally formed with at least one elastic portion which contacts the bottom part; and
an upper case in which an upper part of at least one of the power accumulating elements is inserted,
wherein a displacement range of the elastic portion is greater than an error of height of the plurality of power accumulating elements.

5. The capacitor unit of claim 4, further comprising:
two fixation screws; and
a fixing rod having a female screw at both ends thereof,
wherein each of the upper case and the lower case includes a fixation screw hole, and
wherein the upper case and the lower case are connected and fixed by inserting the fixation screws through the fixation screw holes, respectively, and fastening the fixation screws to the fixing rod.

6. The capacitor unit of claim 4, wherein the upper case has a plurality of contacting portions, and the side faces of the power accumulating elements contact the contacting portions, respectively.

7. A capacitor unit comprising:
a plurality of capacitors each having a columnar shape, each capacitor having an electrode arranged at both end faces of the columnar shape;
an internal bus bar weld-connected such that the electrodes are in series, in parallel, or in series parallel;
a plurality of capacitor blocks each including an upper case and a lower case for holding the capacitors, an upper end face of each capacitor being inserted into one of the upper cases and a lower end face of each capacitor being inserted into one of the lower cases; and
an external bus bar electrically connecting two adjacent capacitor blocks by fixing the external bus bar to electrodes positioned at ends of the two adjacent capacitor blocks,
wherein the external bus bar has a first portion contacting a second portion of the electrodes positioned at ends of the two adjacent capacitor blocks, and
wherein a projection is formed on the first portion and/or the second portion.

8. The capacitor unit of claim 7, wherein the electrodes positioned at ends of the two adjacent capacitor blocks are the electrodes at end faces of the capacitors.

9. The capacitor unit of claim 7, wherein the electrodes positioned at ends of the two adjacent capacitor blocks are extraction electrodes, and the extraction electrodes are connected to the electrodes at end faces of the capacitors.

10. The capacitor unit of claim 7, wherein projections are formed on a contact surface of the external bus bar and a contact surface of the electrodes positioned at ends of the two adjacent capacitors for reducing relative movement between the external bus bar and the electrodes positioned at ends of the two adjacent capacitors.

11. The capacitor unit of claim 10, wherein the electrodes positioned at ends of the two adjacent capacitor blocks are the electrodes at end faces of the capacitors.

12. The capacitor unit of claim 10, wherein the electrodes positioned at ends of the two adjacent capacitor blocks are extraction electrodes, and the extraction electrodes are connected to the electrodes at end faces of the capacitors.

* * * * *